US012299562B2

(12) United States Patent
Tran et al.

(10) Patent No.: US 12,299,562 B2
(45) Date of Patent: *May 13, 2025

(54) ANALOG NEURAL MEMORY ARRAY IN ARTIFICIAL NEURAL NETWORK WITH SOURCE LINE PULLDOWN MECHANISM

(71) Applicant: Silicon Storage Technology, Inc., San Jose, CA (US)

(72) Inventors: Hieu Van Tran, San Jose, CA (US); Thuan Vu, San Jose, CA (US); Stanley Hong, San Jose, CA (US); Stephen Trinh, San Jose, CA (US); Vipin Tiwari, Dublin, CA (US); Han Tran, Ho Chi Minh (VN); Hien Pham, Ho Chi Minh (VN)

(73) Assignee: Silicon Storage Technology, Inc., San Jose, CA (US)

( * ) Notice: Subject to any disclaimer, the term of this patent is extended or adjusted under 35 U.S.C. 154(b) by 1042 days.

This patent is subject to a terminal disclaimer.

(21) Appl. No.: 17/090,481

(22) Filed: Nov. 5, 2020

(65) Prior Publication Data

US 2021/0350217 A1    Nov. 11, 2021

Related U.S. Application Data

(60) Provisional application No. 63/022,551, filed on May 10, 2020.

(51) Int. Cl.
*G06N 3/063* (2023.01)
*G06N 3/065* (2023.01)

(52) U.S. Cl.
CPC ................................. *G06N 3/065* (2023.01)

(58) Field of Classification Search
CPC ........ G06N 3/065; G06N 3/045; G06N 3/063; G11C 16/0425; G11C 11/54; G11C 16/0416; G11C 16/30
See application file for complete search history.

(56) References Cited

U.S. PATENT DOCUMENTS

| 5,029,130 A | 7/1991 | Yeh |
| 6,747,310 B2 | 6/2004 | Fan et al. |
| 9,564,238 B1* | 2/2017 | Bai ........................ G11C 16/08 |
| 9,875,780 B1 | 1/2018 | Debrosse |

(Continued)

FOREIGN PATENT DOCUMENTS

| EP | 4 115 343 | 1/2023 |
| JP | 2000-251489 | 9/2000 |

(Continued)

OTHER PUBLICATIONS

Lemke, et al, "Ultra-Precise Tuning of Analog Neural Memory Cells in a Deep Learning Artificial Neural Network," U.S. Appl. No. 16/985,147, filed Aug. 4, 2020 claiming priority to U.S. Appl. No. 62/981,757, filed Feb. 26, 2020.

(Continued)

*Primary Examiner* — Hassan Mrabi
(74) *Attorney, Agent, or Firm* — DLA Piper LLP (US)

(57) ABSTRACT

Numerous embodiments of analog neural memory arrays are disclosed. Certain embodiments contain improved mechanisms for pulling source lines down to ground expeditiously. This is useful, for example, to minimize the voltage drop for a read, program, or erase operation.

19 Claims, 40 Drawing Sheets

(56) References Cited

U.S. PATENT DOCUMENTS

| | | | |
|---|---|---|---|
| 11,682,459 B2* | 6/2023 | Tran | G11C 16/14 365/185.03 |
| 2003/0086312 A1* | 5/2003 | Kang | G11C 11/22 365/200 |
| 2005/0237808 A1 | 10/2005 | Ichikawa | |
| 2010/0226181 A1* | 9/2010 | Tran | G11C 5/025 365/185.21 |
| 2013/0128667 A1 | 5/2013 | Lee | |
| 2015/0213900 A1 | 7/2015 | Wakchaure et al. | |
| 2017/0337978 A1* | 11/2017 | Tran | G11C 16/26 |
| 2018/0061502 A1 | 3/2018 | Peng et al. | |
| 2019/0164617 A1 | 5/2019 | Tran | |
| 2019/0213234 A1 | 7/2019 | Bayat et al. | |
| 2019/0341110 A1* | 11/2019 | Tran | H01L 29/7883 |
| 2020/0117982 A1* | 4/2020 | Chiu | G06N 3/045 |
| 2020/0342938 A1* | 10/2020 | Tran | G11C 11/54 |
| 2020/0349421 A1 | 11/2020 | Tran et al. | |
| 2021/0020255 A1* | 1/2021 | Tran | G06F 3/0688 |
| 2021/0142156 A1* | 5/2021 | Tran | G06N 3/044 |
| 2021/0280239 A1* | 9/2021 | Tran | H03F 3/45475 |
| 2021/0280240 A1* | 9/2021 | Tran | G06N 3/063 |
| 2021/0350217 A1* | 11/2021 | Tran | G11C 16/0416 |
| 2021/0358551 A1* | 11/2021 | Tran | G06N 3/065 |
| 2022/0254414 A1* | 8/2022 | Tran | H01L 29/7883 |
| 2022/0319620 A1* | 10/2022 | Tran | G06F 3/0688 |
| 2022/0398444 A1* | 12/2022 | Tran | G06N 3/04 |

FOREIGN PATENT DOCUMENTS

| | | | | |
|---|---|---|---|---|
| TW | I 380307 B | 12/2012 | | |
| TW | 202008353 A | 2/2020 | | |
| TW | 202016928 | 5/2020 | | |
| WO | WO-2017044251 A1 * | 3/2017 | | G11C 16/0425 |
| WO | WO-2021178003 A1 * | 9/2021 | | G06N 3/045 |
| WO | WO-2021230905 A1 * | 11/2021 | | G06N 3/0635 |

OTHER PUBLICATIONS

European Examiner's Report dated Sep. 26, 2023 corresponding to the related European Patent Application No. 20 824 005.1.
Taiwanese Office Action dated Apr. 21, 2022 corresponding to the related Taiwanese Patent Application No. 11120387740.
Japanese Office Action mailed on Dec. 5, 2023 corresponding to the related Japanese Patent Application No. 2022-567747.
European Examiner's Report mailed on May 8, 2024 corresponding to the related European Patent Application No. 20824005.1.
S. Korean Office Action mailed on Mar. 26, 2024 corresponding to the related S. Korean Patent Application No. 10-2022-7037549. (Machine Translations in English).
Taiwanese Office Action mailed on Jan. 3, 2024 corresponding to the related Taiwanese Patent Application No. 111140795.
Japanese Office Action mailed on Feb. 21, 2025 corresponding to the related Japanese Patent Application No. 2024-065620. (Google English Translations and the original copy of the Japanese Office Action are attached).

* cited by examiner

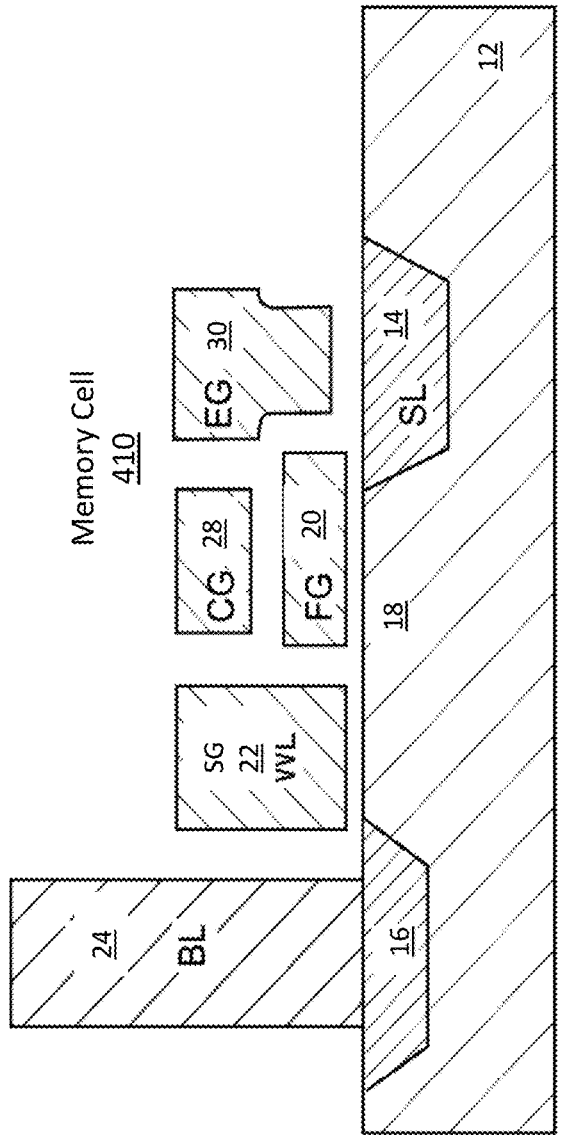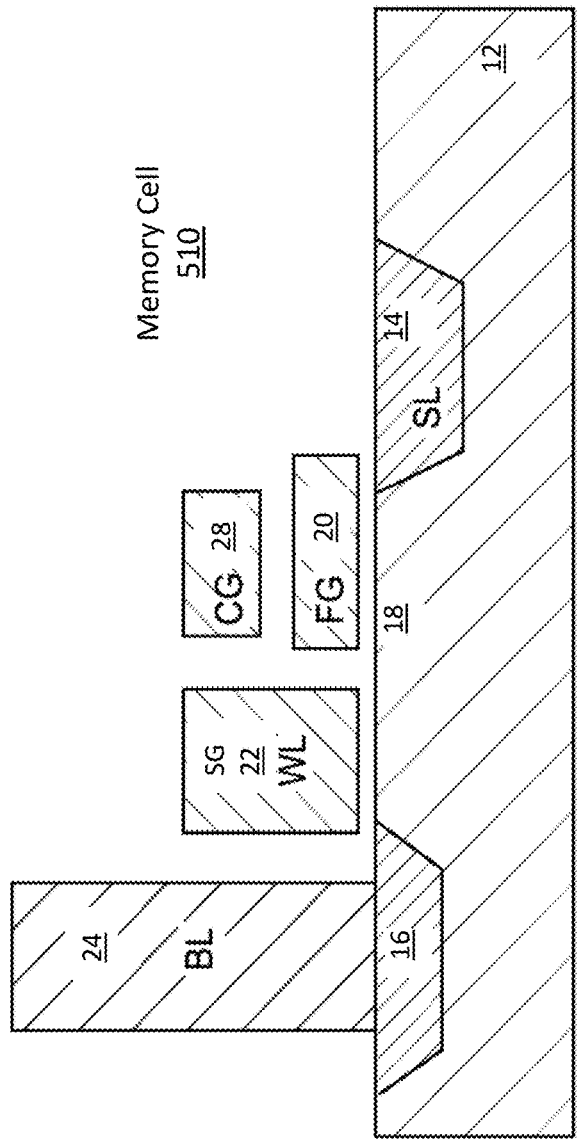
FIGURE 4
(PRIOR ART)
FIGURE 5
(PRIOR ART)

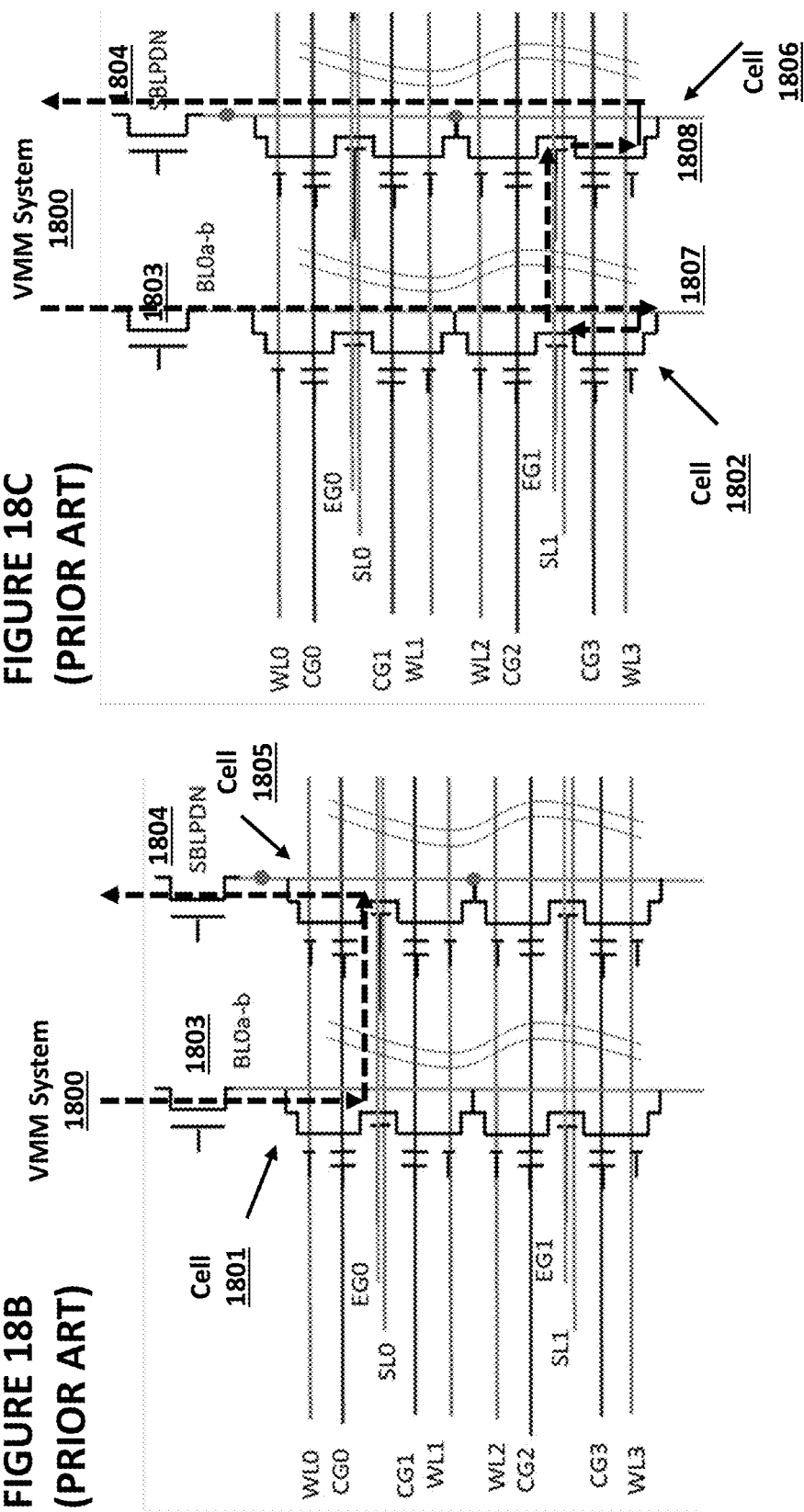

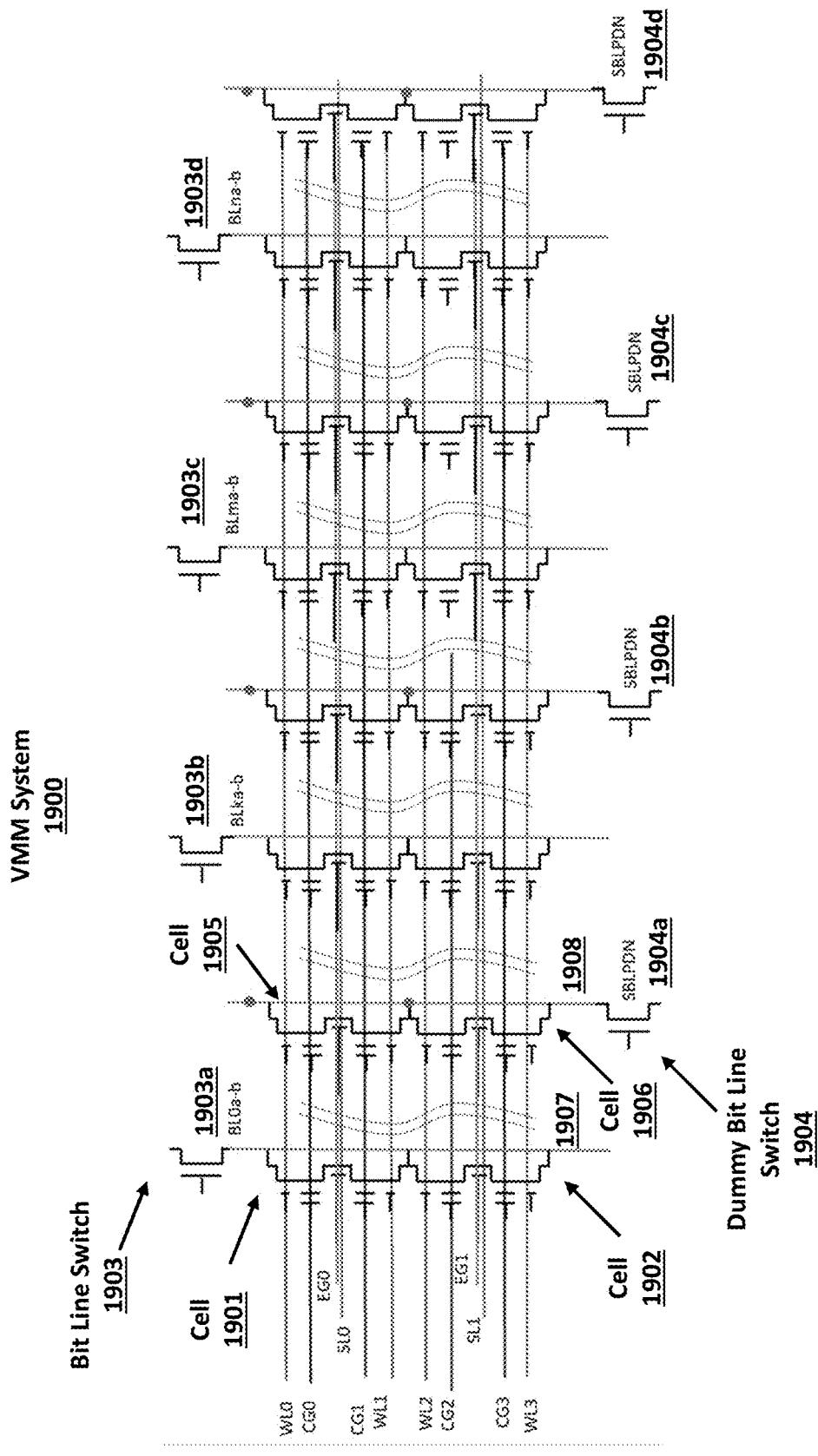

ANALOG NEURAL MEMORY ARRAY IN ARTIFICIAL NEURAL NETWORK WITH SOURCE LINE PULLDOWN MECHANISM

PRIORITY CLAIM

This application claims priority to U.S. Provisional Patent Application No. 63/022,551, filed on May 10, 2020, and titled "Analog Neural Memory Array in Artificial Neural Network with Source Line Pulldown Mechanism," which is incorporated by reference herein.

FIELD OF THE INVENTION

Numerous embodiments of analog neural memory arrays are disclosed. Certain embodiments contain improved mechanisms for pulling source lines down to ground accurately. This is useful, for example, to minimize the voltage drop for a read, program, or erase operation.

BACKGROUND OF THE INVENTION

Artificial neural networks mimic biological neural networks (e.g., the central nervous systems of animals, in particular, the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows and have numeric weights that can be tuned based on experience. This makes the artificial neural network adaptive to inputs and capable of learning. Typically, artificial neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical artificial neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, published as US Patent Publication 2017/0337466, which is incorporated by reference. The non-volatile memory arrays operate as an analog neuromorphic memory. The term neuromorphic, as used herein, means circuitry that implement models of neural systems. The analog neuromorphic memory includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs. An array of memory cells arranged in this manner can be referred to as a vector by matrix multiplication (VMM) array.

Examples of different non-volatile memory cells that can be used in VMMs will now be discussed.

Non-Volatile Memory Cells

Various types of known non-volatile memory cells can be used in the VMM arrays. For example, U.S. Pat. No. 5,029,130 ("the '130 patent"), which is incorporated herein by reference, discloses an array of split gate non-volatile memory cells, which are a type of flash memory cells. Such a memory cell 210 is shown in FIG. 2. Each memory cell 210 includes source region 14 and drain region 16 formed in semiconductor substrate 12, with channel region 18 there between. Floating gate 20 is formed over and insulated from (and controls the conductivity of) a first portion of the channel region 18, and over a portion of the source region 14. Word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline terminal 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the drain region 16 towards the source region 14 (source line terminal). The electrons will accelerate and become energized (heated) when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE NO. 1

Operation of Flash Memory Cell 210 of FIG. 2

|  | WL | BL | SL |
|---|---|---|---|
| Read 1 | 0.5-3 V | 0.1-2 V | 0 V |
| Read 2 | 0.5-3 V | 0-2 V | 2-0.1 V |
| Erase | ~11-13 V | 0 V | 0 V |
| Program | 1-2 V | 1-3 μA | 9-10 V |

"Read 1" is a read mode in which the cell current is output on the bit line. "Read 2" is a read mode in which the cell current is output on the source line terminal.

FIG. 3 shows memory cell 310, which is similar to memory cell 210 of FIG. 2 with the addition of control gate (CG) terminal 28. Control gate terminal 28 is biased at a high voltage, e.g., 10V, in programming, low or negative in erase, e.g., 0v/−8V, low or mid range in read, e.g., 0v/2.5V. Other terminals are biased similarly to that of FIG. 2.

FIG. 4 depicts four-gate memory cell 410 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes. Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 410 for performing read, erase, and program operations:

TABLE NO. 2

Operation of Flash Memory Cell 410 of FIG. 4

|  | WL/SG | BL | CG | EG | SL |
|---|---|---|---|---|---|
| Read 1 | 0.5-2 V | 0.1-2 V | 0-2.6 V | 0-2.6 V | 0 V |
| Read 2 | 0.5-2 V | 0-2 V | 0-2.6 V | 0-2.6 V | 2-0.1 V |
| Erase | −0.5 V/0 V | 0 V | 0 V/−8 V | 8-12 V | 0 V |
| Program | 1 V | 1 μA | 8-11 V | 4.5-9 V | 4.5-5 V |

"Read 1" is a read mode in which the cell current is output on the bit line. "Read 2" is a read mode in which the cell current is output on the source line terminal.

FIG. 5 shows memory cell 510, which is similar to memory cell 410 of FIG. 4 except that memory cell 510 does not contain an erase gate EG terminal. An erase is performed by biasing the substrate 18 to a high voltage and biasing the control gate CG terminal 28 to a low or negative voltage. Alternatively, an erase is performed by biasing word line terminal 22 to a positive voltage and biasing control gate terminal 28 to a negative voltage. Programming and reading is similar to that of FIG. 4.

FIG. 6 depicts a three-gate memory cell 610, which is another type of flash memory cell. Memory cell 610 is identical to the memory cell 410 of FIG. 4 except that memory cell 610 does not have a separate control gate terminal. The erase operation (whereby erasing occurs through use of the erase gate terminal) and read operation are similar to that of the FIG. 4 except there is no control gate bias applied. The programming operation also is done without the control gate bias, and as a result, a higher voltage must be applied on the source line terminal during a program operation to compensate for a lack of control gate bias.

Table No. 3 depicts typical voltage ranges that can be applied to the terminals of memory cell 610 for performing read, erase, and program operations:

TABLE NO. 3

Operation of Flash Memory Cell 610 of FIG. 6

|  | WL/SG | BL | EG | SL |
|---|---|---|---|---|
| Read 1 | 0.5-2.2 V | 0.1-2 V | 0-2.6 V | 0 V |
| Read 2 | 0.5-2.2 V | 0-2 V | 0-2.6 V | 2-0.1 V |
| Erase | −0.5 V/0 V | 0 V | 11.5 V | 0 V |
| Program | 1 V | 2-3 μA | 4.5 V | 7-9 V |

"Read 1" is a read mode in which the cell current is output on the bit line. "Read 2" is a read mode in which the cell current is output on the source line terminal.

FIG. 7 depicts stacked gate memory cell 710, which is another type of flash memory cell. Memory cell 710 is similar to memory cell 210 of FIG. 2, except that floating gate 20 extends over the entire channel region 18, and control gate terminal 22 (which here will be coupled to a word line) extends over floating gate 20, separated by an insulating layer (not shown). Programming is performed using hot electron injection from channel 18 to floating gate 20 in the channel region next to the drain region 16, and erasing is performed using by Fowler-Nordheim electron tunneling from floating gate 20 to substrate 12. The read operations operate in a similar manner to that described previously for memory cell 210.

Table No. 4 depicts typical voltage ranges that can be applied to the terminals of memory cell 710 and substrate 12 for performing read, erase, and program operations:

TABLE NO. 4

Operation of Flash Memory Cell 710 of FIG. 7

|  | CG | BL | SL | Substrate |
|---|---|---|---|---|
| Read 1 | 0-5 V | 0.1-2 V | 0-2 V | 0 V |
| Read 2 | 0.5-2 V | 0-2 V | 2-0.1 V | 0 V |
| Erase | −8 to −10 V/0 V | FLT | FLT | 8-10 V/15-20 V |
| Program | 8-12 V | 3-5 V/0 V | 0 V/3-5 V | 0 V |

"Read 1" is a read mode in which the cell current is output on the bit line. "Read 2" is a read mode in which the cell current is output on the source line terminal. Optionally, in arrays comprising rows and columns of memory cells 210, 310, 410, 510, 610, or 710, source lines can be coupled to one row of memory cells or to two adjacent rows of memory cells. That is, source line terminals can be shared by adjacent rows of memory cells.

FIG. 8 depicts twin split-gate memory cell 810. Memory cell 810 comprises floating gate (FG) 20 disposed over and insulated from the substrate 12, a control gate 28 (CG) disposed over and insulated from the floating gate 20, an erase gate 30 (EG) disposed adjacent to and insulated from the floating and control gates 20/28 and disposed over and insulated from the substrate 12, where the erase gate 30 is created with a T shape such that a top corner of the control gate CG 28 faces the inside corner of the T shaped erase gate to improve erase efficiency, and a drain region 16 (DR) in the substrate adjacent the floating gate 20 (with a bit line contact 24 (BL) connected to the drain diffusion regions 16 (DR)). The memory cells are formed as pairs of memory cells (A on the left and B on the right), sharing a common erase gate 30. This cell design differs from that the memory cells discussed above with reference to FIGS. 2-7 at least in that it lacks a source region under the erase gate EG 30, lacks a select gate (also referred to as a word line), and lacks a channel region for each memory cell 810. Instead, a single continuous channel region 18 extends under both memory cells 810 (i.e. extends from the drain region 16 of one memory cell 810 to the drain region 16 of the other memory cell 810). To read or program one memory cell 810, the control gate 28 of the other memory cell 810 is raised to a sufficient voltage to turn on the underlying channel region portion via voltage coupling to the floating gate 20 there between (e.g. to read or program cell A, the voltage on FGB is raised via voltage coupling from CGB to turn on the channel region portion under FGB). Erasing is performed using Fowler Nordheim electron tunneling from floating gate 20 to erase gate 30. Programming is performed using hot electron injection from channel region 18 to floating gate 20, this is indicated as PROGRAM 1 in Table 5 below. Alternatively, programming is performed using Fowler Nordheim electron tunneling from erase gate 30 to floating gate 20, this is indicated as PROGRAM 2 in Table 5. Alternatively, programming is performed using Fowler Nordheim electron tunneling from channel 18 to floating gate 20, in this case the condition is similar to PROGRAM 2 except the substrate 12 is biased at a low voltage or negative voltage while erase gate 30 is biased at a low positive voltage.

Table No. 5 depicts typical voltage ranges that can be applied to the terminals of memory cell 810 for performing read, erase, and program operations. Cell A (FG,CGA,BLA) is selected for read, program, and erase operation

TABLE NO. 5

Operation of Flash Memory Cell 810 of FIG. 8

| | CGA | BLA | EG | CGB | BLB |
|---|---|---|---|---|---|
| READ | 1.5-4 V | 0.1-0.8 V | 2.5 V | 1.5-4 V | 0 |
| ERASE | 0 V to −8 V | 0 V | 8 V to 11.5 V | 0 V to 4 V (Vcginhe) | 0 V |
| PROGRAM 1 | 10.5 V | 4.5 V | 1.5 V | 4 | Iprog |
| PROGRAM 2 | 4 V to 8 V | 0 V | −4 V to −8 V | 0 V to −2 V (Vcginhp) | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

The methods and means described herein may apply to other non-volatile memory technologies such as FINFET split gate flash or stack gate flash memory, NAND flash, SONOS (silicon-oxide-nitride-oxide-silicon, charge trap in nitride), MONOS (metal-oxide-nitride-oxide-silicon, metal charge trap in nitride), ReRAM (resistive ram), PCM (phase change memory), MRAM (magnetic ram), FeRAM (ferroelectric ram), OTP (bi-level or multi-level one time programmable), and CeRAM (correlated electron ram), without limitation. The methods and means described herein may apply to volatile memory technologies used for neural network such as SRAM, DRAM, and other volatile synapse cells, without limitation.

Neural Networks Employing Non-Volatile Memory Cell Arrays

FIG. 9 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

FIG. 10 is a block diagram of a system that can be used for that purpose. VMM system 32 includes non-volatile memory cells and is utilized as the synapses (such as CB1, CB2, CB3, and CB4 in FIG. 6) between one layer and the next layer. Specifically, VMM system 32 comprises VMM array 33 comprising non-volatile memory cells arranged in rows and columns, erase gate and word line gate decoder 34, control gate decoder 35, bit line decoder 36 and source line decoder 37, which decode the respective inputs for the non-volatile memory cell array 33. Input to VMM array 33 can be from the erase gate and wordline gate decoder 34 or from the control gate decoder 35. Source line decoder 37 in this example also decodes the output of VMM array 33. Alternatively, bit line decoder 36 can decode the output of VMM array 33.

VMM array 33 serves two purposes. First, it stores the weights that will be used by the VMM system 32. Second, VMM array 33 effectively multiplies the inputs by the weights stored in VMM array 33 and adds them up per output line (source line or bit line) to produce the output, which will be the input to the next layer or input to the final layer. By performing the multiplication and addition function, VMM array 33 negates the need for separate multiplication and addition logic circuits and is also power efficient due to its in-situ memory computation.

The output of VMM array 33 is supplied to a differential summer (such as a summing op-amp or a summing current mirror) 38, which sums up the outputs of VMM array 33 to create a single value for that convolution. The differential summer 38 is arranged to perform summation of both positive weight and negative weight inputs to output the single value.

The summed up output values of differential summer 38 are then supplied to an activation function circuit 39, which rectifies the output. The activation function circuit 39 may provide sigmoid, tan h, ReLU functions, or any other non-linear function. The rectified output values of activation function circuit 39 become an element of a feature map of the next layer (e.g. C1 in FIG. 9) and are then applied to the next synapse to produce the next feature map layer or final layer. Therefore, in this example, VMM array 33 constitutes a plurality of synapses (which receive their inputs from the prior layer of neurons or from an input layer such as an image database), and summer 38 and activation function circuit 39 constitute a plurality of neurons.

The input to VMM system 32 in FIG. 10 (WLx, EGx, CGx, and optionally BLx and SLx) can be analog level, binary level, digital pulses (in which case a pulses-to-analog converter PAC may be needed to convert pulses to the appropriate input analog level) or digital bits (in which case a DAC is provided to convert digital bits to appropriate input analog level) and the output can be analog level (e.g., current, voltage, or charge), binary level, digital pulses, or digital bits (in which case an output ADC is provided to convert output analog level into digital bits).

FIG. 11 is a block diagram depicting the usage of numerous layers of VMM systems 32, here labeled as VMM systems 32a, 32b, 32c, 32d, and 32e. As shown in FIG. 11, the input, denoted Inputx, is converted from digital to analog by a digital-to-analog converter 31, and provided to input VMM system 32a. The converted analog inputs could be voltage or current. The input D/A conversion for the first layer could be done by using a function or a LUT (look up table) that maps the inputs Inputx to appropriate analog levels for the matrix multiplier of input VMM system 32a. The input conversion could also be done by an analog to analog (A/A) converter to convert an external analog input to a mapped analog input to the input VMM system 32a. The input conversion could also be done by a digital-to-digital pules (D/P) converter to convert an external digital input to a mapped digital pulse or pulses to the input VMM system 32a.

The output generated by input VMM system 32a is provided as an input to the next VMM system (hidden level 1) 32b, which in turn generates an output that is provided as an input to the next VMM system (hidden level 2) 32c, and so on. The various layers of VMM system 32 function as different layers of synapses and neurons of a convolutional neural network (CNN). Each VMM system 32a, 32b, 32c, 32d, and 32e can be a stand-alone, physical system comprising a respective non-volatile memory array, or multiple VMM systems could utilize different portions of the same physical non-volatile memory array, or multiple VMM systems could utilize overlapping portions of the same physical non-volatile memory array. Each VMM system 32a, 32b, 32c, 32d, and 32e can also be time multiplexed for various portion of its array or neurons. The example shown in FIG. 11 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

VMM Arrays

FIG. 12 depicts neuron VMM array 1200, which is particularly suited for memory cells 310 as shown in FIG. 3, and is utilized as the synapses and parts of neurons between an input layer and the next layer. VMM array 1200 comprises memory array 1201 of non-volatile memory cells and reference array 1202 (at the top of the array) of non-volatile reference memory cells. Alternatively, another reference array can be placed at the bottom.

In VMM array 1200, control gate lines, such as control gate line 1203, run in a vertical direction (hence reference array 1202 in the row direction is orthogonal to control gate line 1203), and erase gate lines, such as erase gate line 1204, run in a horizontal direction. Here, the inputs to VMM array 1200 are provided on the control gate lines (CG0, CG1, CG2, CG3), and the output of VMM array 1200 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 1200, i.e. the flash memory of VMM array 1200, are preferably configured to operate in a sub-threshold region.

The non-volatile reference memory cells and the non-volatile memory cells described herein are biased in weak inversion:

$$Ids=Io*e^{(Vg-Vth)/nVt}=w*Io*e^{(Vg)/nVt},$$

where $w=e^{(-Vth)/nVt}$ where Ids is the drain to source current; Vg is gate voltage on the memory cell; Vth is threshold voltage of the memory cell; Vt is thermal voltage=k*T/q with k being the Boltzmann constant, T the temperature in Kelvin, and q the electronic charge; n is a slope factor=1+(Cdep/Cox) with Cdep=capacitance of the depletion layer, and Cox capacitance of the gate oxide layer; Io is the memory cell current at gate voltage equal to threshold voltage, Io is proportional to $(Wt/L)*u*Cox*(n-1)*Vt^2$ where u is carrier mobility and Wt and L are width and length, respectively, of the memory cell.

For an I-to-V log converter using a memory cell (such as a reference memory cell or a peripheral memory cell) or a transistor to convert input current Ids, into an input voltage, Vg:

$$Vg=n*Vt*\log [Ids/wp*Io]$$

Here, wp is w of a reference or peripheral memory cell.

For an I-to-V log converter using a memory cell (such as a reference memory cell or a peripheral memory cell) or a transistor to convert input current Ids, into an input voltage, Vg:

$$Vg=n*Vt*\log [Ids/wp*Io]$$

Here, wp is w of a reference or peripheral memory cell.

For a memory array used as a vector matrix multiplier VMM array, the output current is:

$$Iout=wa*Io*e^{(Vg)/nVt} \text{ namely}$$

$$Iout=(wa/wp)*Iin=W*Iin$$

$$W=e^{(Vthp-Vtha)/nVt}$$

$$Iin=wp*Io*e^{(Vg)/nVt}$$

Here, wa=w of each memory cell in the memory array.

Vthp is effective threshold voltage of the peripheral memory cell and Vtha is effective threshold voltage of the main (data) memory cell.

Note that threshold voltage of a transistor is a function of substrate body bias voltage and the substrate body bias can be modulated for various compensation such as over temperature or by modulating the cell current $$Vth=Vth0+\text{gamma}(SQRT(Vsb+|2*\phi F|)-SQRT|2*\phi F|)$$

Vth0 is threshold voltage with zero substrate bias, $\phi F$ is surface potential, gamma is body effect parameter.

A wordline or control gate can be used as the input for the memory cell for the input voltage.

Alternatively, the non-volatile memory cells of VMM arrays described herein can be configured to operate in the linear region:

$$Ids=\text{beta}*(Vgs-Vth)*Vds; \text{ beta}=u*Cox*Wt/L,$$

$$W\alpha(Vgs-Vth),$$

meaning weight W in the linear region is proportional to (Vgs–Vth)

A wordline or control gate or bitline or sourceline can be used as the input for the memory cell operated in the linear region. The bitline or sourceline can be used as the output for the memory cell.

For an I-to-V linear converter, a memory cell (such as a reference memory cell or a peripheral memory cell) or a transistor operating in the linear region or a resistor can be used to linearly convert an input/output current into an input/output voltage.

Alternatively, the memory cells of VMM arrays described herein can be configured to operate in the saturation region:

$$Ids = \tfrac{1}{2} * beta * (Vgs-Vth)^2; \quad beta = u*Cox*Wt/L$$

W α (Vgs−Vth)$^2$, meaning weight W is proportional to (Vgs−Vth)$^2$

A wordline, control gate, or erase gate can be used as the input for the memory cell operated in the saturation region. The bitline or sourceline can be used as the output for the output neuron.

Alternatively, the memory cells of VMM arrays described herein can be used in all regions or a combination thereof (sub threshold, linear, or saturation) for each layer or multi layers of a neural network.

FIG. 13 depicts neuron VMM array 1300, which is particularly suited for memory cells 210 as shown in FIG. 2, and is utilized as the synapses between an input layer and the next layer. VMM array 1300 comprises a memory array 1303 of non-volatile memory cells, reference array 1301 of first non-volatile reference memory cells, and reference array 1302 of second non-volatile reference memory cells. Reference arrays 1301 and 1302, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1314 (only partially depicted) with current inputs flowing into them. The reference cells are tuned (e.g., programmed) to target reference levels. The target reference levels are provided by a reference mini-array matrix (not shown).

Memory array 1303 serves two purposes. First, it stores the weights that will be used by the VMM array 1300 on respective memory cells thereof. Second, memory array 1303 effectively multiplies the inputs (i.e. current inputs provided in terminals BLR0, BLR1, BLR2, and BLR3, which reference arrays 1301 and 1302 convert into the input voltages to supply to wordlines WL0, WL1, WL2, and WL3) by the weights stored in the memory array 1303 and then adds all the results (memory cell currents) to produce the output on the respective bit lines (BL0-BLN), which will be the input to the next layer or input to the final layer. By performing the multiplication and addition function, memory array 1303 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 6 depicts operating voltages for VMM array 1300. The columns in the table indicate the voltages placed on word lines for selected cells, word lines for unselected cells, bit lines for selected cells, bit lines for unselected cells, source lines for selected cells, and source lines for unselected cells, where FLT indicates floating, i.e. no voltage is imposed. The rows indicate the operations of read, erase, and program.

TABLE NO. 6

| | | | | | | |
|---|---|---|---|---|---|---|
| Operation of VMM Array 1300 of FIG. 13: | | | | | | |
| | WL | WL-unsel | BL | BL-unsel | SL | SL-unsel |
| Read | 0.5-3.5 V | −0.5 V/0 V | 0.1-2 V (Ineuron) | 0.6 V-2 V/FLT | 0 V | 0 V |
| Erase | ~5-13 V | 0 V | 0 V | 0 V | 0 V | 0 V |
| Program | 1-2 V | −0.5 V/0 V | 0.1-3 uA | Vinh~2.5 V | 4-10 V | 0-1 V/FLT |

FIG. 14 depicts neuron VMM array 1400, which is particularly suited for memory cells 210 as shown in FIG. 2, and is utilized as the synapses and parts of neurons between an input layer and the next layer. VMM array 1400 comprises a memory array 1403 of non-volatile memory cells, reference array 1401 of first non-volatile reference memory cells, and reference array 1402 of second non-volatile reference memory cells. Reference arrays 1401 and 1402 run in row direction of the VMM array 1400. VMM array is similar to VMM 1300 except that in VMM array 1400, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 7 depicts operating voltages for VMM array 1400. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE NO. 7

Operation of VMM Array 1400 of FIG. 14

|  | WL | WL-unsel | BL | BL-unsel | SL | SL-unsel |
|---|---|---|---|---|---|---|
| Read | 0.5-3.5 V | −0.5 V/0 V | 0.1-2 V | 0.1 V-2 V/FLT | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh~2.5 V | 4-10 V | 0-1 V/FLT |

FIG. 15 depicts neuron VMM array 1500, which is particularly suited for memory cells 310 as shown in FIG. 3, and is utilized as the synapses and parts of neurons between an input layer and the next layer. VMM array 1500 comprises a memory array 1503 of non-volatile memory cells, reference array 1501 of first non-volatile reference memory cells, and reference array 1502 of second non-volatile reference memory cells. Reference arrays 1501 and 1502 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1512 (only partially shown) with current inputs flowing into them through BLR0, BLR1, BLR2, and BLR3. Multiplexors 1512 each include a respective multiplexor 1505 and a cascoding transistor 1504 to ensure a constant voltage on the bitline (such as BLR0) of each of the first and second non-volatile reference memory cells during a read operation. The reference cells are tuned to target reference levels.

Memory array 1503 serves two purposes. First, it stores the weights that will be used by the VMM array 1500. Second, memory array 1503 effectively multiplies the inputs (current inputs provided to terminals BLR0, BLR1, BLR2, and BLR3, for which reference arrays 1501 and 1502 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1500 implements uni-directional tuning for non-volatile memory cells in memory array 1503. That is, each non-volatile memory cell is erased and then partially programmed until the desired charge on the floating gate is reached. This can be performed, for example, using the precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 8 depicts operating voltages for VMM array 1500. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 8

Operation of VMM Array 1500 of FIG. 15

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 0.5-2 V | −0.5 V/ 0V | 0.1-2 V (Ineuron) | 0 V/FLT | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/ 0V | 0.1-1 uA | Vinh (1-2 V) | 4-11 V | 0-2.6 V | 0-2.6 V | 4.5-5 V | 0-2.6 V | 4.5-5 V | 0-1 V |

FIG. 16 depicts neuron VMM array 1600, which is particularly suited for memory cells 310 as shown in FIG. 3 and is utilized as the synapses and parts of neurons between an input layer and the next layer. VMM array 1600 comprises a memory array 1603 of non-volatile memory cells, reference array 1601 or first non-volatile reference memory cells, and reference array 1602 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1600 is similar to VMM array 1600, except that VMM array 1600 implements bi-directional tuning, where each individual cell can be completely erased, partially programmed, and partially erased as needed to reach the desired amount of charge on the floating gate due to the use of separate EG lines. As shown, reference arrays 1601 and 1602 convert input current in the terminal BLR0, BLR1, BLR2, and BLR3 into control gate voltages CG0, CG1, CG2, and CG3 (through the action of diode-connected reference cells through multiplexors 1614) to be applied to the memory cells in the row direction. The current output (neuron) is in the bitlines BL0-BLN, where each bit line sums all currents from the non-volatile memory cells connected to that particular bitline.

Table No. 9 depicts operating voltages for VMM array 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE NO. 9

Operation of VMM Array 1600 of FIG. 16

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/ 0 V | 0.6-2 V (Ineuron) | 0 V/FLT | 0-2.6 V | 0-2.6 V | 0-2.6 V | 0-2.6 V | 0-2.6 V | 0 V | 0 V/FLT |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

The input to the VMM arrays can be an analog level, a binary level, timing pulses, or digital bits and the output can be an analog level, a binary level, timing pulses, or digital bits (in this case an output ADC is needed to convert output analog level current or voltage into digital bits).

For each memory cell in a VMM array, each weight w can be implemented by a single memory cell or by a differential cell or by two blend memory cells (average of 2 or more cells). In the differential cell case, two memory cells are needed to implement a weight w as a differential weight (w=w+−w−). In the two blend memory cells, two memory cells are needed to implement a weight w as an average of two cells.

One drawback of prior art arrays of non-volatile memory cells is that a relatively significant amount of time is needed to pull source lines to ground to perform a read or erase operation.

What is needed is an improved VMM system containing a source line pulldown mechanism that is able to pull a source line down to ground more expeditiously than in prior art systems.

SUMMARY OF THE INVENTION

Numerous embodiments of analog neural memory arrays are disclosed. Certain embodiments contain improved mechanisms for pulling source lines down to ground expeditiously. This is useful, for example, to minimize the voltage drop for a read, program, or erase operation. Other embodiments contain implementations for negative and positive inputs with negative and positive weights.

In one embodiment, a non-volatile memory system comprises: an array of non-volatile memory cells arranged in rows and columns; a plurality of bit lines, each of the plurality of bit lines coupled to a column of non-volatile memory cells; and a plurality of pulldown bit lines, each of the plurality of pulldown bit lines coupled to a row of non-volatile memory cells.

In another embodiment, a non-volatile memory system comprises: an array of non-volatile memory cells arranged in rows and columns; a plurality of bit lines, each of the plurality of bit lines coupled to a column of non-volatile memory cells; and a plurality of pulldown bit lines, each of the plurality of pulldown bit lines coupled to a column of non-volatile memory cells; wherein during a read or verify operation of a selected cell, current flows through one of the plurality of bit lines into the selected cell, into multiple rows of pulldown cells and into two or more of the plurality of pulldown bit lines.

In another embodiment, a non-volatile memory system comprises: an array of non-volatile memory cells arranged in rows and columns; a plurality of bit lines, each of the plurality of bit lines coupled to a column of non-volatile memory cells; and a plurality of pulldown bit lines, each of the plurality of pulldown bit lines coupled to a column of non-volatile memory cells; wherein during a read or verify operation of a selected cell, current flows through one of the plurality of bit lines into the selected cell, into a pulldown cell adjacent to the selected cell and into one of the plurality of pulldown bit lines.

In another embodiment, a non-volatile memory system comprises: an array of non-volatile memory cells arranged in rows and columns; a plurality of bit lines, each of the plurality of bit lines coupled to a column of non-volatile memory cells; and a plurality of pulldown cells, each of the plurality of pulldown cells coupled to a source line of non-volatile memory cells.

In another embodiment, a non-volatile memory system comprises: an array of non-volatile memory cells arranged in rows and columns; a plurality of bit lines, each of the plurality of bit lines coupled to a column of non-volatile memory cells; a plurality of rows, each of the plurality of row lines coupled to a row of non-volatile memory cells; and a row receiving a negative value input.

BRIEF DESCRIPTION OF THE DRAWINGS

FIG. 4 depicts another prior art split gate flash memory cell.

FIG. 5 depicts another prior art split gate flash memory cell.

FIGS. 18A, 18B, and 18C depict a prior art VMM array.

FIGS. 19A, 19B, and 19C depicts an improved VMM array.

DETAILED DESCRIPTION OF THE INVENTION

The artificial neural networks of the present invention utilize a combination of CMOS technology and non-volatile memory arrays.

Overview of VMM Systems

Figure 1:
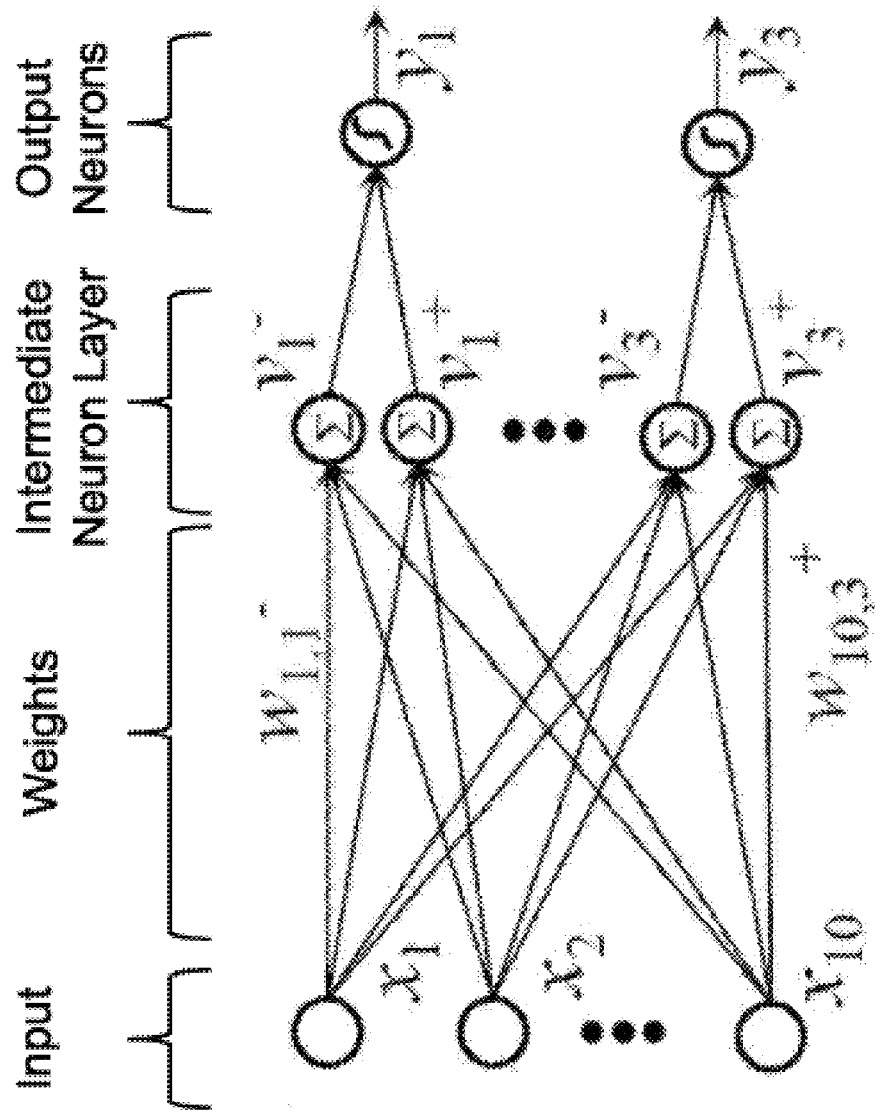
FIG. 1 depicts a prior art artificial neural network.
Figure 2:
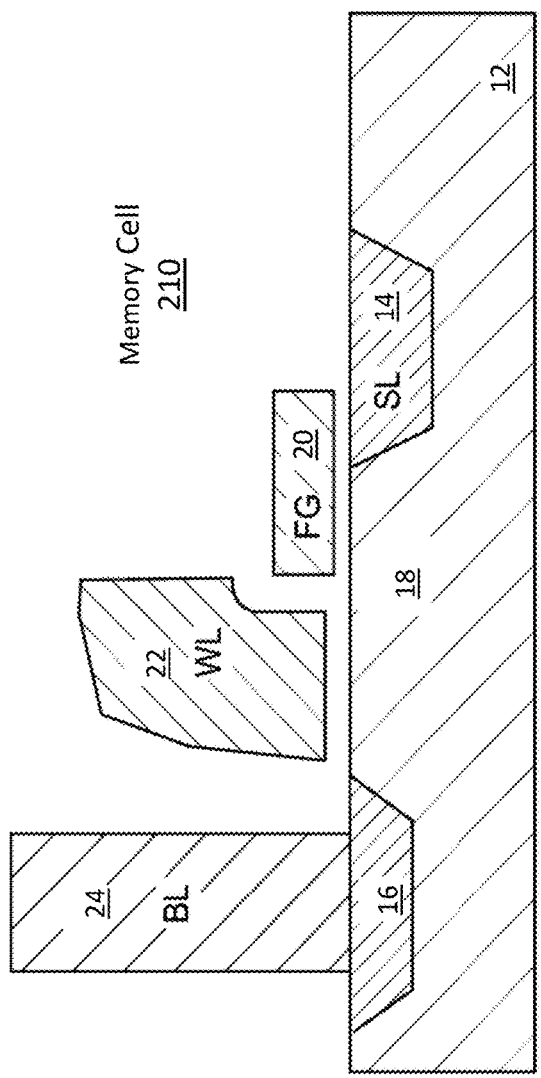
FIG. 2 depicts a prior art split gate flash memory cell.
Figure 3:
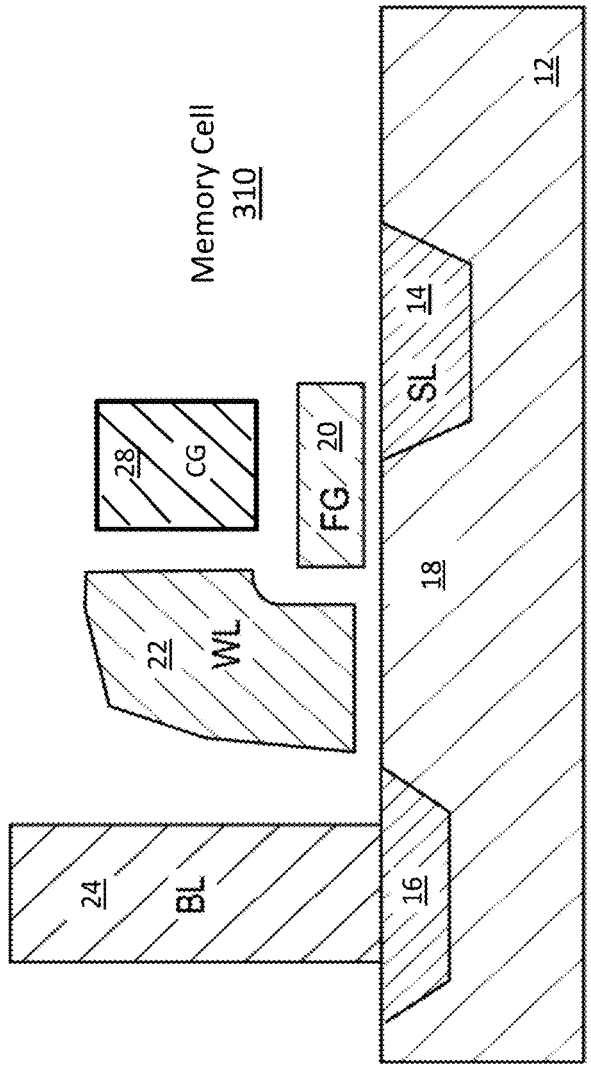
FIG. 3 depicts another prior art split gate flash memory cell
Figure 6:
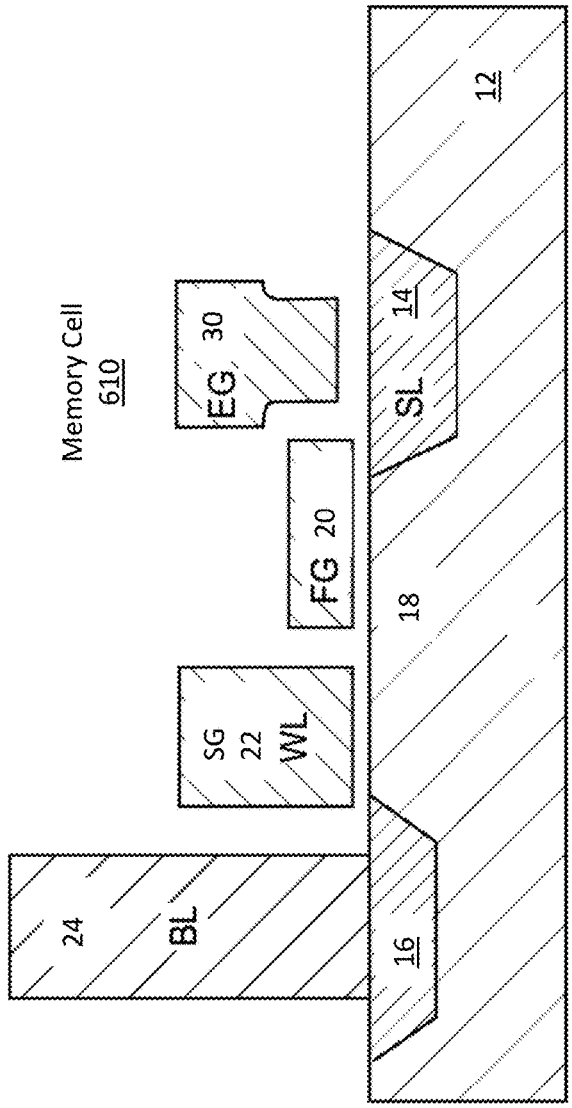
FIG. 6 depicts another prior art split gate flash memory cell.
Figure 7:
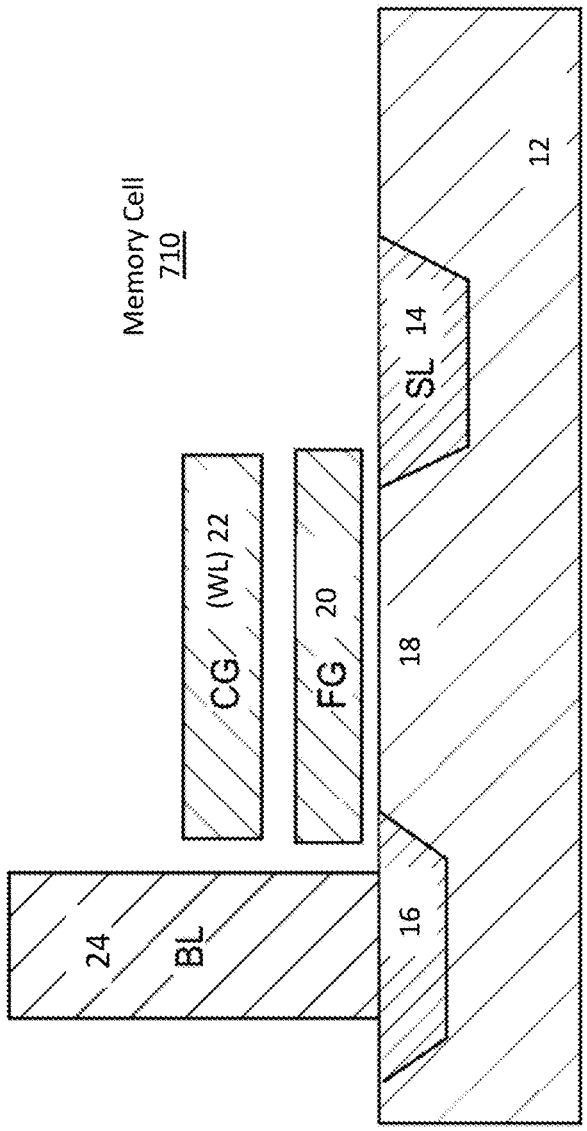
FIG. 7 depicts a prior art stacked gate flash memory cell.
Figure 8:
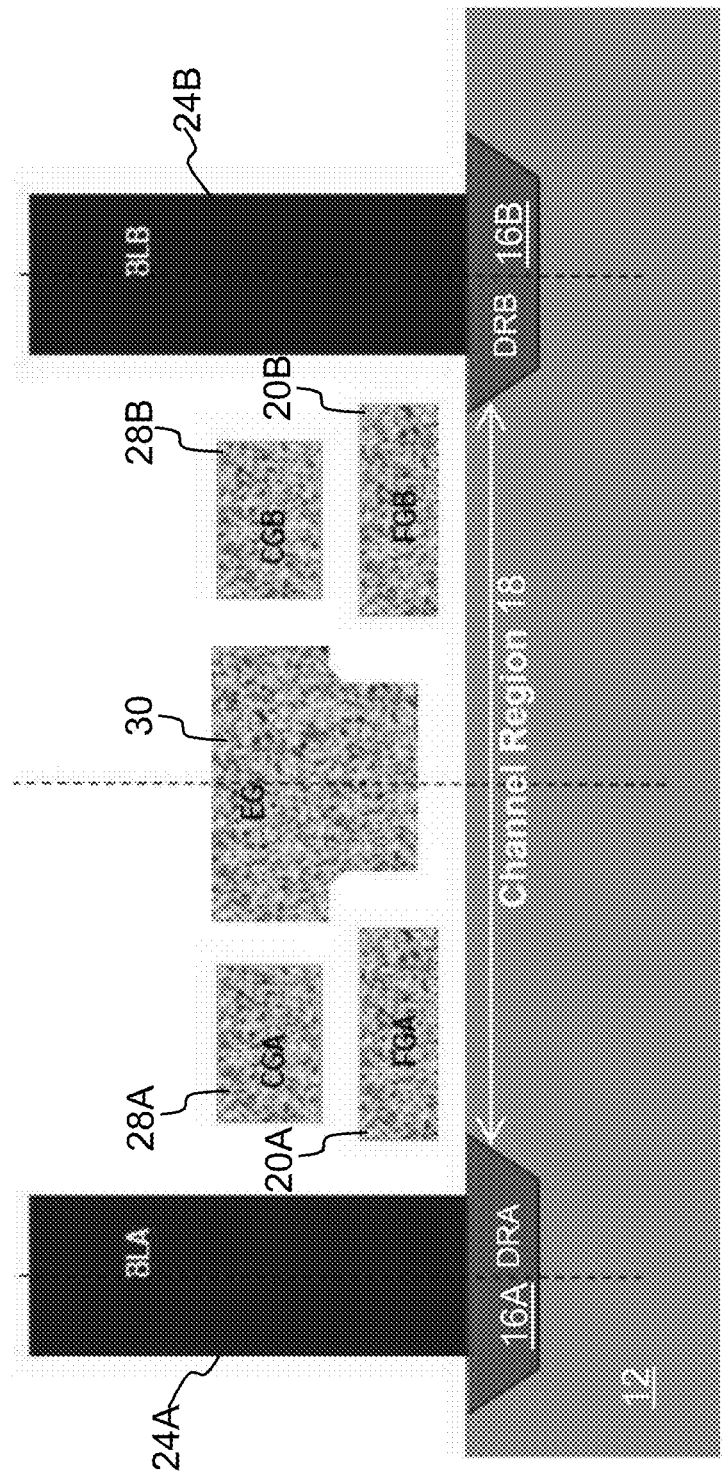
FIG. 8 depicts a twin split-gate memory cell.
Figure 9:
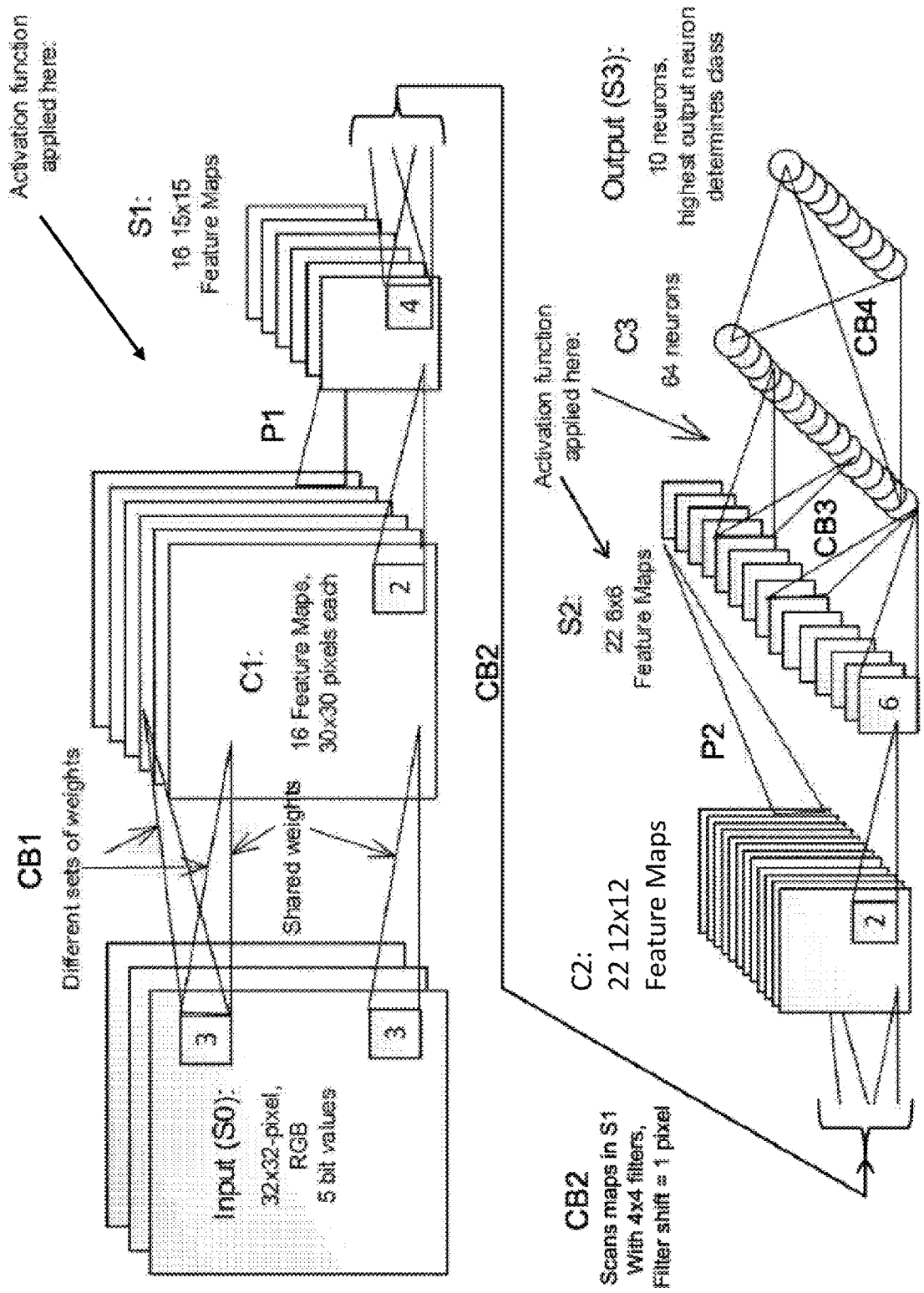
FIG. 9 depicts different levels of an exemplary artificial neural network utilizing one or more VMM arrays.
Figure 10:
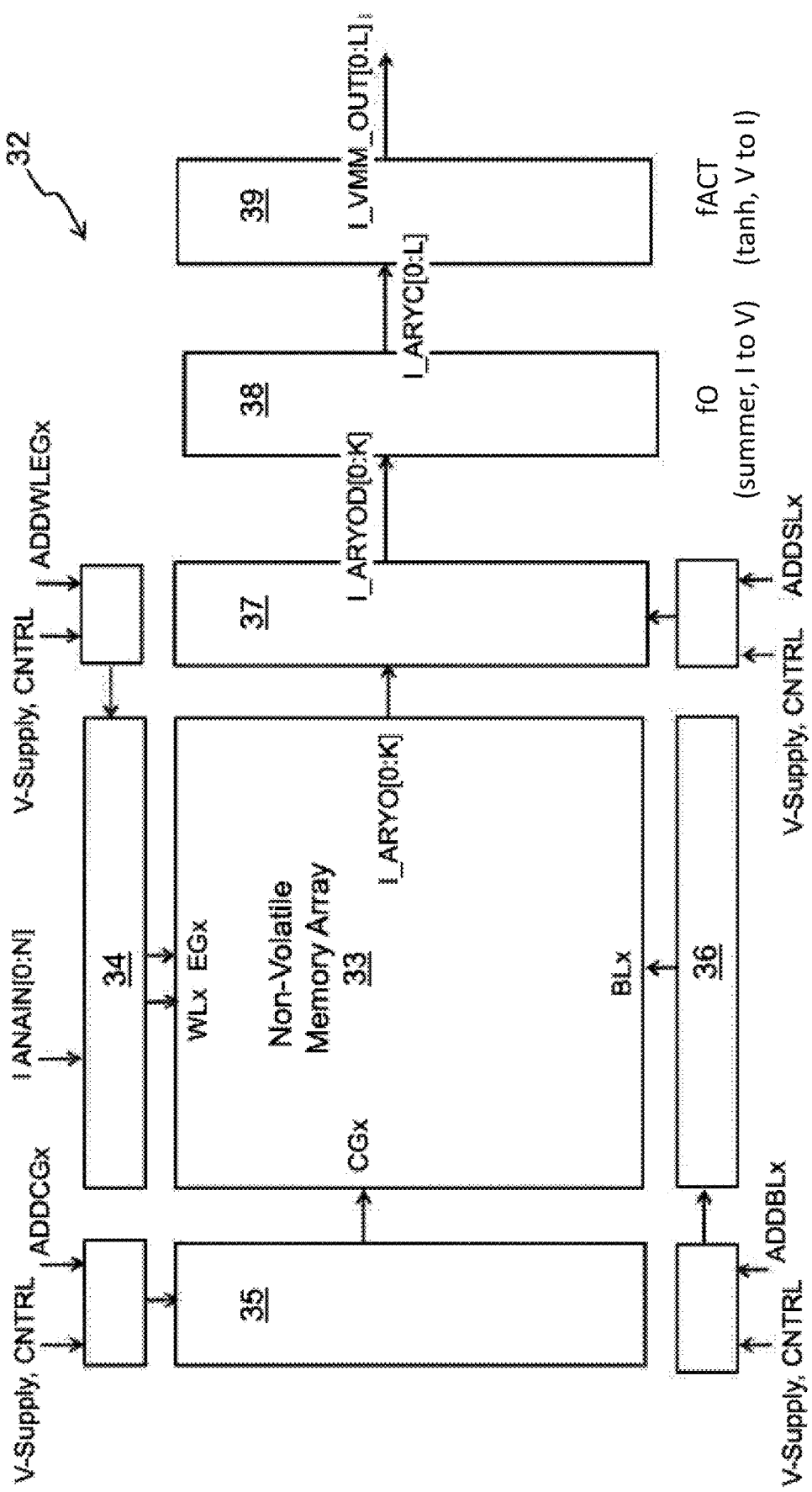
FIG. 10 depicts a VMM system comprising a VMM array and other circuitry.
Figure 11:
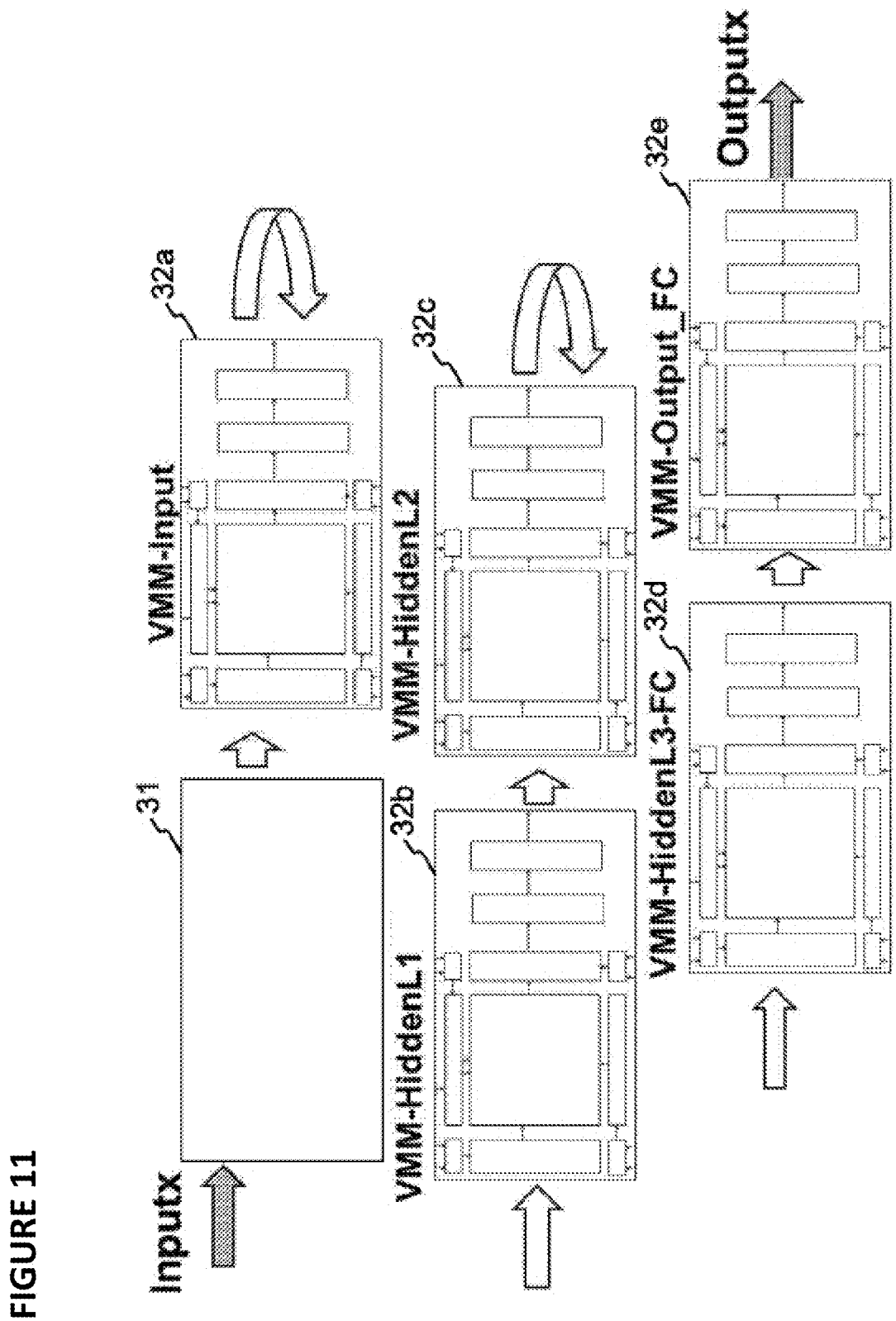
FIG. 11 depicts an exemplary artificial neural network utilizing one or more VMM systems.
Figure 12:
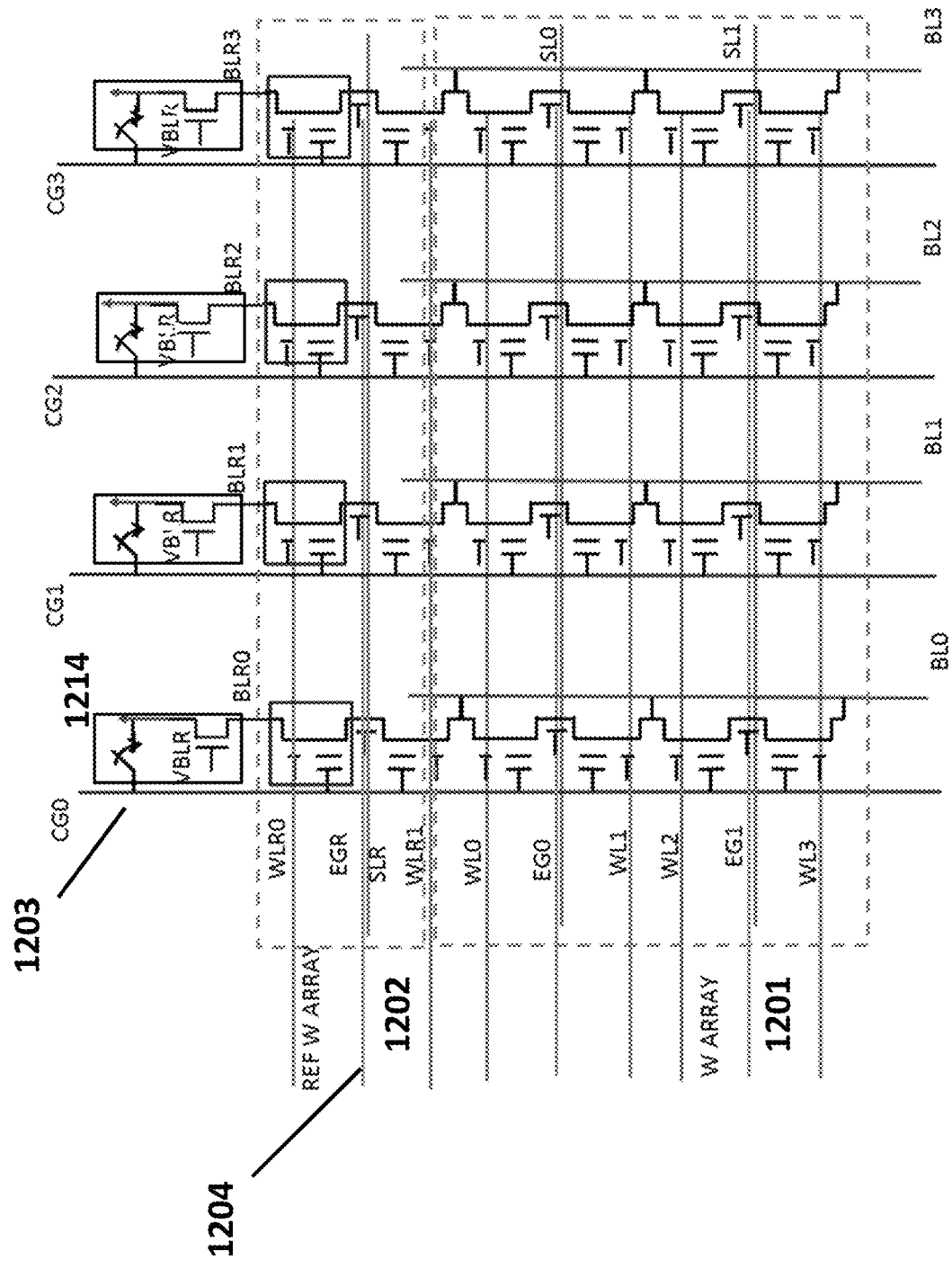
FIG. 12 depicts an embodiment of a VMM array.
Figure 13:
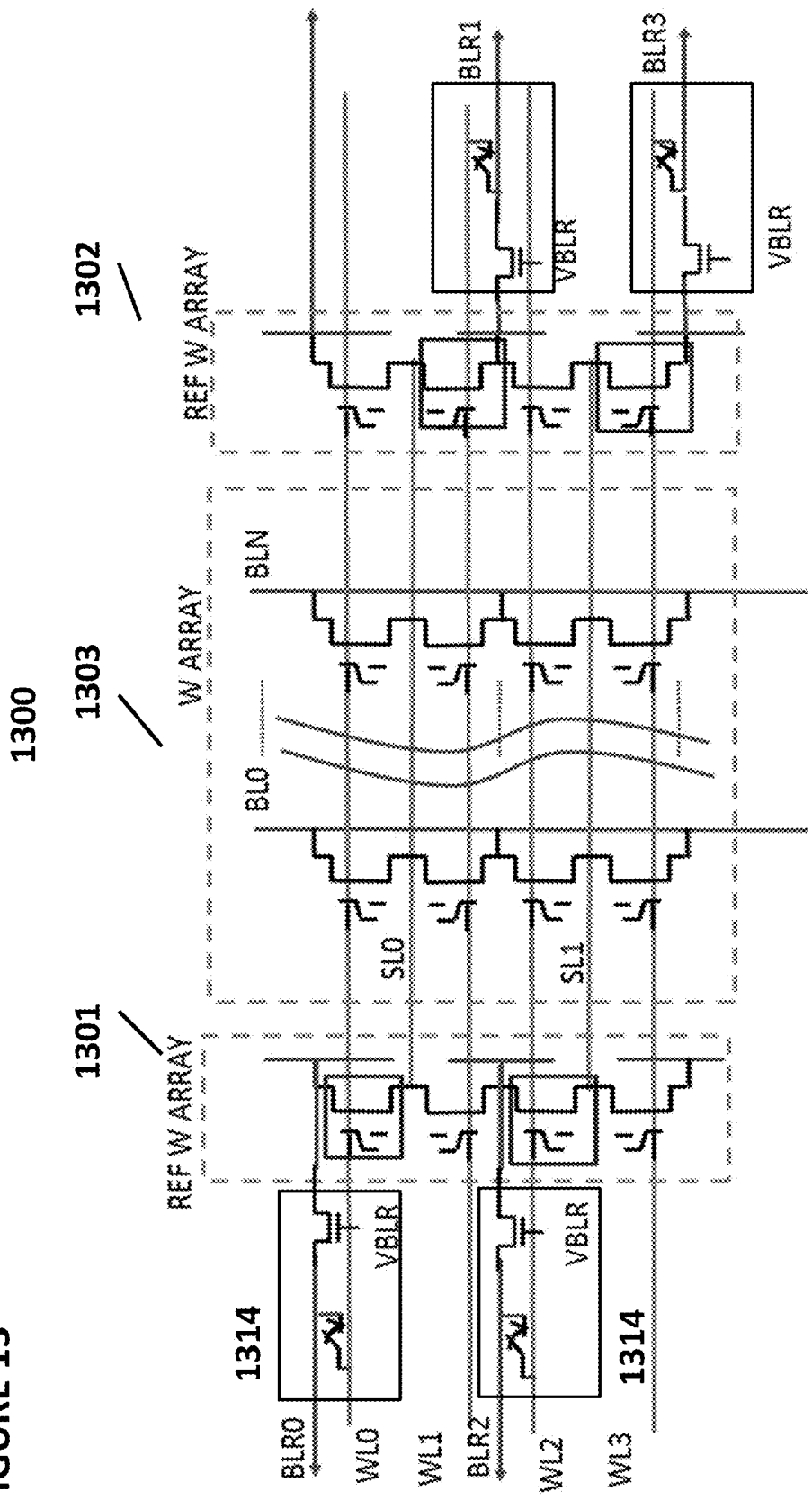
FIG. 13 depicts another embodiment of a VMM array.
Figure 14:
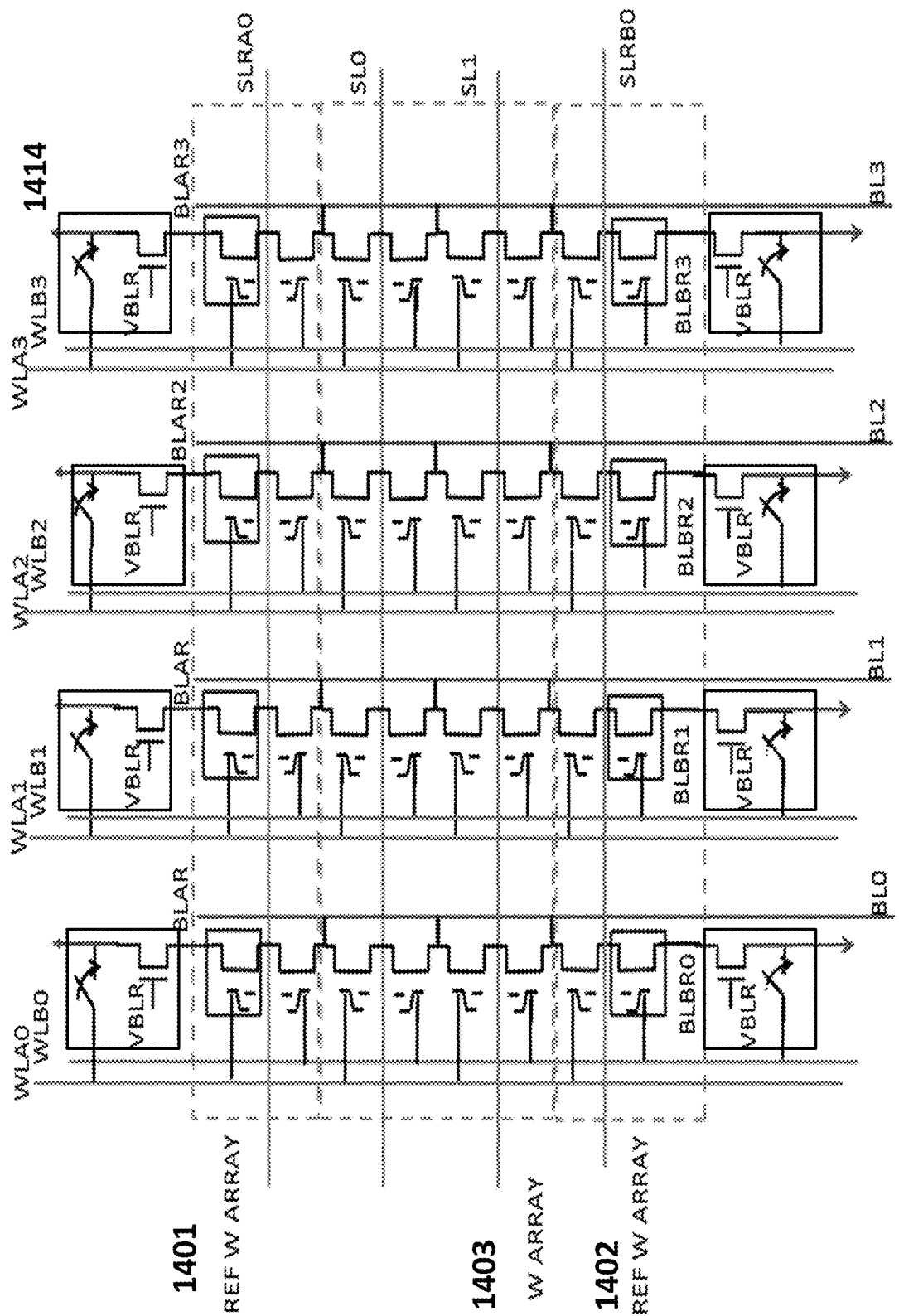
FIG. 14 depicts another embodiment of a VMM array.
Figure 15:
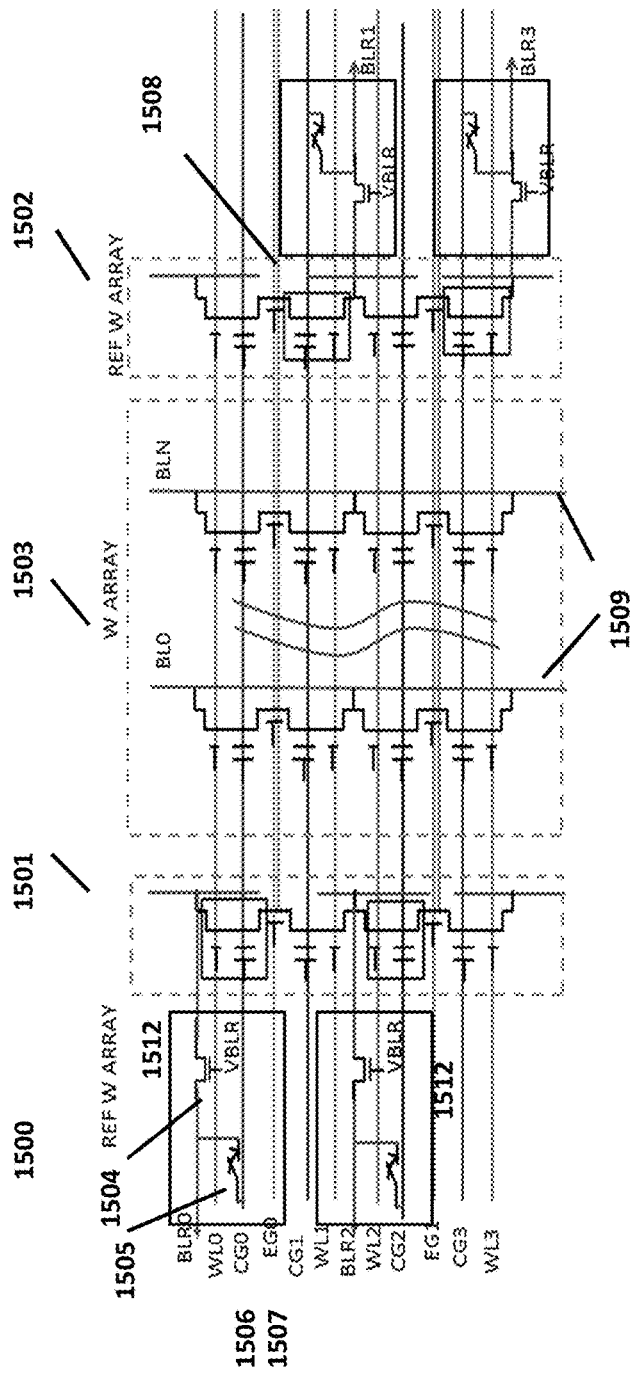
FIG. 15 depicts another embodiment of a VMM array.
Figure 16:
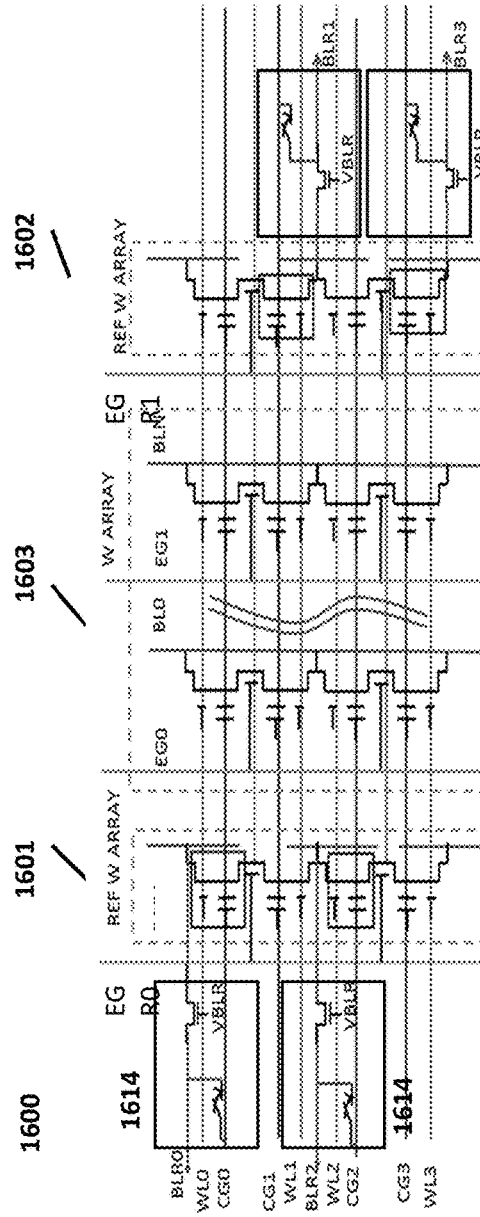
FIG. 16 depicts another embodiment of a VMM array.
Figure 17:
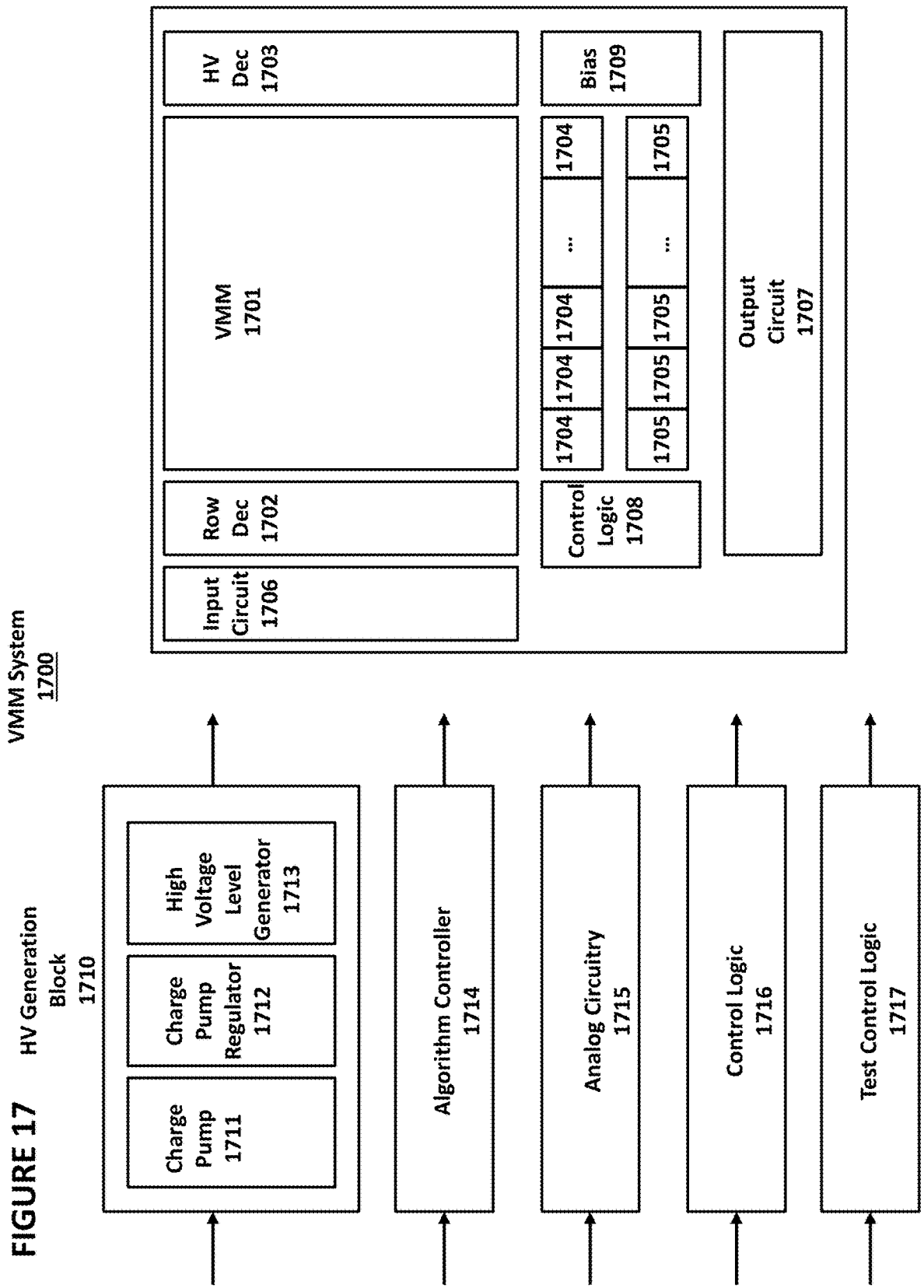
FIG. 17 depicts a VMM system.

FIG. 17 depicts a block diagram of VMM system 1700. VMM system 1700 comprises VMM array 1701, row decoders 1702, high voltage decoders 1703, column decoders 1704, bit line drivers 1705, input circuit 1706, output circuit 1707, control logic 1708, and bias generator 1709. VMM system 1700 further comprises high voltage generation block 1710, which comprises charge pump 1711, charge pump regulator 1712, and high voltage level generator 1713. VMM system 1700 further comprises algorithm controller 1714, analog circuitry 1715, control logic 1716, and test control logic 1717. The systems and methods described below can be implemented in VMM system 1700.

The input circuit 1706 may include circuits such as a DAC (digital to analog converter), DPC (digital to pulses converter), AAC (analog to analog converter, such as current to voltage converter), PAC (pulse to analog level converter), or any other type of converters. The input circuit 1706 may implement normalization, scaling functions, or arithmetic functions. The input circuit 1706 may implement temperature compensation function for input. The input circuit 1706 may implement activation function such as ReLU or sigmoid. The output circuit 1707 may include circuits such as a ADC (analog to digital converter, to convert neuron analog output to digital bits), AAC (analog to analog converter, such as current to voltage converter), APC (analog to pulse(s) converter), or any other type of converters. The output circuit 1707 may implement activation function such as ReLU or sigmoids. The output circuit 1707 may implement statistic normalization, regularization, up/down scaling functions, statistical rounding, or arithmetic functions (e.g., add, subtract, divide, multiply, shift, log) for neuron outputs. The output circuit 1707 may implement temperature compensation function for neuron outputs or array outputs (such as bitline output) such as to keep power consumption of the array approximately constant or to improve precision of the array (neuron) outputs such as by keeping the IV slope approximately the same.

Figure 18A:
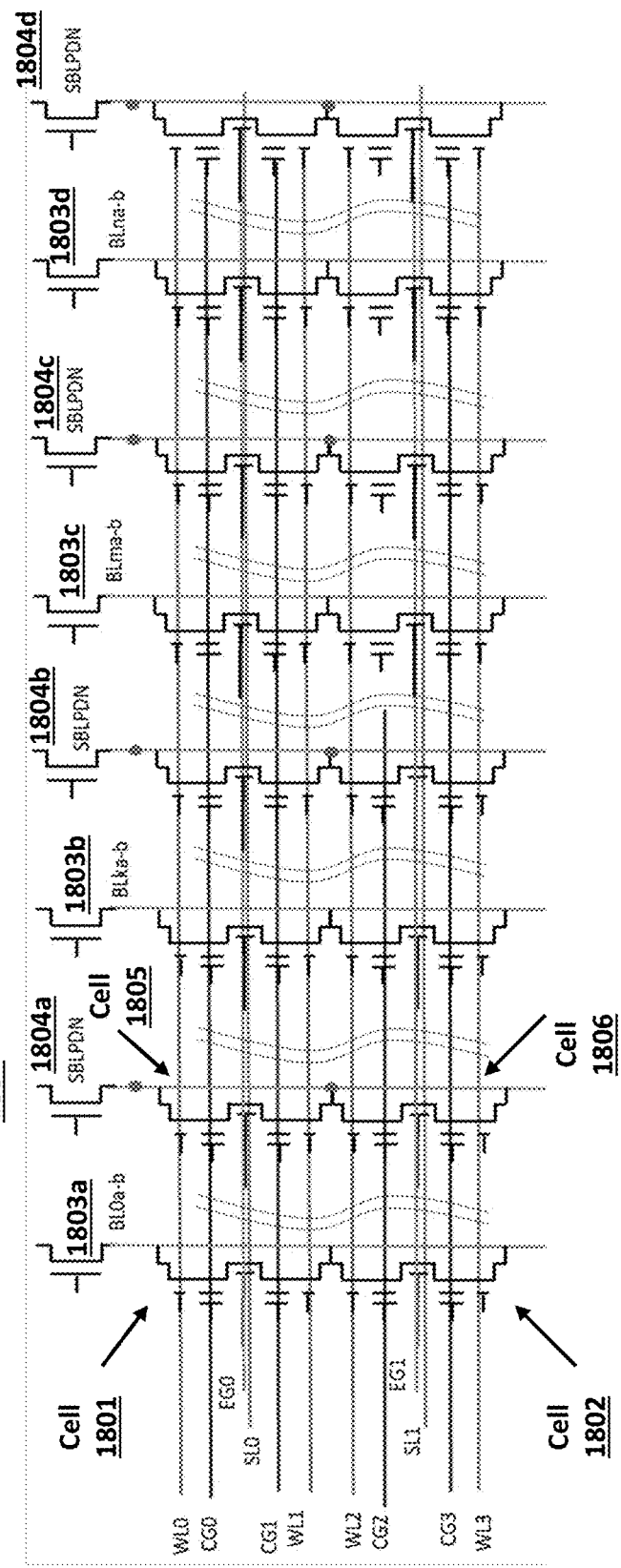

FIG. 18A depicts prior art VMM system 1800. VMM system 1800 comprises exemplary cells 1801 and 1802, exemplary bit line switch 1803 (which connects bit lines to sensing circuitry), exemplary dummy bit line switch 1804 (which couples to a low level such as ground level in read), exemplary dummy cells 1805 and 1806 (source line pulldown cells). Bit line switch 1803 is coupled to a column of cells, including cells 1801 and 1802, that are used to store data in VMM system 1800. Dummy bit line switch 1804 is coupled to a column (bitline) of cells that are dummy cells are not used to store data in VMM system 1800. This dummy bitline (also known as a source line pulldown bitline) is used as source line pulldown in read, meaning it is used to pull the source line SL (e.g. SL0 and SL1) to a low level, such as a ground level, through the memory cells in the dummy bitline. Dummy bit line switch 1804 is on the same end of the array as bit line switch 1803.

One drawback of VMM system 1800 is that the input impedance for each cell varies due to the length of the electrical path through the relevant bit line switch, the cell itself, and the relevant dummy bit line switch. For example, FIG. 18B shows the electrical path through bit line switch 1803, cell 1801, source line SL0, dummy cell 1805, and dummy bit line switch 1804. Similarly, FIG. 18C shows the electrical path through bit line switch 1803, vertical metal bitline 1807, cell 1802, source line SL1, dummy cell 1806, vertical metal bitline 1808, and dummy bit line switch 1804. As can be seen, the path in FIG. 18C through cell 1802 traverses a significantly larger length of bit line and dummy bit line than the path in FIG. 18B through cell 1801, and thus the path through cell 1802 is associated with a higher capacitance and higher resistance than the path through cell 1801. This results in cell 1802 having a greater parasitic impedance in the bit line or source line than cell 1801. This variability is a drawback, for instance, because it results in a variance in the precision of the cell output as applied to read or verify (for program/erase tuning cycles) cells depending on their location within the array.

FIG. 19A depicts improved VMM system 1900. VMM system 1900 comprises exemplary cells 1901 and 1902, exemplary bit line switch 1903 (which connects the bit lines to sensing circuitry), exemplary dummy cells 1905 and 1906 (which each is a pulldown cell), and exemplary dummy bit line switch 1904 (which couples to a low level such as ground level in read). Dummy bit line switch connects to a dummy bit line that connects to dummy cells 1905, 1906 used as pulldown cells). As can be seen, exemplary dummy bit line switch 1904 and the other dummy bit line switches are located on the opposite end of the array from bit line switch 1903 and the other bit line switches. Four columns of cells and associated dummy cells are shown, with the bit line switches labelled respectively 1903a, 1903b, 1903c, 1903d and the respective dummy bit line switches labelled 1904a, 1904b, 1904c and 1904d.

Figure 19B:
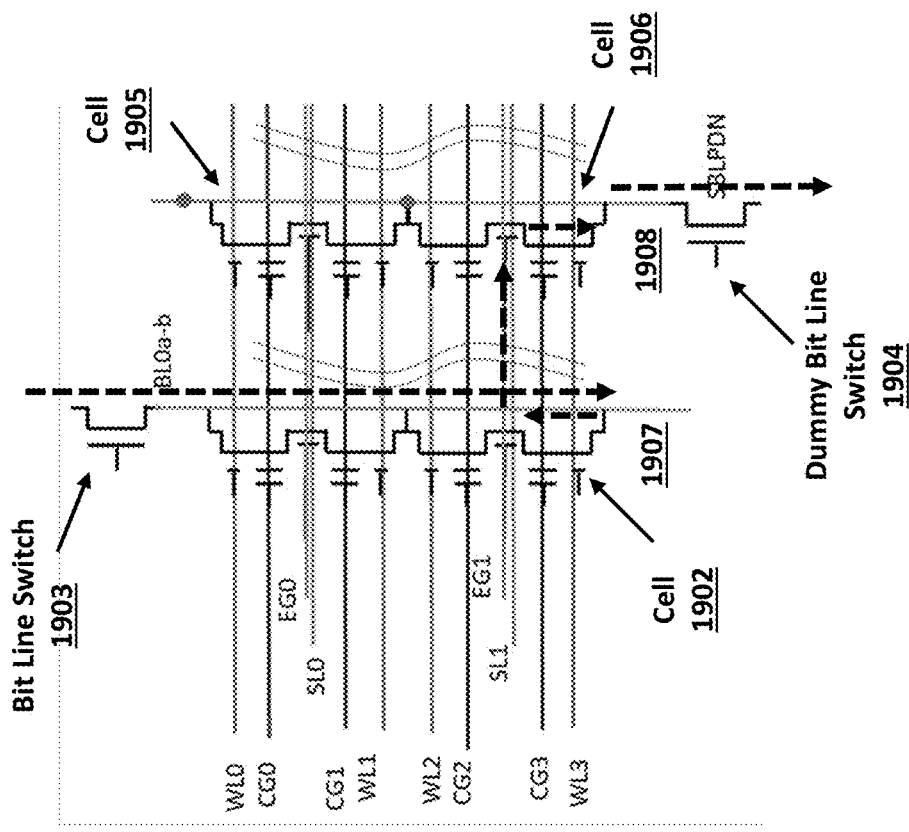
Figure 19C:
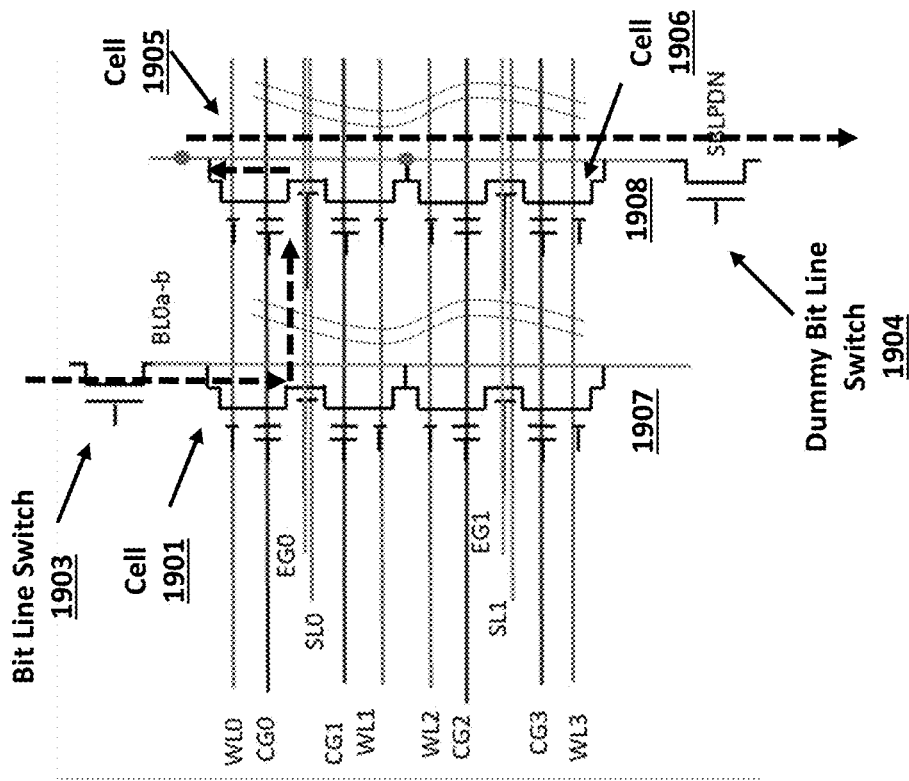

The benefit of this design can be seen in FIGS. 19B and 19C. FIG. 19B depicts the electrical path through bit line switch 1903, cell 1901, source line SL0, dummy cell 1905 (source line pulldown cell), vertical metal bit line 1908, and dummy bit line switch 1904 (which couples to a low level such as ground level in read). FIG. 19C depicts the electrical path through bit line switch 1903, vertical metal line 1907, cell 1902, source line SL1, dummy cell 1906 (source line pulldown cell), and dummy bit line switch 1904. The paths are substantially the same (cells, interconnect lengths), which is true for all cells in VMM system 1900. As a result, the bit line impedance plus source line impedance of each cell is substantially the same, which means that the variance in the amount of parasitic voltage drop in a read or verify operation of the various cells in the array is relatively same.

Figure 20:
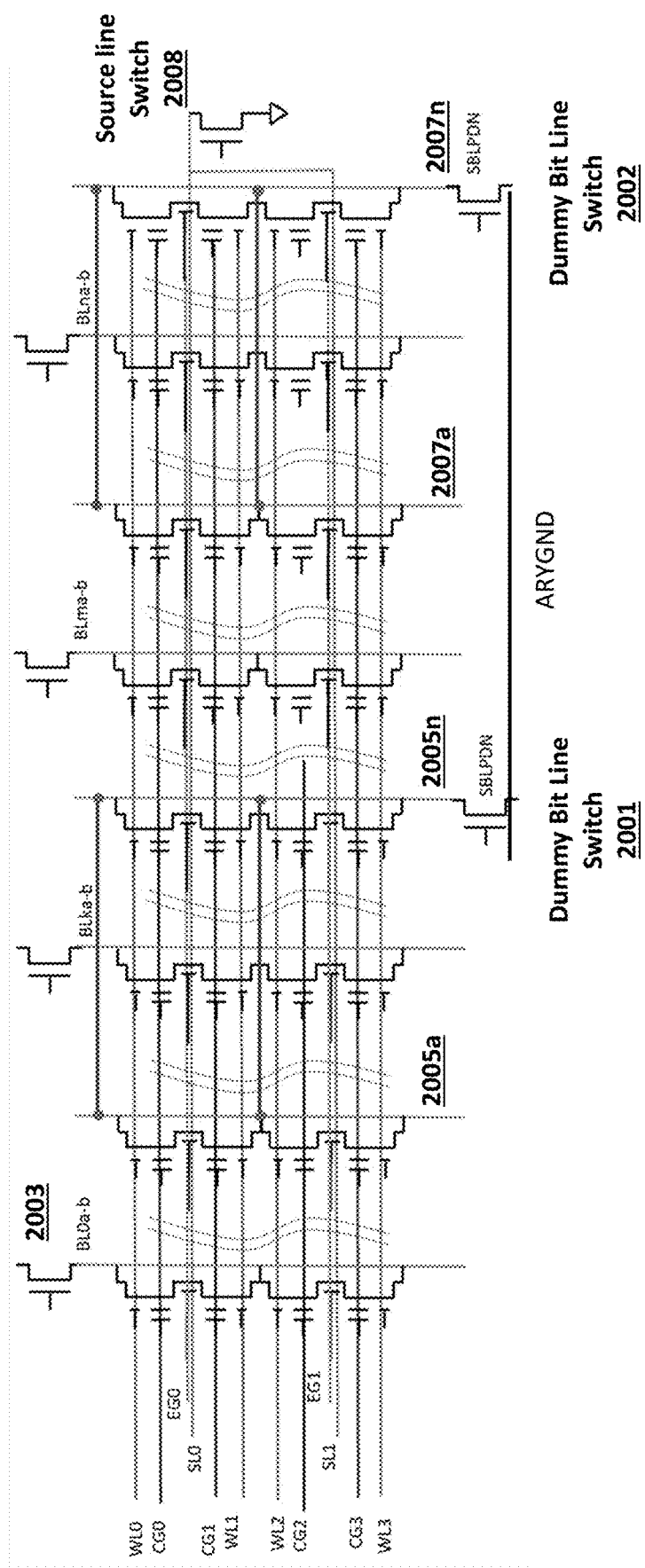
FIG. 20 depicts another improved VMM array.

FIG. 20 depicts VMM system 2000 with global source line pulldown bitline. VMM system 2000 is similar to VMM system 1900, except that: the dummy bit lines 2005a-2005n and 2007a-2007n are connected together (to act as global source line pulldown lines to pull memory cell source lines to ground level during read or verify), the dummy bit line switches, such as dummy bit line switch 2001 and 2002, are connected or coupled to a common ground, denoted ARYGND; and the source lines are coupled together to source line switch 2008, which selectively pulls the source lines to ground. These changes further decrease the variance in (array) parasitic impedance among cells during read or verify operations.

Figure 21:
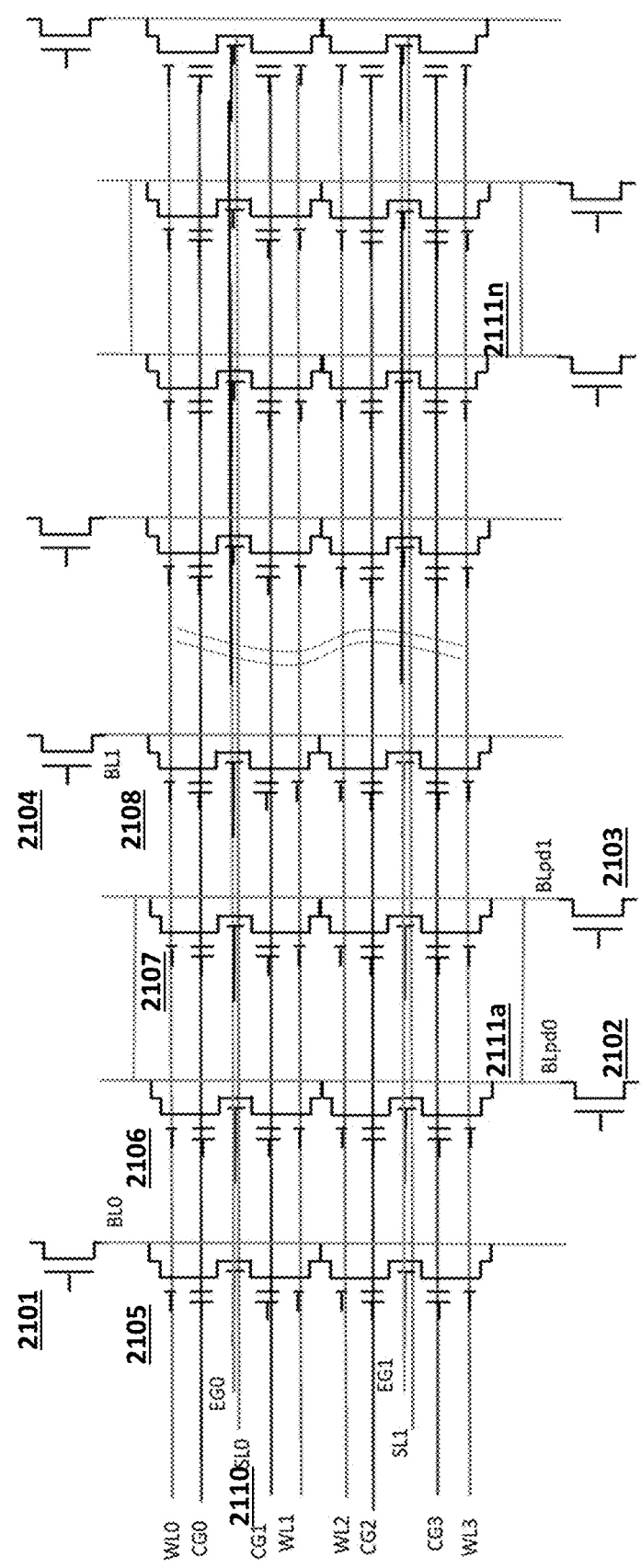
FIG. 21 depicts a VMM system with an improved source line pulldown mechanism.

FIG. 21 depicts VMM system 2100. VMM system 2100 comprises bit line switch 2101, dummy bit line (aka pulldown bit line) switch 2102, dummy bit line switch 2103, bit line switch 2104, data cell 2105 (herein, a "data cell" is a memory cell used to store a weight value for a neural network), dummy cell (aka pulldown cell) 2106, dummy cell 2107, and data cell 2018. Note that the dummy cells 2106 and 2107 are adjacent to each together. This allows vertical metal lines BLpdx of the two dummycells 2106 and 2107 to be connected together (line 2111) to reduce parasitic resistance due to the resulting wider metal line. During a read or verify (for program/erase tuning cycles) operation of data cell 2105, current will flow through bit line switch 2101 into the bit line terminal of cell 2105 and out to the source line terminal of cell 2015, where it then flows into source line 2110, into the source line terminals of dummy cells 2106 and 2107, though vertical dummy bit line 2111s, and through dummy bit line switches 2102 and 2103. During a read or verify (for program/erase tuning cycles) operation of data cell 2108, current will flow through bit line switch 2104 into the bit line terminal of data cell 2108 and out to the source line terminal of cell 2108, where it then flows into source line 2110, into the source line terminals of dummy cells 2106 and 2107, through vertical dummy bit line 2111s, and through dummy bit line switches 2102 and 2103. This pattern of columns repeats throughout the array, where every four columns contains two columns of data cells and two adjacent array columns used for pulldown operations located between the two columns of data cells. In another embodiment, the diffusion of the two pulldown cells of the two adjacent columns can be merged together into one bigger diffusion to increase the pulldown capability. In another embodiment, the diffusion of the pulldown cell can be made to be bigger than that of the data cell diffusion to increase the pulldown capability. In another embodiment, each pulldown cell has a bias condition different than a bias condition of a selected data cell.

In one embodiment, the pulldown cell has the same physical structure as a regular data memory cell. In another embodiment, the pulldown cell has a different physical structure than a regular data memory cell, for example, the pulldown cell can be a modified version of a regular data memory cell such as by modifying one or more physical dimensions (width, length, without limitation) or electrical parameters (layer thickness, implant, without limitation). In another embodiment, the pulldown cell is a regular transistor (without a floating gate) such as an I/O or high voltage transistor.

Figure 22:
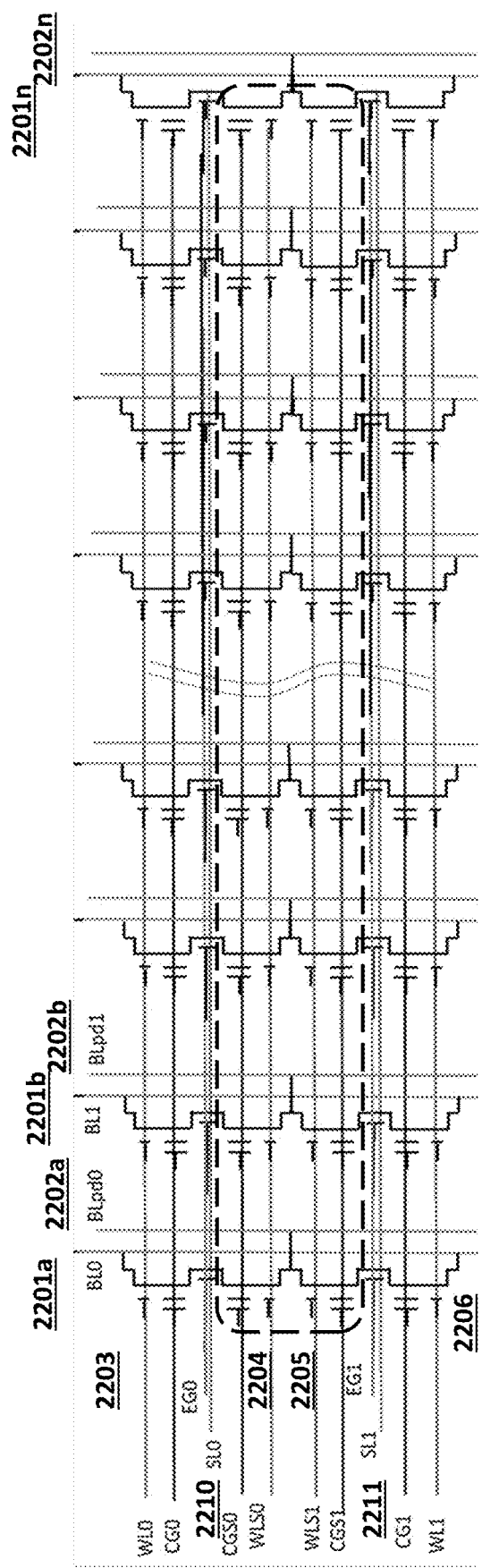
FIG. 22 depicts another VMM system with an improved source line pulldown mechanism.

FIG. 22 depicts VMM system 2200. VMM system 2200 comprises bit line 2201, pulldown bit line 2202, data cells 2203 and 2206, pulldown cells 2204 and 2205, and source lines 2210, 2211. During a read or verify operation of cell 2203, current will flow through bit line switch 2201 into the bit line terminal of cell 2203 and out to the source line terminal of cell 2203, where it then flows into source line 2210 and into the source line terminals of pulldown cell 2204 and through pulldown bit line BLpd 2202 which is connected (such as through a contact) to the drain of pulldown cell 2204. This design is repeated for every column, with the net result that the row containing pulldown cell 2204 is a row of pulldown cells.

During a read or verify (for program/erase tuning cycles) operation of cell 2206, current will flow through bit line switch 2201 into the bit line terminal of cell 2206 and out to the source line terminal of cell 2206, where it then flows into source line 2211 and into the source line terminal of pulldown cell 2205 and through pulldown bit line BLpd 2202 which is connected (such as through a contact) to the drain of pulldown cell 2205. This design is repeated for every column, with the net result that the row containing pulldown cell 2205 is a row of pulldown cells. As shown in FIG. 22, there are four rows, the two middle adjacent rows are used for pulldown cells, the top and bottom rows are data cells.

Table No. 10 depicts operating voltages for VMM system 2200. The columns in the table indicate the voltages placed on bit lines for selected cells, pulldown bit lines, word lines WL for selected cells, control gates for selected cells, word lines WLS for selected pulldown cells, control gates CGS for selected pulldown cells, erase gates EG for all cells, and source lines SL for all cells. The rows indicate the operations of read, erase, and program. Note that the voltage bias for CGS and WLS in read are higher than that of the regular WL and CG biases to enhance the drive capability of the pulldown cells. The voltage biased for WLS and CGS can be negative during programming to reduce disturb.

TABLE NO. 10

Operation of VMM Array 2200 FIG. 22

| | BL | BLpd | WL | CG | WLS | CGS | EG | SL |
|---|---|---|---|---|---|---|---|---|
| Erase | 0 V | 0 V | 0 V | 0 V | 0 V | 0 V | 11.5 V | 0 V |
| Program | Iprog | VINH | ~0.7 V | ~10.5 V | −0.5 V to 0 V | −2 V to 0 V | ~4.5 V | ~4.5 V |
| Read | 0.6 V | 0 V | ~0-1.1 V | ~0-1.5 V | 1.1-1.3 V | 1.8-3 V | 0 V | 0 V |

Figure 23:
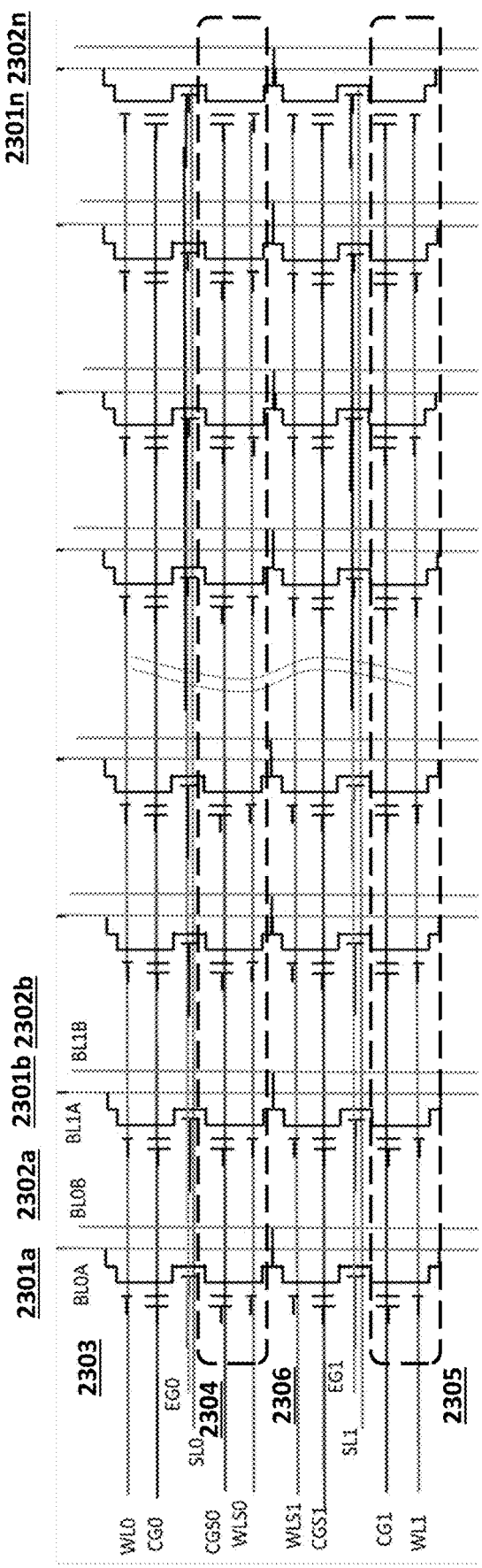
FIG. 23 depicts another VMM system with an improved source line pulldown mechanism.

FIG. 23 depicts VMM system 2300. VMM system 2300 comprises bit line 2301, pulldown bit line 2302, data cells 2303 and 2306, and pulldown cells 2304 and 2305. During a read or verify (for program/erase tuning cycles) operation of cell 2303, current will flow through bit line 2301 into the bit line terminal of cell 2303 and out to the source line terminal of cell 2303, where it then flows into the source line terminal of pulldown cell 2304 (connected to source line SL0) and through pulldown bit line 2302 which is connected to the drain terminal of pulldown cell 2304. This design is repeated for every column, with the net result that the row containing pulldown cell 2304, in a first mode, is a row of pulldown cells. During a read or verify (for program/erase tuning cycles) operation of data cell 2306, current will flow through bit line 2301 into the bit line terminal of cell 2306 and out to the source line terminal of cell 2306 (connected to source line SL1), where it then flows into source line terminal of pulldown cell 2305 and through pulldown bit line 2302 which is connected to the drain terminal of pulldown cell 2305. This design is repeated for every column, with the net result that the row containing pulldown cell 2305, in a second mode, is a row of pulldown cells. As shown in FIG. 23, there are four rows, the alternative odd (or even) rows are used for pulldown cells, the alternative even (or odd) rows are data cells.

Notably, during the second mode, cells 2304 and 2306 are active in read or verify and cells 2303 and 2305 are used for the pulldown process, with the roles of bit lines 2301 and 2302 being reversed compared to the first mode. In other words, the role of each row of cells can change between the first mode and the second mode, and the role of each bit line can change between the first mode and the second mode.

Table No. 11 depicts operating voltages for VMM system 2300. The columns in the table indicate the voltages placed on bit lines for selected data cells, bit lines BL0A, BL0B for selected pulldown cells, word lines WL for selected data cells, control gates CG for selected data cells, word lines WLS for selected pulldown cells, control gates CGS for selected pulldown cells, erase gates EG for all cells, and source lines SL for all cells. The rows indicate the operations of read, erase, and program.

TABLE NO. 11

Operation of VMM System 2300 FIG. 23

| | BL0A | BL0B | WL | CG | WLS | CGS | EG | SL |
|---|---|---|---|---|---|---|---|---|
| Erase | 0 V | 0 V | 0 V | 0 V | 0 V | 0 V | 11.5 V | 0 V |
| Program | Iprog | VINH | ~0.7 V | ~10.5 V | −0.5 V to 0 V | −2 V to 0 V | ~4.5 V | ~4.5 V |
| Read | 0.6 V/0 V | 0 v/0.6 V | ~0-1.1 V | ~0-1.5 V | 1.1-1.3 V | 1.8-3 V | 0 V | 0 V |

Figure 24:
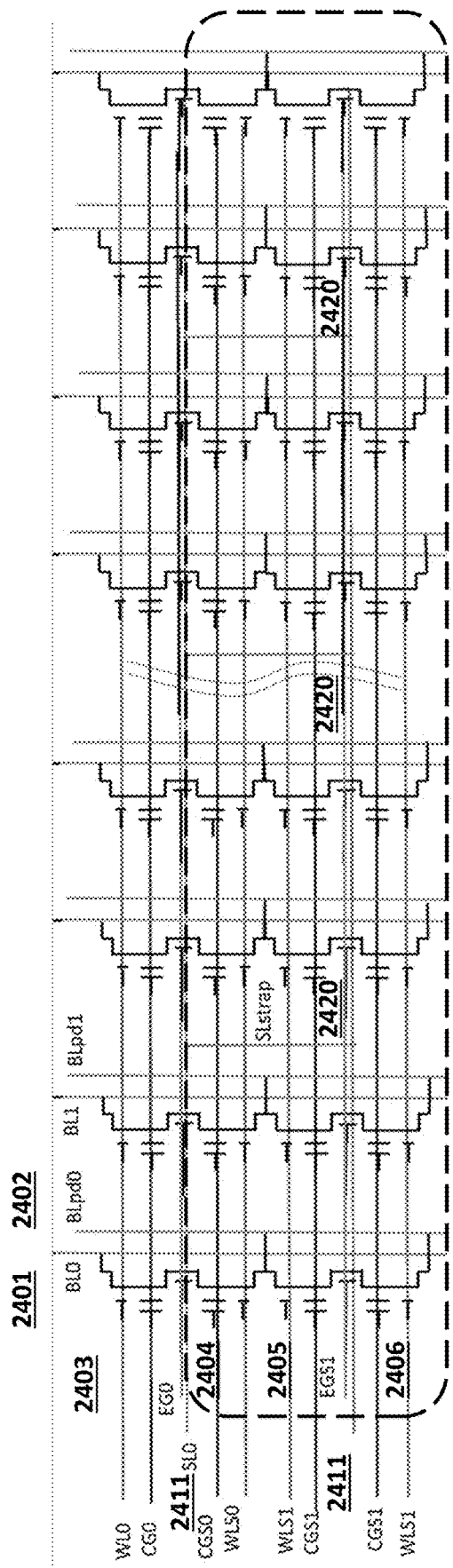
FIG. 24 depicts another VMM system with an improved source line pulldown mechanism.

FIG. 24 depicts VMM system 2400. VMM system 2400 comprises bit line 2401, pulldown bit line 2402, (data) cell 2403, source lines 2411, and pulldown cells 2404, 2405, and 2406. During a read or verify operation of cell 2403, current will flow through bit line 2401 into the bit line terminal of cell 2403 and out to the source line terminal of cell 2403, where it then flows into source line 2411, and where it then flows into the source line terminal of pulldown cells 2404, 2405, and 2406, from which is flows through pulldown bit line 2402. This design is repeated for every column, with the net result that the rows containing pulldown cells 2404, 2405, and 2406 each are rows of pulldown cells. This maximizes the pulldown applied to the source line terminal of cell 2403, as current is drawn through three cells into pulldown bit line 2402. Note that the source lines of the four rows are connected together by vertical lines 4020s.

Table No. 12 depicts operating voltages for VMM system 2400. The columns in the table indicate the voltages placed on bit lines BL for selected cells, pulldown bit lines BPpd, word lines WL for selected cells, control gates CG for selected cells, erase gates EG for selected cells, word lines WLS for selected pulldown cells, control gates CGS for selected pulldown cells, erase gates EGS for selected pulldown cells, and source lines SL for all cells. The rows indicate the operations of read, erase, and program.

TABLE NO. 12

Operation of VMM System 2400 FIG. 24

Op Table

| | BL | BPpd | WL | CG | WLS | CGS | EG | EGS | SL |
|---|---|---|---|---|---|---|---|---|---|
| Erase | 0 V | 0 V | 0 V | 0 V | 0 V | 0 V | 11.5 V | 11.5 V | 0 V |
| Program | Iprog | VINH | ~0.7 V | ~10.5 V | −0.5 V to 0 V | −2 V to 0 V | ~4.5 V | 0 V | ~4.5 V |
| Read | 0.6 V/0 V | 0 V | ~0-1.1 V | ~0-1.5 V | 1.1-1.3 V | 1.8-3 V | 0 V | ~2.5 V | 0 V |

Figure 25:
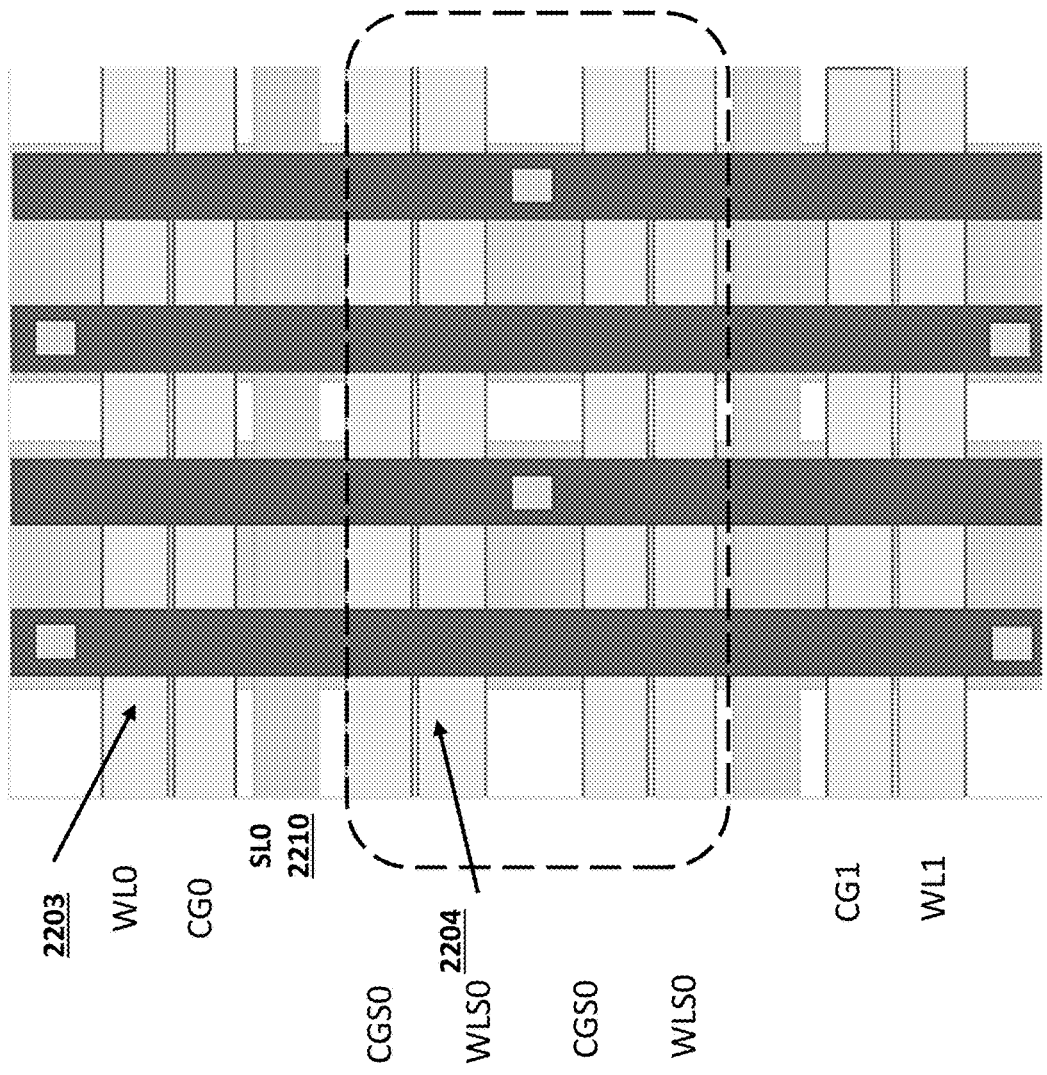
FIG. 25 depicts an exemplary layout diagram of a VMM system with an improved source line pulldown mechanism.

FIG. 25 depicts an exemplary layout 2500 for VMM system 2200 of FIG. 22. The light squares indicate metal contacts (metal to diffusion contacts) that contacts memory cell diffusions (drain region of memory cells) to metal bit lines such as bit line 2201 (such as contacting drain diffusion of memory cell 2203 to the bit line 2201) and metal pulldown bit lines such as pulldown bit line 2202 (such as contacting drain diffusion of memory cell 2204 to the pulldown bit line 2202).

Figure 26:
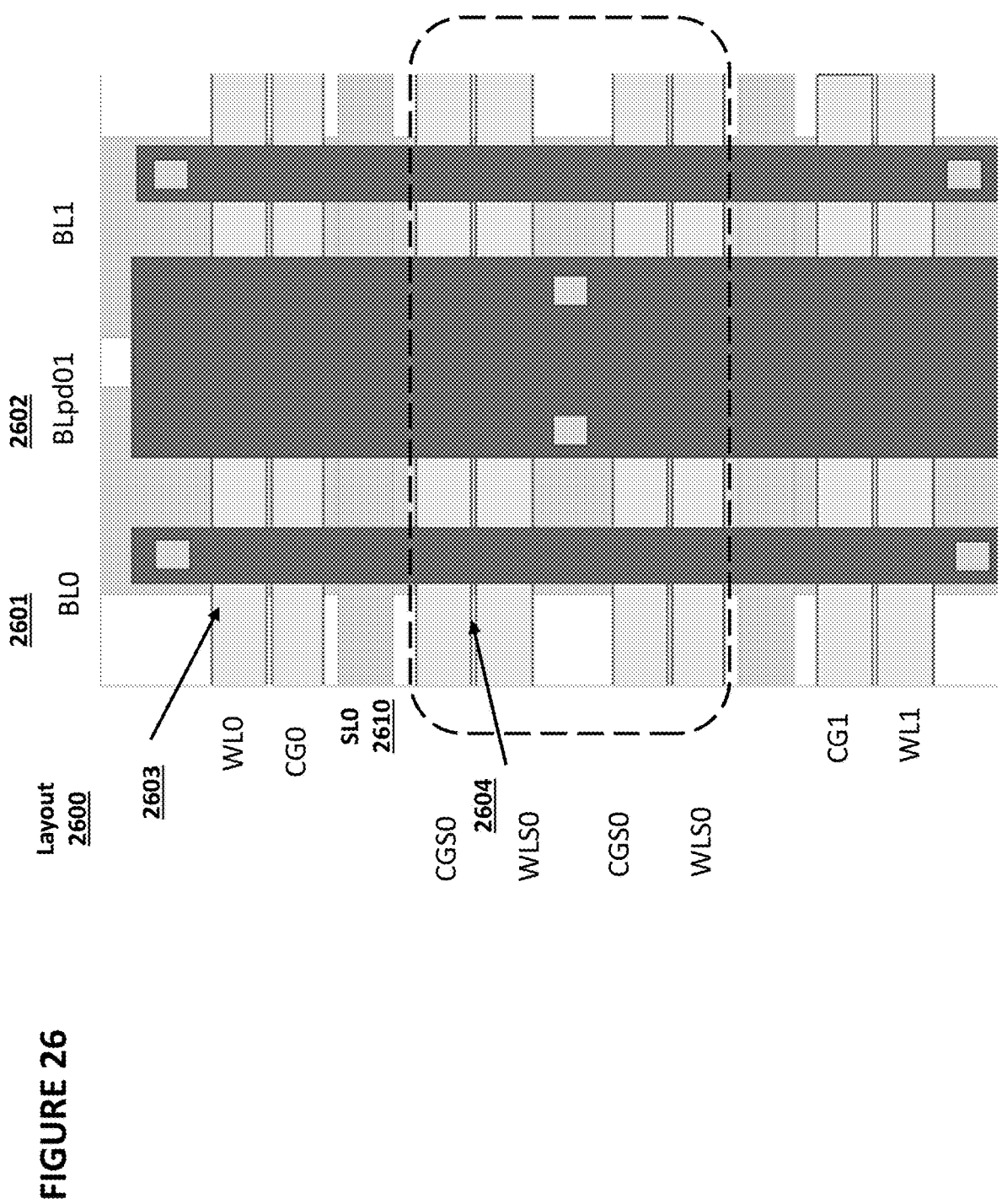
FIG. 26 depicts another exemplary layout diagram of a VMM system with an improved source line pulldown mechanism.

FIG. 26 depicts an alternative layout 2600 for a VMM system similar to the VMM system 2200 of FIG. 22, with the difference that verticalpulldown bit line 2602 is extremely wide and traverses and connects to two columns of pulldown cells. Meaning there is one vertical pulldown line for every two bit lines for data memory cells. That is, the area for pulldown bit line 2602 is wider than the area for bit line 2202 of FIG. 25. Layout 2600 further shows data cell 2603 and pulldown cell 2604, and source line 2610. In another embodiment, the diffusion of the two pulldown cells (left and right) can be merged together into one bigger diffusion area.

Figure 27A:
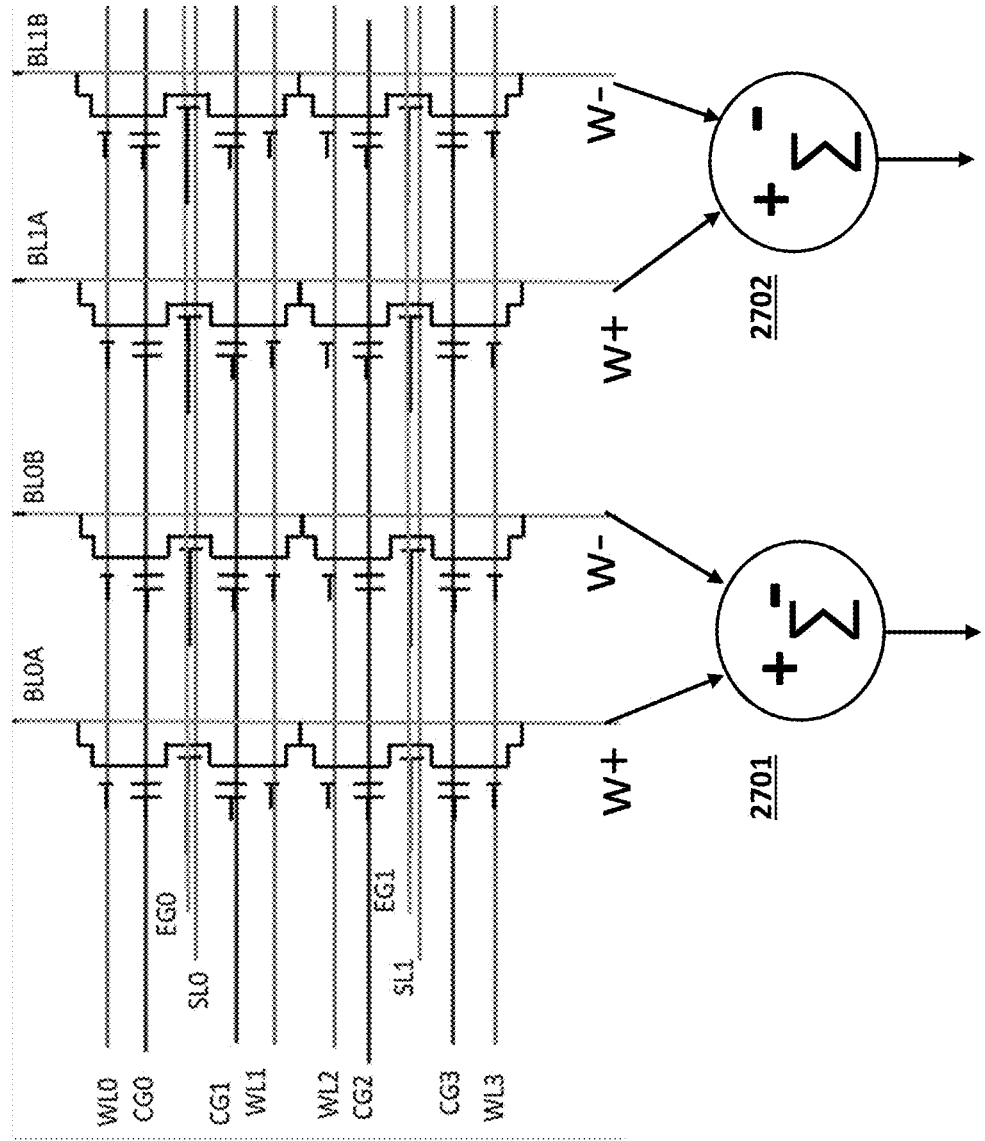
FIGS. 27A, 27B, and 27C depict other improved VMM arrays.

FIG. 27A depicts VMM system 2700. To implement negative and positive weights of a neural network, half of the bit lines are designated as w+ lines (bit lines connecting to memory cells implementing positive weights), and the other half of the bit lines are designated as w− lines (bit lines connecting to memory cells implementing negative weights) and are interspersed among the w+ lines in an alternating fashion. The application of the negative operation is done at the output of the w− bit line (neuron output) by a summation circuit, such as summation circuits 2701 and 2702. The output of a w+ line and the output of a w− line are combined together to give effectively w=w+−w− for each pair of (w+, w−) cells for all pairs of (w+, w−) lines. The dummy bitlines or pulldown bitlines used respectively to avoid coupling between the floating gates of adjacent cells (FG-FG coupling) and/or reduce IR voltage drop in the source line in read are not shown in the figure. The input (such as to CG or WL) to the system 2700 can has a positive value or a negative value. For the case where the input has a negative value, since actual input to the array is positive (such as an voltage level on CG or WL), the array output (bitline output) is made negative before output to realize the equivalent function of the negative value input.

Figure 27B:
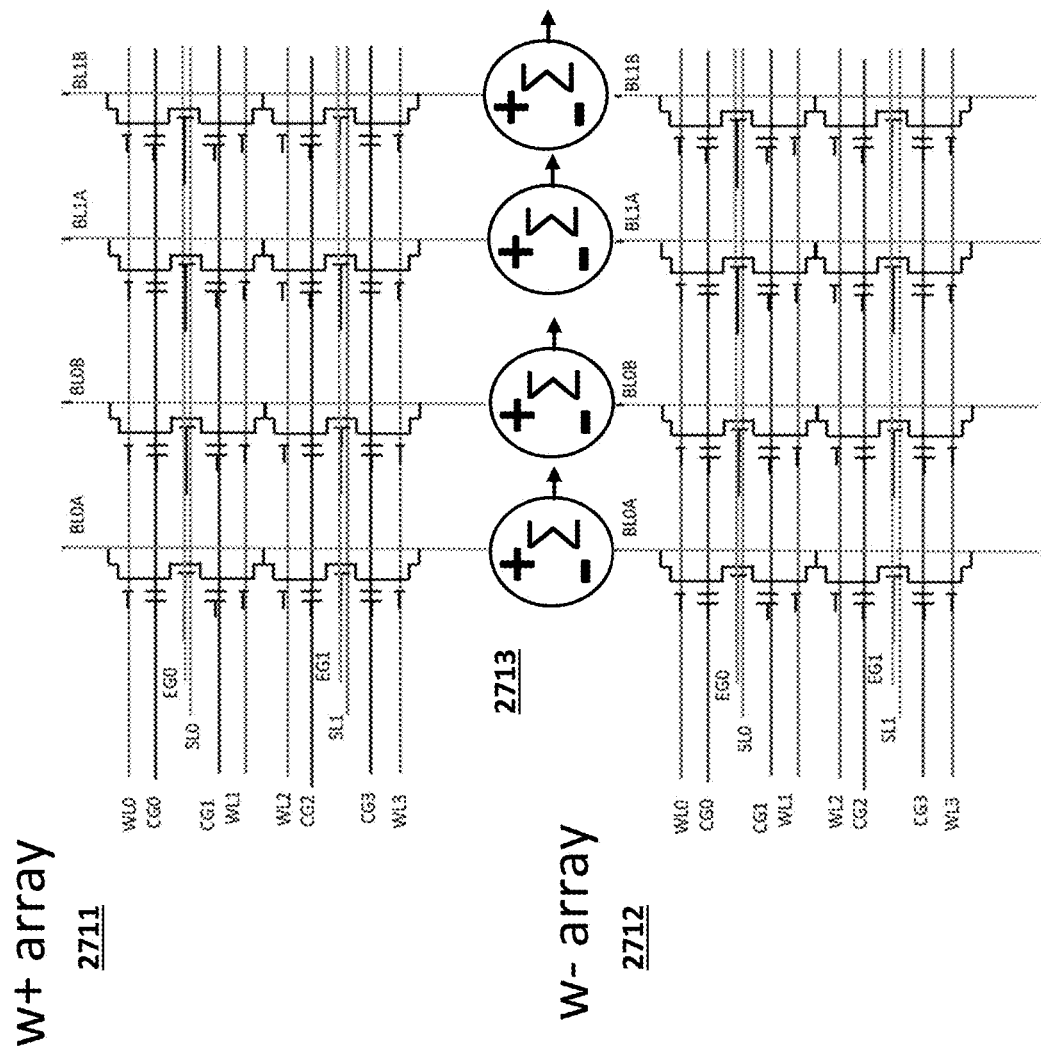

Alternatively, with reference to FIG. 27B, positive weights can be implemented in a first array 2711 and negative weights can implemented in a second array 2712, separate from the first array, and the resulting weights are appropriately combined together by summation circuits 2713. Similarly, the dummy bitlines (not shown) or pulldown bitlines (not shown) are used to respectively avoid FG-FG coupling and/or reduce IR voltage drop in the source line in read.

Figure 27C:
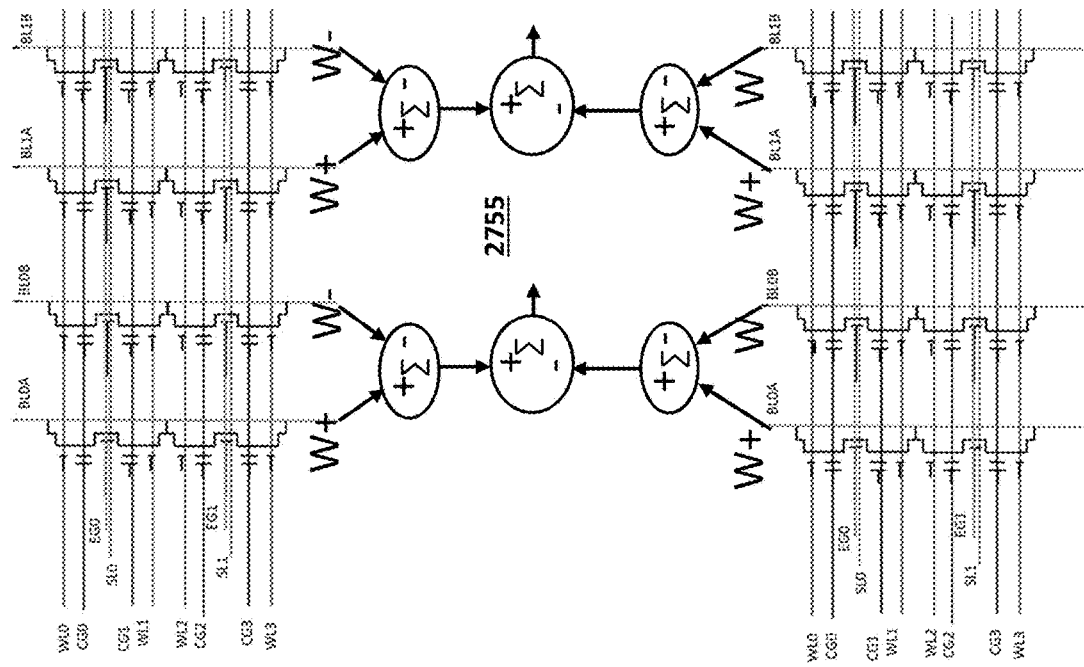

Alternatively, FIG. 27C depicts VMM system 2750 to implement negative and positive weights of a neural network with positive or negative input. First array 2751 implements positive value inputs with negative and positive weights in alternating columns, and second array 2752 implements negative value inputs with negative and positive weights in respective alternating columns. The output of the second array is made negative before being added to the output of the first array by the summer 2755.

Table 10A shows an exemplary arrangement of a physical array arrangement of a (w+, w−) pair of bit lines BL0/1 and BL2/3, where 4 rows are coupled to pulldown bit lines BLPWDNs. Pairs of bit lines (BL0,BL1; BL2,BL3) are used to implement (w+, w−) lines. Between the (w+, w−) line pair, there is a pulldown bit line (BLPWDN). This is used to prevent coupling (e.g., FG-FG coupling) from adjacent (w+, w−) lines into the current (w+, w−) lines. Basically, the pulldown bit line (BLPWDN) serves as physical barrier between pair of (w+, w−) lines.

Additional details regarding the FG-FG coupling phenomena, as well as mechanisms for counteracting that phenomena, are found in U.S. Provisional Patent Application No. 62/981,757, filed on Feb. 26, 2020 by the same assignee, and titled "Ultra-Precise Tuning of Analog Neural Memory Cells in a Deep Learning Artificial Neural Network," which is incorporated by reference herein.

Table 10B shows different exemplary weight combinations. '1' means that the cell is used and has a real output value, whereas '0' means the cell is not used and has no significant output value.

In another embodiment, dummy bit lines instead of pulldown bit lines can be used.

In another embodiment, dummy rows can also be used as physical barriers to avoid coupling between rows.

TABLE 10A

Exemplary Layout

| | BLPWDN | BL0 | BL1 | BLPWDN | BL2 | BL3 | BLPWDN |
|---|---|---|---|---|---|---|---|
| row0 | | w01+ | w01− | | w02+ | w02− | |
| row1 | | w11+ | w11− | | w12+ | w12− | |
| row2 | | w21+ | w21− | | w22+ | w22− | |
| row3 | | w31+ | w31− | | w32+ | w32− | |

TABLE 10B

Exemplary Weight Combinations

| | BLPWDN | BL0 | BL1 | BLPWDN | BL2 | BL3 | BLPWDN |
|---|---|---|---|---|---|---|---|
| row0 | | 1 | 0 | | 1 | 0 | |
| row1 | | 0 | 1 | | 0 | 1 | |
| row2 | | 0 | 1 | | 1 | 0 | |
| row3 | | 1 | 1 | | 1 | 1 | |

TABLE 11A

Exemplary Layout

| | BLPWDN | BL01 | BL0 | BL1 | BL2 | BL3 | BL23 | BLPWDN |
|---|---|---|---|---|---|---|---|---|
| row0 | | | | w01+ | w01− | w02+ | w02− | |
| row1 | | | | w11+ | w11− | w12+ | w12− | |
| row2 | | | | w21+ | w21− | w22+ | w22− | |
| row3 | | | | w31+ | w31− | w32+ | w32− | |

TABLE 11B

Exemplary Weight Combinations

| | BLPWDN | BL01 | BL0 | BL1 | BL2 | BL3 | BL23 | BLPWDN |
|---|---|---|---|---|---|---|---|---|
| row0 | | | 1 | 0 | 1 | 0 | | |
| row1 | | | 0 | 1 | 0 | 1 | | |
| row2 | | | 1 | 0 | 1 | 0 | | |
| row3 | | | 0 | 1 | 0 | 1 | | |

TABLE 11C

Exemplary Weight Combinations

| | BLPWDN | BL01 | BL0 | BL1 | BL2 | BL3 | BL23 | BLPWDN |
|---|---|---|---|---|---|---|---|---|
| row0 | | | 0 | 1 | 1 | 0 | | |
| row1 | | | 0 | 1 | 1 | 0 | | |
| row2 | | | 0 | 1 | 1 | 0 | | |
| row3 | | | 0 | 1 | 1 | 0 | | |

TABLE 11D

Remapped Weight Combinations

| | BLPWDN | BL01 | BL0 | BL1 | BL2 | BL3 | BL23 | BLPWDN |
|---|---|---|---|---|---|---|---|---|
| row0 | | 0 | 0 | 1 | 0 | 0 | 1 | |
| row1 | | 1 | 0 | 0 | 1 | 0 | 0 | |
| row2 | | 0 | 0 | 1 | 0 | 0 | 1 | |
| row3 | | 1 | 0 | 0 | 1 | 0 | 0 | |

Table 11A shows another array embodiment of a physical arrangement of (w+, w−) of bitline pairs BL0/1 and BL2/3 with redundant lines BL01,BL23 and pulldown bit lines BLPWDN. BL01 is used for weight re-mapping (meaning re-distributing the weights among cells) for pair BL0/1 and BL23 is used for weight re-mapping for pair BL2/3.

Table 11B shows a case of distributed weight that needs no re-mapping, basically there is no adjacent '1' between BL1 and BL3, which adjacent "1" causes adjacent bit line coupling. Table 11C shows a case of distributed weight that needs re-mapping, due to adjacent '1s' between BL1 and BL2, which causes adjacent bit line coupling. This re-mapping is shown in Table 11D, resulting in no '1' value between any adjacent bit lines. Furthermore, by re-mapping, the '1' real value weight among the bit lines, the total current along the bit line is now reduced leading to more precise value in the bit line (output neuron). In this case, additional columns (bitline) are needed (BL01, BL23) to act as redundant columns.
Tables 11E and 11F depict another embodiments of remapping noisy cells (or defective cells) into the redundant (spare) columns such as BL01, BL23 in Table 10E or BL0B and BL1B in Table 11F. A summer is used to sum up the bit line outputs with mapping appropriately.

TABLE 11E

Remapped Weight Combinations

| | BLPWDN | BL01 | BL0 | BL1 | BL2 | BL3 | BL23 | BLPWDN |
|---|---|---|---|---|---|---|---|---|
| row0 | | 0 | 0 | 1 | 0 | 0 | 1 | |
| row1 | | 1 | 0 | noisy or defective cell (not used) | 1 | 0 | 0 | |
| row2 | | 0 | 0 | 1 | noisy or defective cell (not used) | 0 | 1 | |
| row3 | | 1 | 0 | 0 | 1 | 0 | 0 | |

TABLE 11F

| | Remapped Weight Combinations | | | | |
|---|---|---|---|---|---|
| | BLPWDN | BL0A | BL0B | BL1A | BL1B BLPWDN |
| row0 | | 1 | 0 | 0 | 0 |
| row1 | | noisy or defective cell (not used) | 1 | 1 | 0 |
| row2 | | 1 | 0 | noisy or defective cell (not used) | 1 |
| row3 | | 0 | 0 | 1 | 0 |

Table 11G shows an embodiment of array physical arrangement that is suitable for FIG. 27B. Since each array has either positive weight or negative weight, a dummy bitline acting as pulldown bitline and physical barrier to avoid FG-FG coupling is needed for each bit line.

TABLE 11G

| | Exemplary Layout | | | | |
|---|---|---|---|---|---|
| | BLPWDN | BL0 | BLPWDN | BL1 | BLPWDN |
| row0 | | w01+/− | | w02+/− | |
| row1 | | w11+/− | | w12+/− | |
| row2 | | w21+/− | | w22+/− | |
| row3 | | w31+/− | | w32+/− | |

In another embodiment, a tuning bit line is used as an adjacent bit line to a target bitline to tune the target bit line to final target by virtue of FG-FG capacitive coupling. In this case a pulldown bitline (BLPWDN) is inserted on the side of the target bit line that does not border the tuning bitline.

In another embodiment, noisy or defective cells are designated (after identifying them as noisy or defective by sensing circuitry) as non-used cells, meaning they are to be (deeply) programed to not contribute any value to the neuron output.

In another embodiment, fast cells are identified and a more precise programming algorithm is applied to these cells, such as a programming sequence using smaller or no voltage increment pulses or using a floating gate coupling algorithm.

Figure 28:
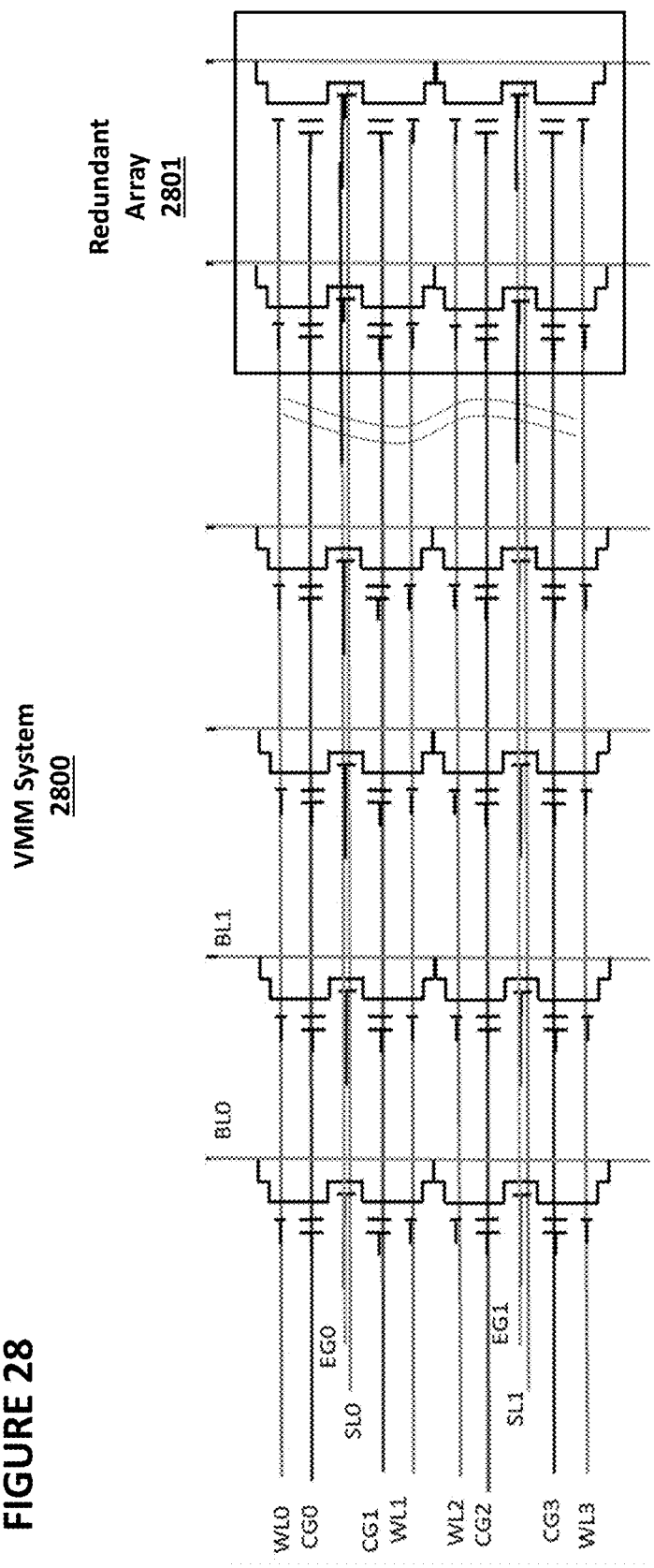
FIG. 28 depicts another improved VMM array comprising a redundant array.

FIG. 28 depicts an optional redundant array 2801 that can be included in any of the VMM arrays discussed thus far. Redundant array 2801 can be used as redundancy to replace defective columns if any of the columns attached to bit line switches are deemed defective. The redundant array can have its own redundant neuron outputs (e.g., bit lines) and ADC circuits for redundancy purpose. In the case where the redundancy is needed, the output of redundant ADC is used to replace the output of the ADC of the bad bit line. Redundant array 2801 can also be used for weight mapping such as described in Tables 11D, 11E, and 11F for power distribution across bit lines.

Figure 29:
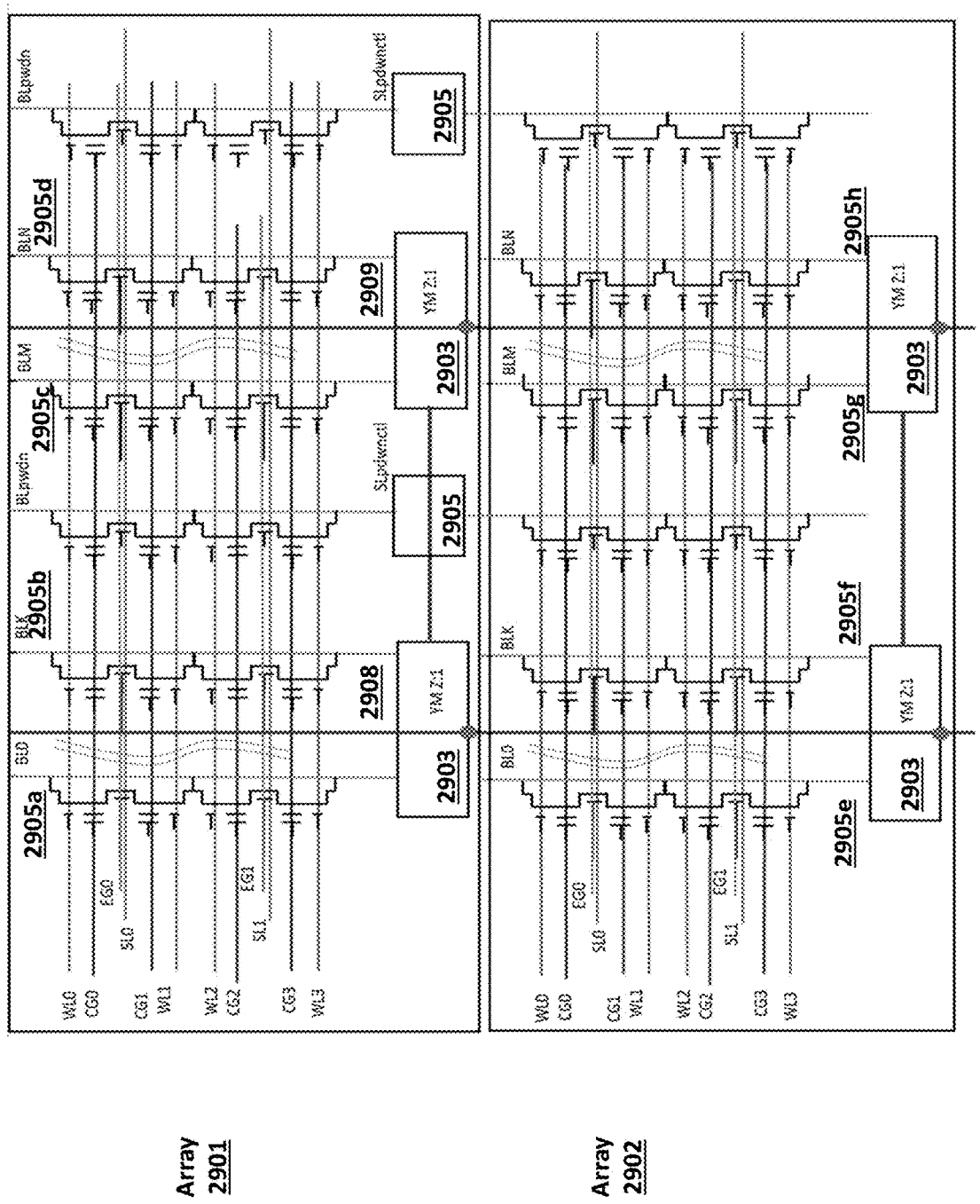
FIG. 29 depict another improved VMM system that comprises two VMM arrays and shared dummy bit line switching circuitry.

FIG. 29 depicts VMM system 2900, which comprises array 2901, array 2902, column multiplexors 2903, top local bit lines LBL 2905a-d, bottom local bit lines LBL 2905e-h, global bit lines GBL 2908 and 2909, and pulldown bit line switches 2905. The column multiplexors 2903 are respectively used to select top local bit line 2905 of the array 2901 or bottom local bit line 2905 of the array 2902 into the global bit line 2908, 2909, respectively. In one embodiment, the (metal) global bit line 2908 has the same number of lines as the number of the local bit lines, e.g. 8 or 16. In another embodiment, the global bit line 2908 has only one (metal) line per N number of local bit lines, such as one global bit line per 8 or 16 local bit lines. The column multiplexors 2903 further includes multiplexing (muxing) the adjacent global bit line (such as GBL 2909) into the current global bit line (such as GBL 2908) to effectively increase the width of the current global bit line. This reduces the voltage drop across the global bit line.

Figure 30:
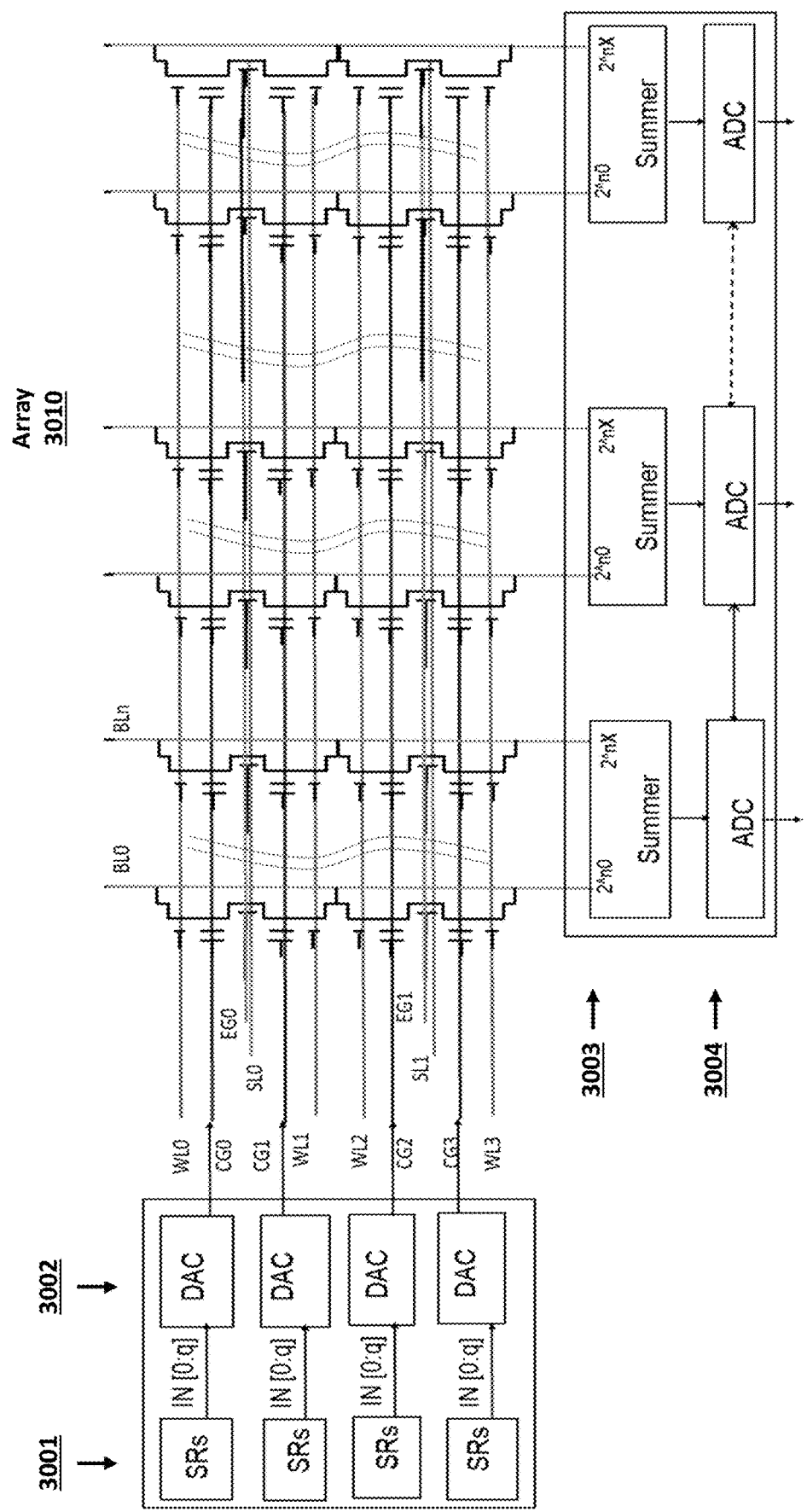
FIG. 30 depicts another improved VMM system.

FIG. 30 depicts VMM system 3000. VMM system 3000 comprises array 3010, (shift registers) SRs 3001, digital-to-analog converters 3002 (which receives the input from the SRs 3001 and output an equivalent (analog or pseudo-analog) level or info), summer circuits 3003, analog-to-digital converters (ADC) 3004, bit line switches (not shown), dummy bit lines (not shown), and dummy bit line switches (not shown). As shown, ADCs 3004 can be combined together to create a single ADC with greater precision (i.e., greater number of bits).

Figure 31:
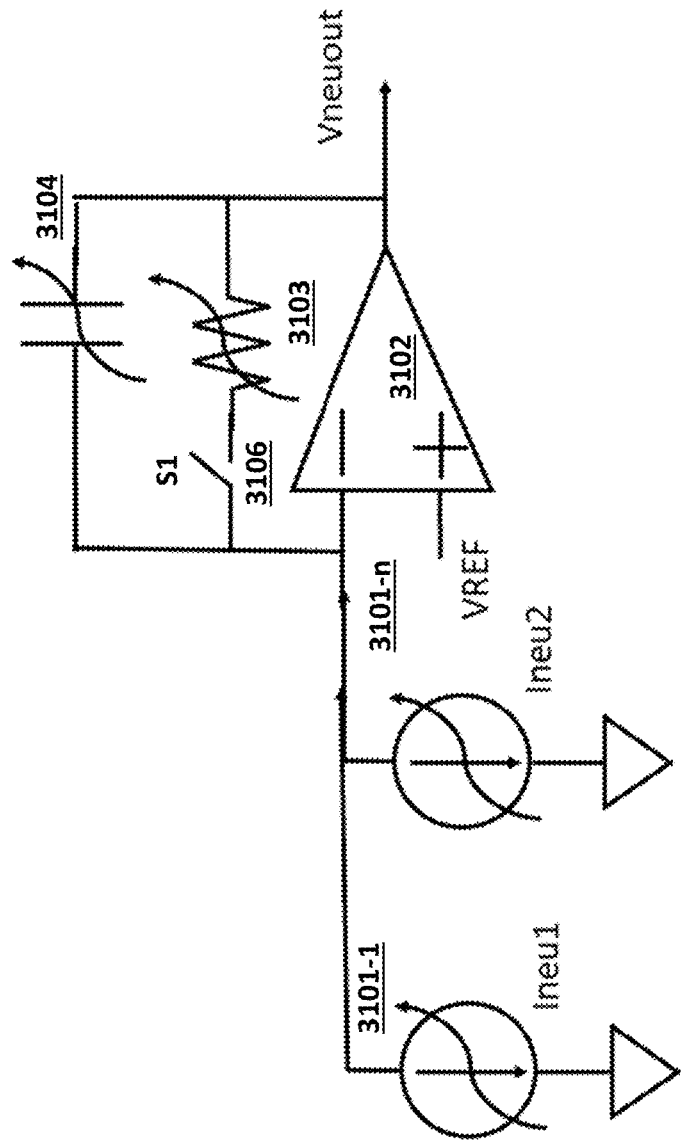
FIG. 31 depicts an embodiment of a summer circuit.
Figure 32:
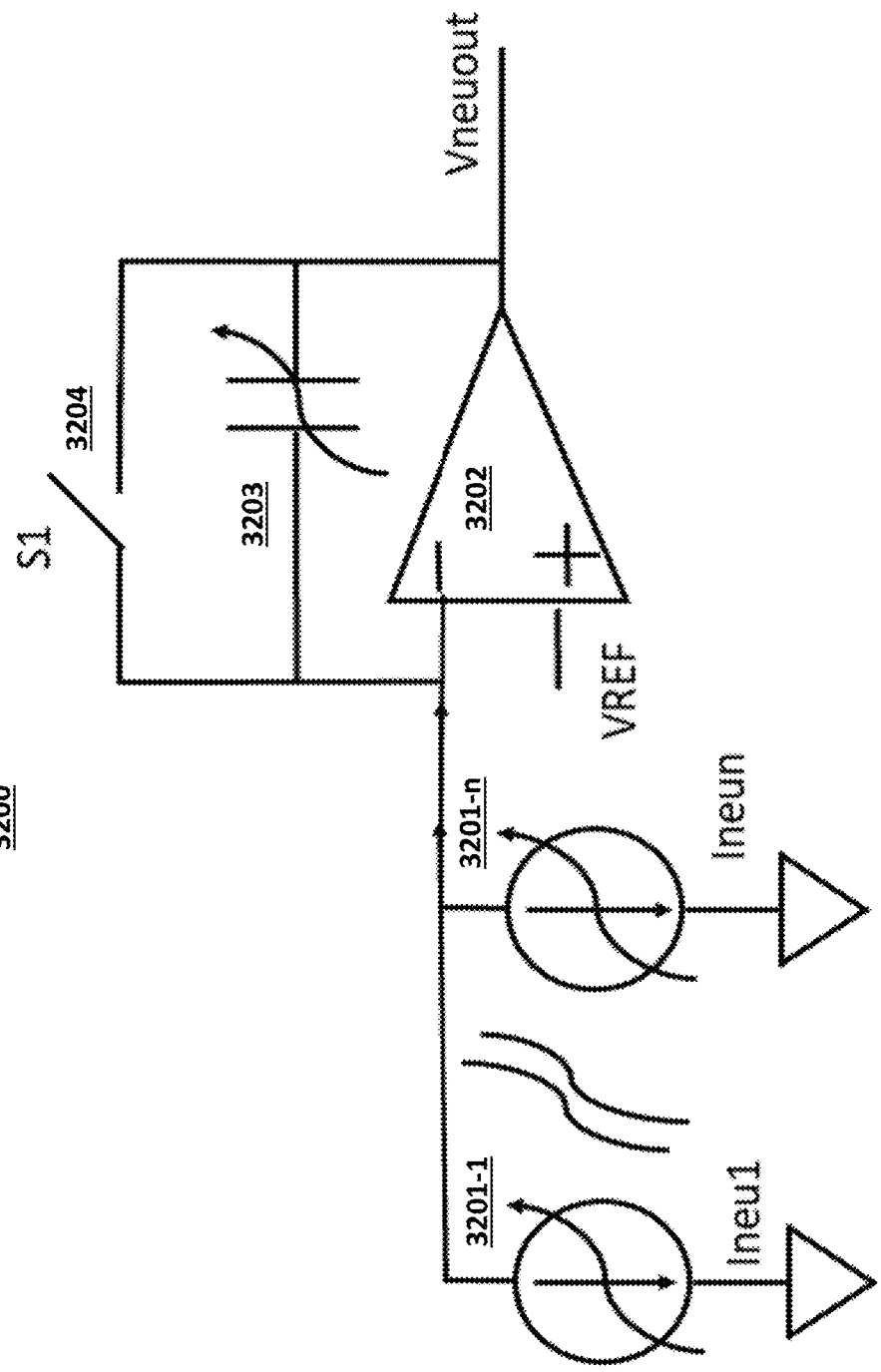
FIG. 32 depicts another embodiment of a summer circuit.

Summer circuits 3003 can include the circuits that are shown in FIGS. 31-33. It may include circuits for normalization, scaling, arithmetic operations, activation, or statistical rounding, without limitation.

FIG. 31 depicts current-to-voltage summer circuit 3100 adjustable by a variable resistor, which comprises current sources 3101-1, . . . , 3101-n drawing current Ineu1, . . . , Ineun, respectively (which are the currents received from bit line(s) of a VMM array), of which only Ineu1 and Ineu2 are shown, operational amplifier op-amp 3102, variable holding capacitor 3104, variable resistor 3103 and switch 3106. Operational amplifier 3102 outputs a voltage, Vneuout=R3103*(Ineu1+Ineu2), which is proportional to the current Ineux (which is the current from a column in a VMM array). The variable holding capacitor 3104 is used to hold the output voltage when switch 3106 is open. This held output voltage is used, for example, to be converted into digital bits by an ADC circuit. The variability of the capacitor 3103, resistor 3103 is done such as by a trim circuit (trimming the value of the capacitor or resistor) to adjust the dynamic range of the op-amp 3102 output depending on the for example the input current range of the neuron current 3101s.

FIG. 32 depicts current-to-voltage summer circuit 3200 adjustable by a variable capacitor (basically an integrator), which comprises current source 3201-1, . . . , 3201-n drawing current Ineu1, . . . Ineun, respectively (which are the currents received from bit line(s) of a VMM array), operational amplifier 3202, variable capacitor 3203, and switch 3204. Operational amplifier 3202 outputs a voltage, Vneuout=Ineu*integration time/C3203, which is proportional to the current Ineu(s).

Figure 33A:
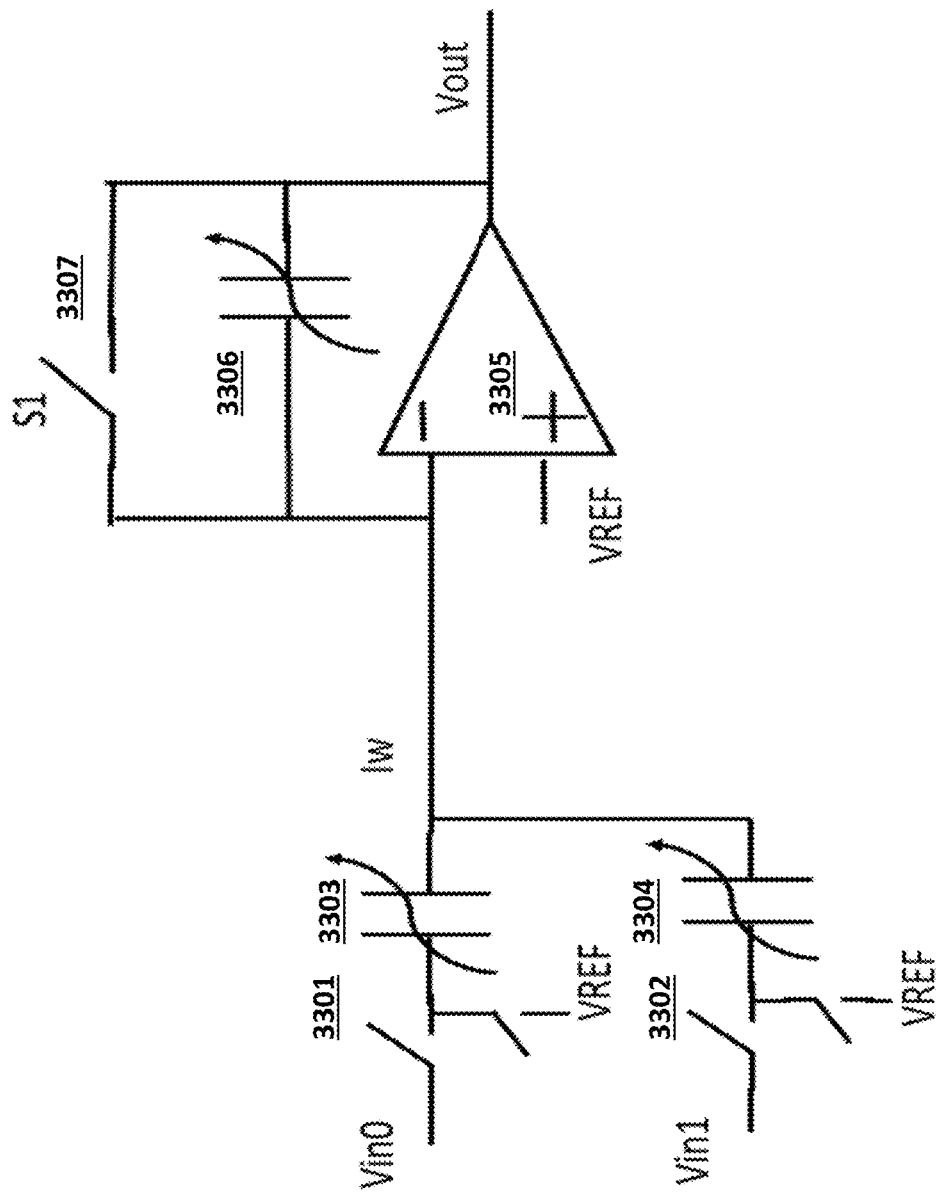
FIGS. 33A and 33B depicts other embodiments of a summer circuit.

FIG. 33A depicts voltage summer 3300 adjustable by variable capacitors (i.e., a switched capacitor (SC) circuit), which comprises switches 3301 and 3302, variable capacitors 3303 and 3304, operational amplifier 3305, variable capacitor 3306, and switch 3307. When switch 3301 is closed, input Vin0 is provided to operational amplifier 3305. When switch 3302 is closed, input Vin1 is provided to operational amplifier 3305. Preferably, switches 3301 and 3302 are not closed at the same time. Operational amplifier 3305 generates an output Vout, that is an amplified version of the input (either Vin0 and/or Vin1, depending on which switch is closed among switches 3301 and 3302). That is Vout=Cin/Cout*(Vin), Cin is C3303 or C3304, Cout is C3306. For example, Vout=Cin/Cout*Σ(Vinx), where Cin=C3303 or C3304. In one embodiment, Vin0 is a w+ voltage and Vin1 is a w-voltage, and voltage summer 3300 adds them together to generate output voltage Vout.

Figure 33B:
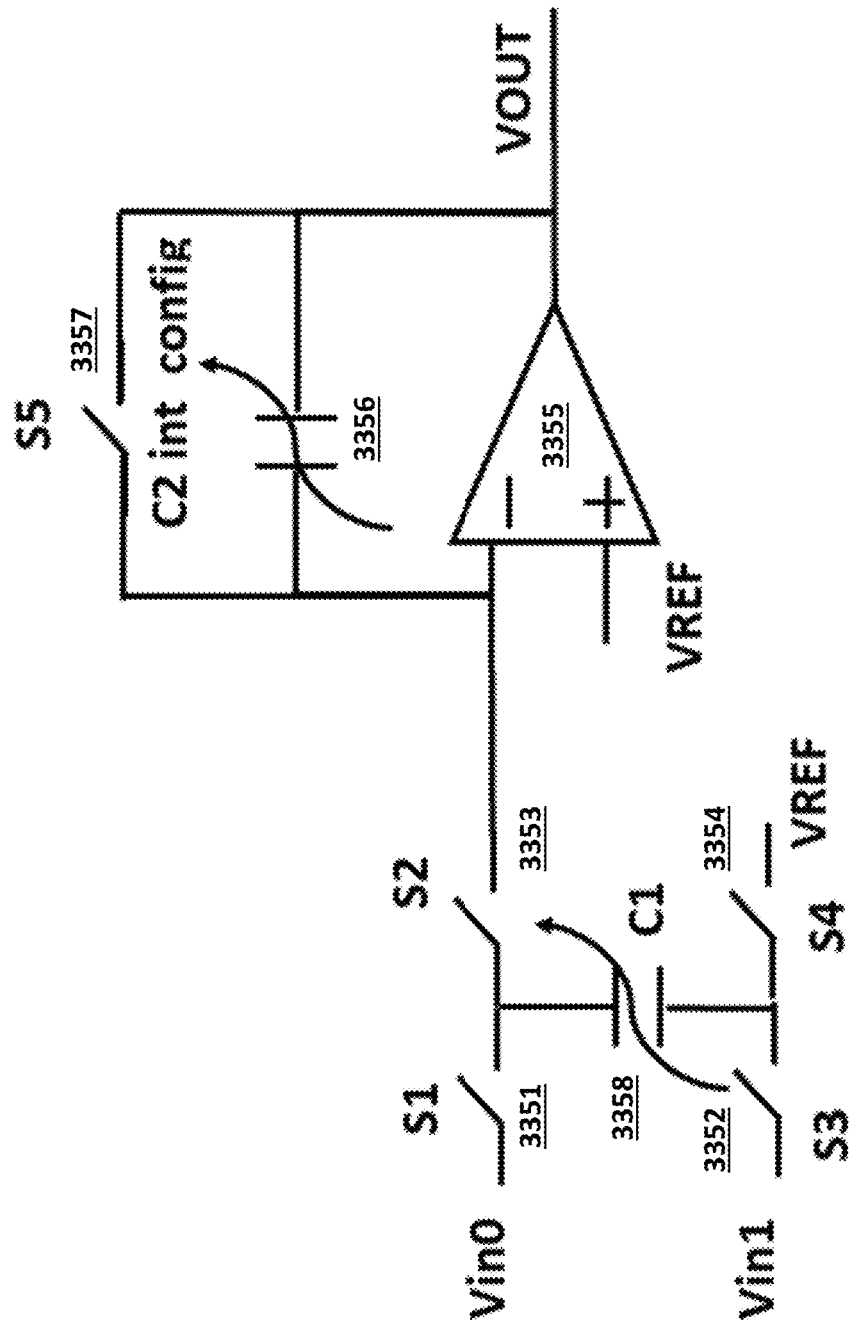

FIG. 33B depicts voltage summer 3350, which comprises switches 3351, 3352, 3353, and 3354, variable input capacitor 3358, operational amplifier 3355, variable feedback capacitor 3356, and switch 3357. In one embodiment, Vin0 is a w+ voltage and Vin1 is a w− voltage, and voltage summer 3300 adds them together to generate output voltage Vout.

For Input=Vin0: when switch 3354 and 3351 are closed, input Vin0 is provided to top terminal of the capacitor 3358. Then switch 3351 is open and switch 3353 is closed to transfer the charge from the capacitor 3358 into the feedback capacitor 3356. Basically, then the output VOUT=(C3358/C3356)*Vin0 (for case of with VREF=0 as example).

For Input=Vin1: when switch 3353 and 3354 are closed, both terminals of the capacitor 3358 are discharged to VREF. Then switch 3354 is open and switch 3352 is closed, charging the bottom terminal of the capacitor 3358 to Vin1, which in turn charges up the feedback capacitor 3356 to VOUT=−(C3358/C3356)*Vin1 (for case of VREF=0).

Hence, if Vin1 input is enabled after Vin0 input is enabled, VOUT=(C3358/C3356)* (Vin 0−Vin1), for case of VREF=0 as example. This is used for example to realize w=w+−w−

Methods of input and output operation which apply to the VMM arrays discussed above can be in digital or analog form. Methods include:

Sequential Inputs IN [0:q] to DACs:
  Operate sequentially IN0, then IN1, . . . , then INq; all input bits have the same VCGin; all bit line (neuron) outputs are summed with an adjusting binary index multiplier; either before ADC or after ADC
  Adjusting neuron (bit line) binary index multiplier method as shown in FIG. 30, the example summer has two bit lines BL0 and Bln. A weight is distributed across multiple bit lines BL0 to BLn. For example there are 4 bit lines BL0,BL1,BL2,BL3. The output from bitline BL0 is to be multiplied by 2^0=1. The output from bit line BLn, which stand for nth binary bit position, is multiplied by 2^n, for example 2^3=8 for n=3. Then the output from all bit lines after being multiplied appropriately by binary bit position 2^n, are summed together. Then this is digitized by the ADC. This method means all cells need only have a binary range, the multi-level range (n-bit) is accomplished by the peripheral circuit (meaning by the summer circuit). Hence the voltage drop for all the bit lines is approximately the same
  Operate sequentially IN0, IN1, . . . , then INq; each input bit has a corresponding analog value VCGin; all neuron outputs are summed for all input bit evaluation; either before ADC or after ADC
Parallel Inputs to DACs:
  Each input IN[0:q] has a corresponding analog value VCGin; all neuron outputs are summed with adjusting binary index multiplier method such as explained above; either before ADC or after ADC FIGS. 34A, 34B, and 34C depict output circuits that can be used for summer circuits 3003 and analog-to-digital converters 3004 in FIG. 30.

Figure 34C:
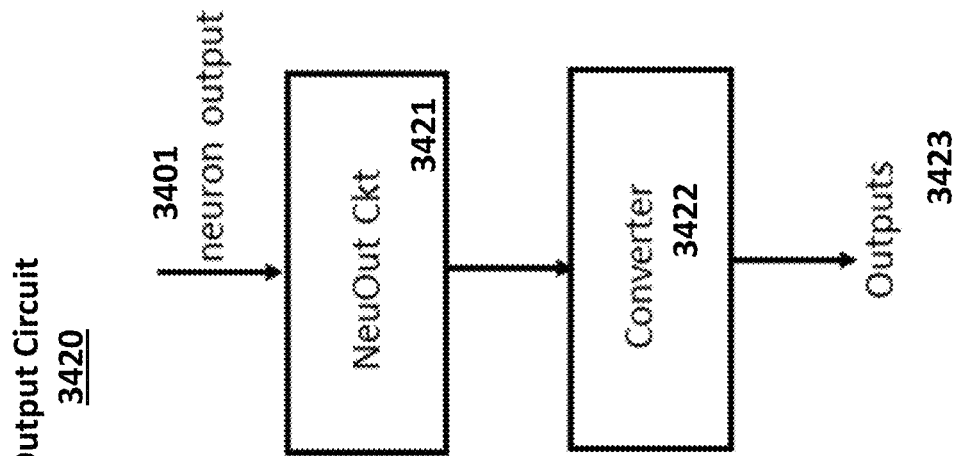
FIGS. 34A, 34B, and 34C depicts embodiments of an output circuit.
Figure 34B:
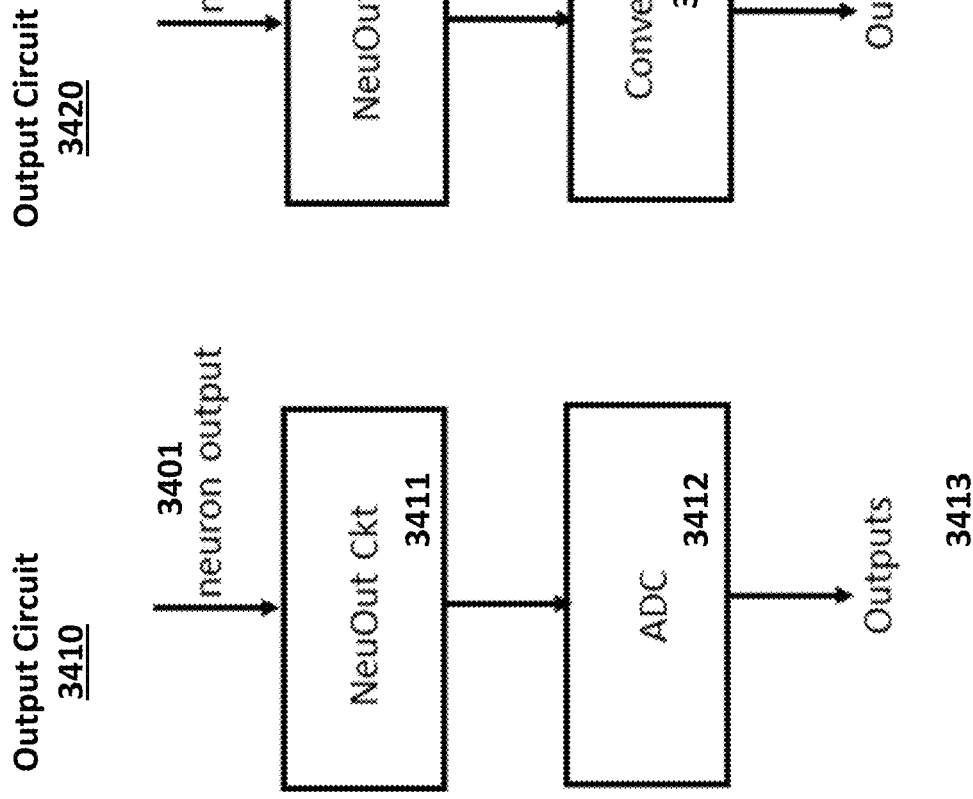
Figure 34A:
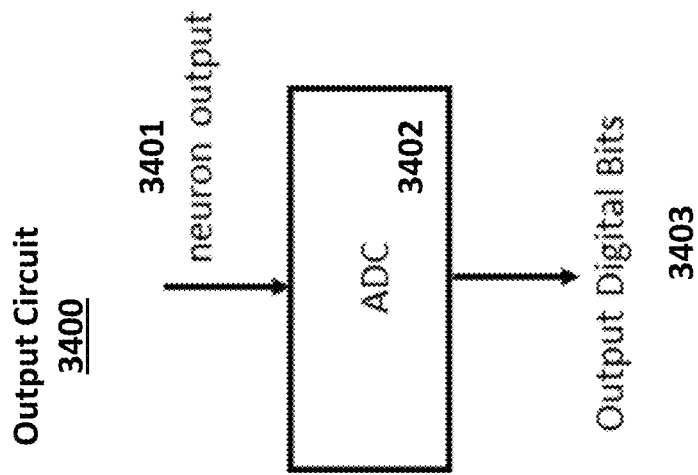

FIG. 34A depicts output circuit 3400, which comprises analog-to-digital converter 3402, which receives neuron output 3401 and outputs output digital bits 3403.

FIG. 34B depicts output circuit 3410, which comprises neuron output circuit 3411 and analog-to-digital converter 3412, which together receive neuron output 3401 and generate outputs 3413.

FIG. 34C depicts output circuit 3420, which comprises neuron output circuit 3421 and converter 3422, which together receive neuron output 3401 and generate outputs 3423.

Neuron output circuit 3411 or 3412 can, for example, perform summing, scaling, normalization, or arithmetic operations, without limitation. Converter 3422, for example, can perform ADC (Analog-to-Digital Converter), PDC (Pulse-to-Digital Converter), AAC (Analog-to-Analog Converter), or APC (Analog-to-Pulse Converter) operation, without limitation.

Figure 35:
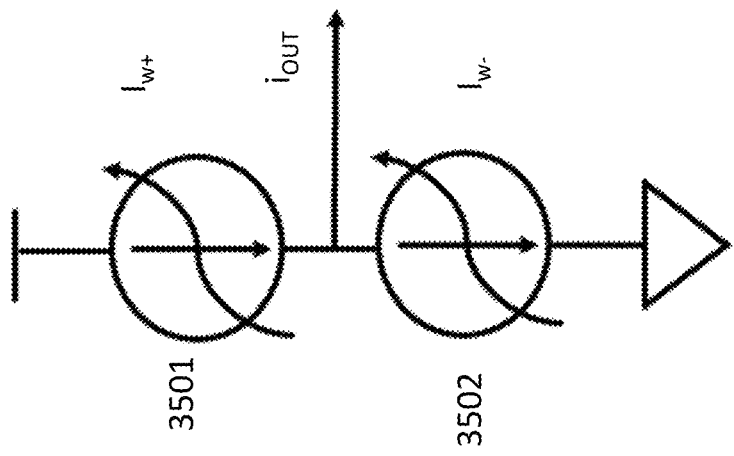
FIG. 35 depicts a neuron output circuit.

FIG. 35 depicts neuron output circuit 3500, which comprises adjustable (scaling) current source 3501 and adjustable (scaling) current source 3502, which together generate output $i_{OUT}$, which is the neuron output. This circuit can perform summation of positive weight and negative weights, i.e., w=w+−w−, i.e. Iw+ and Iw−, and up or down scaling of the output neuron current at the same time.

Figure 36:
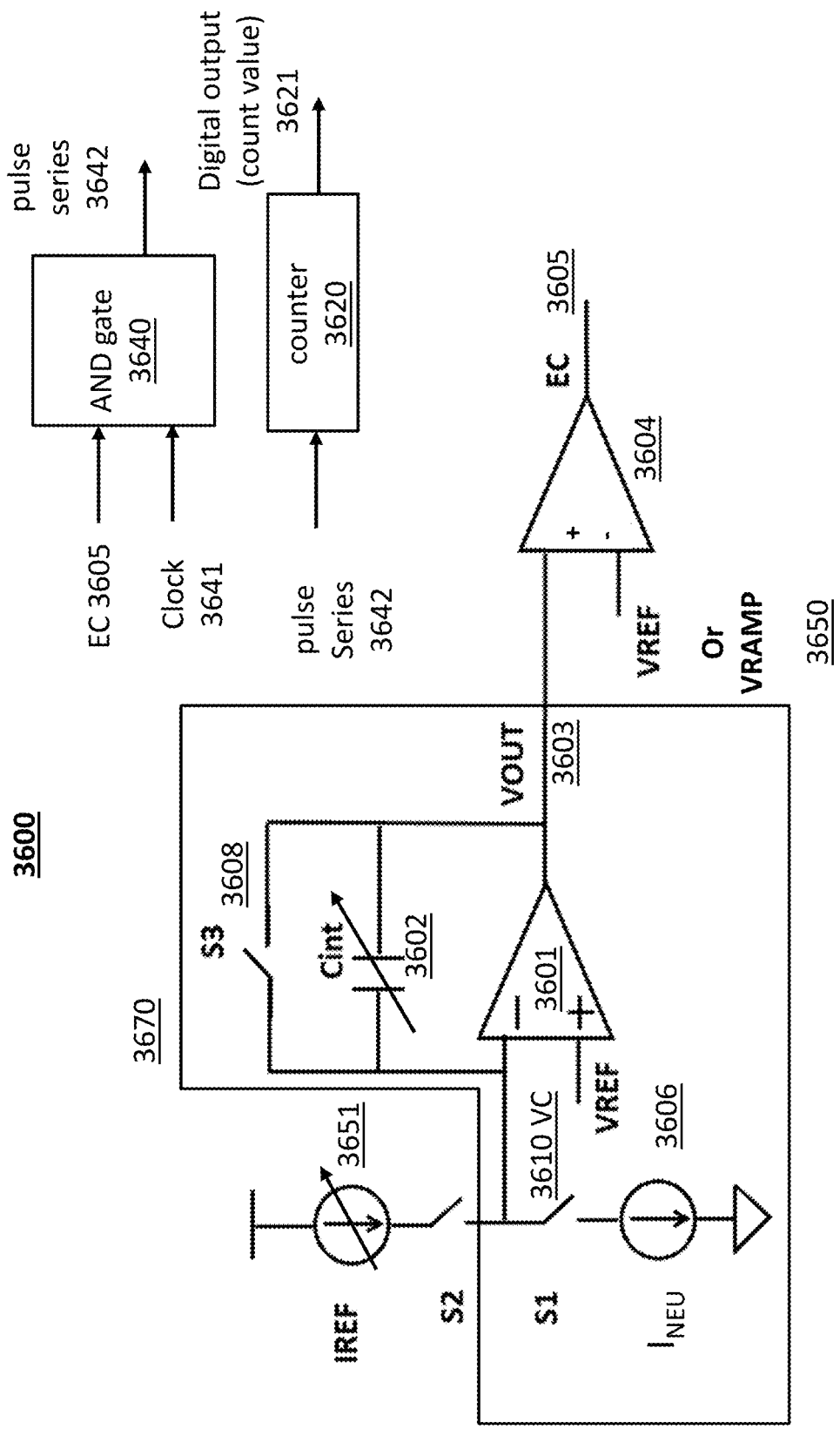
FIG. 36 depicts an embodiment of an analog-to-digital converter.

FIG. 36 depicts configurable neuron serial analog-to-digital converter 3600. It includes integrator 3670 which integrates the neuron output current into the integrating capacitor 3602. One embodiment is that the digital output (count output) 3621 is produced by clocking the ramping VRAMP 3650 until the comparator 3604 switches polarity or another embodiment is by ramping down node VC 3610 by the ramp current 3651 until the VOUT 3603 reaches the value of VREF 3650, at which point the comparator 3064 output EC 3605 signal disables the counter 3620. The (n-bit) ADC is configurable to have lower number of bit precision <n-bits or higher number of bit precision >n-bits depending on target application. The configurability may be done by configuring the capacitor 3602, the current 3651, or ramping rate of the VRAMP 3650, or the clocking rate of clock 3641, without limitation. In another embodiment the ADC circuits of a VMM array are configured to have lower precision <n-bits and the ADC circuits of another VMM array is configured to have high precision >n-bits. Further this ADC circuit of one neuron circuit can be configured to combine with the next ADC of the next neuron circuit to produce higher n-bit ADC precision such as by combining the integrating capacitor 3602 of two ADC circuits.

Figure 37:
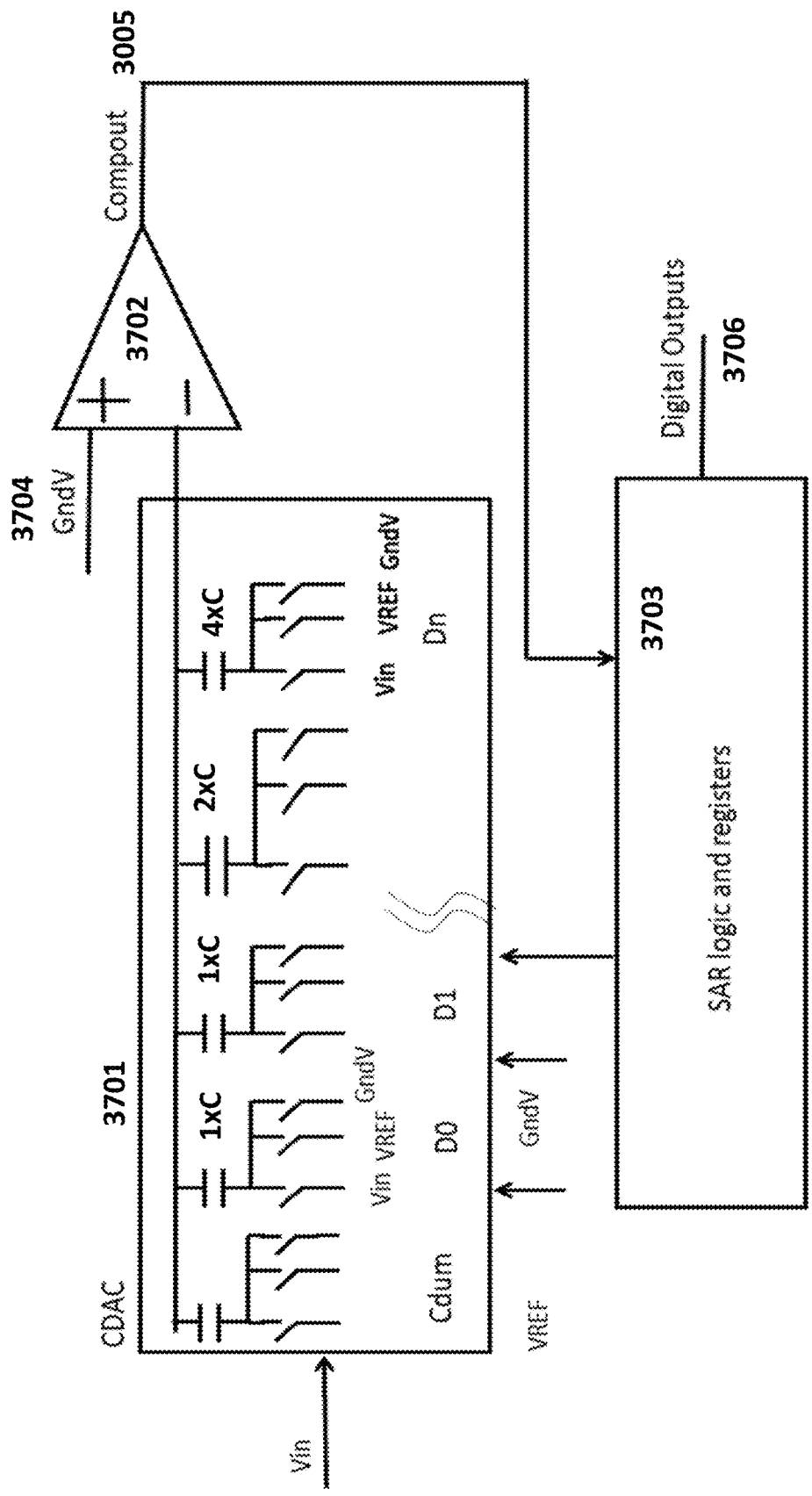
FIG. 37 depicts another embodiment of an analog-to-digital converter.

FIG. 37 depicts configurable neuron SAR (successive approximation register) analog-to-digital converter 3700. This circuit is a successive approximation converter based on charge redistribution using binary capacitors. It includes a binary CDAC (DAC basing on capacitors) 3701, op-amp/comparator 3702, SAR logic 3703. As shown GndV 3704 is a low voltage reference level, for example ground level.

Figure 38:
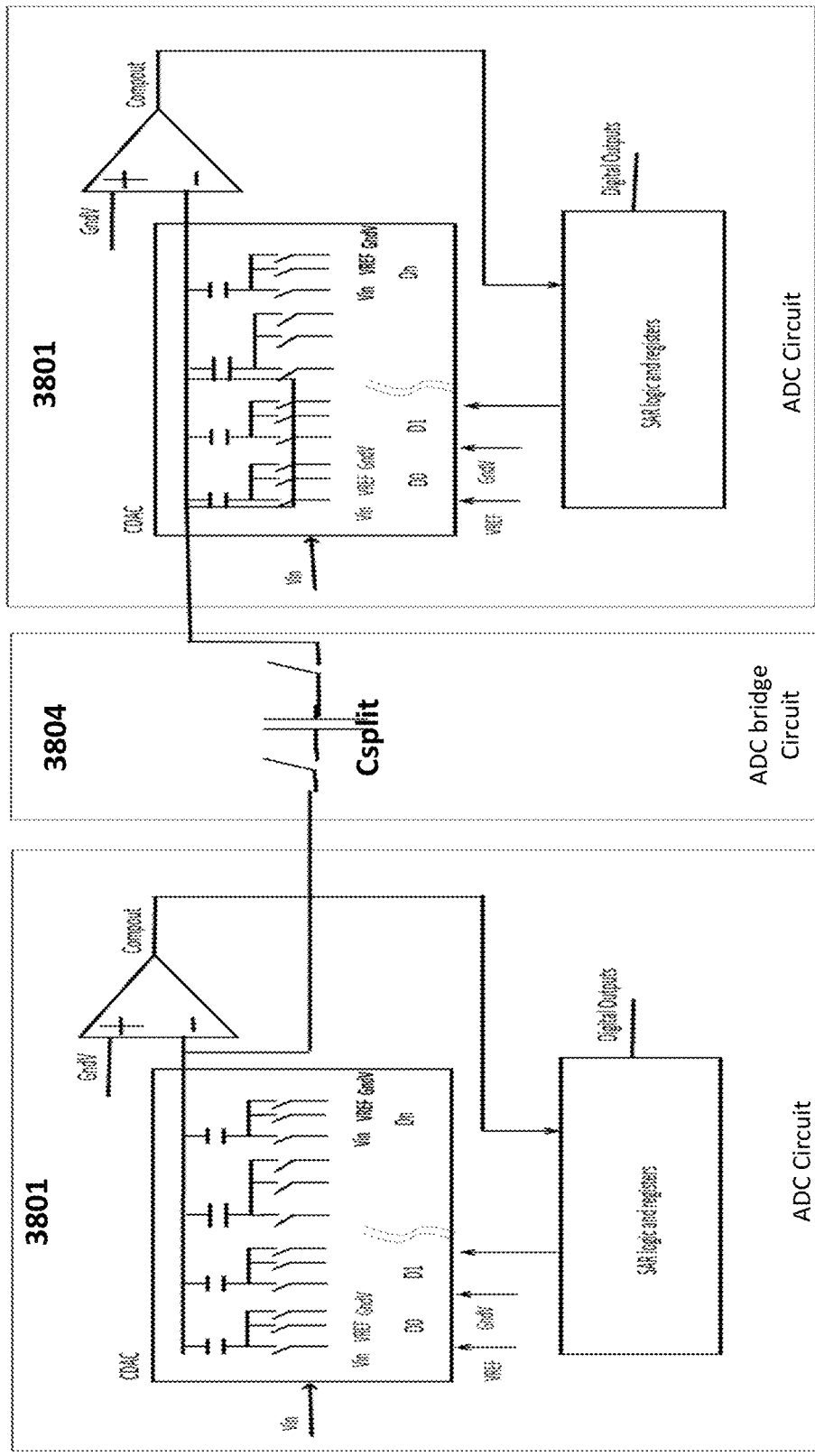
FIG. 38 depicts another embodiment of an analog-to-digital converter.

FIG. 38 depicts a configurable neuron combo SAR analog-to-digital converter 3800. This circuit combines two ADCs from two neuron circuits into one to achieve higher precision n-bit, for example for a 4-bit ADC for one neuron circuit, this circuit can achieve >4-bit precision such as 8-bit ADC precision by combining two 4-bit ADCs. The combo SAR ADC circuit topology is equivalent to a split cap (bridge capacitor (cap) or attention cap) SAR ADC circuit, for example a 8-bit 4C-4C SAR ADC results by combining two adjacent 4-bit 4C SAR ADC circuits. A bridge circuit 3804 is needed to accomplish this, the capacitance of capacitor of this circuit is =(total number of CDAC cap unit/total number of CDAC cap unit−1).

Figure 39:
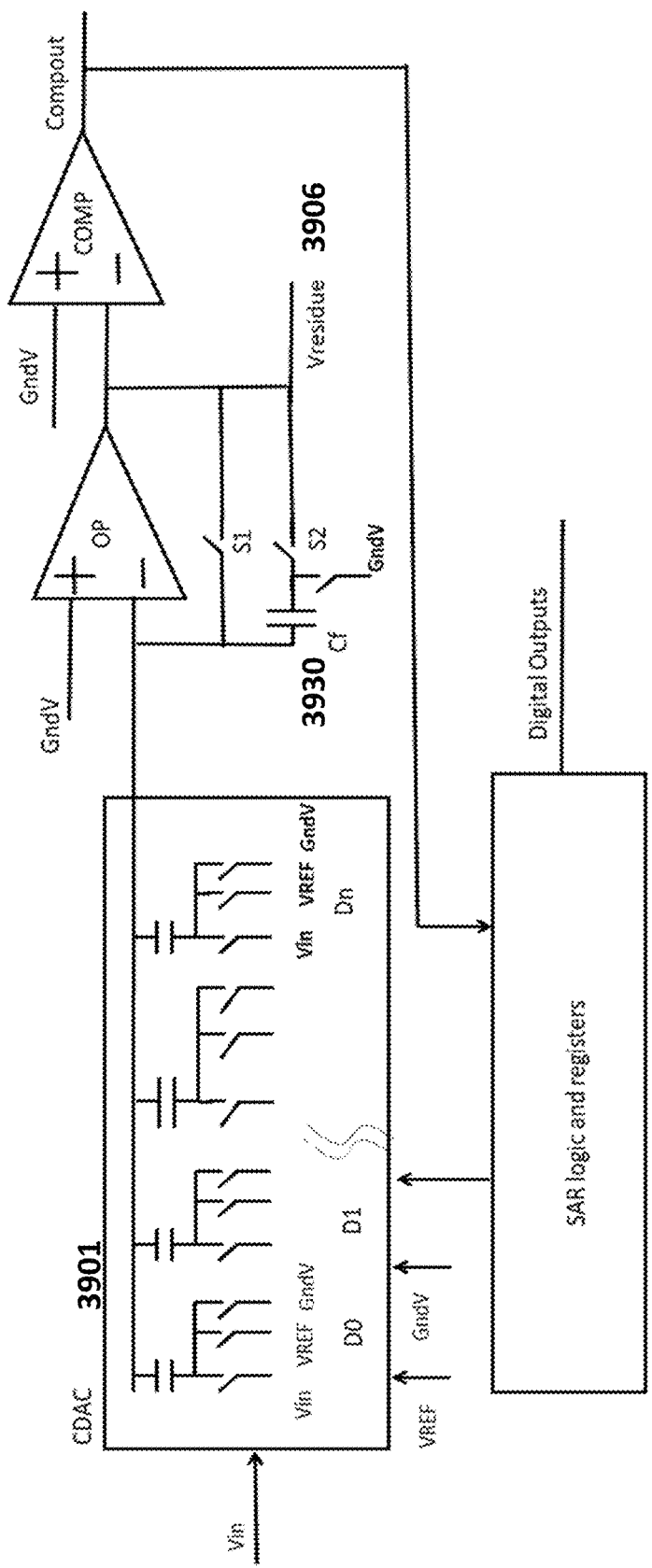
FIG. 39 depicts another embodiment of an analog-to-digital converter

FIG. 39 depicts a configurable neuron, pipelined SAR CDAC ADC circuit 3900 that can be used to combine with a next SAR ADC to increase the number of bits in a pipelined fashion. Residue voltage 3906 is generated by capacitor 3930 Cf to provide as input to next stage of pipelined ADC (e.g. to provide gain of 2 (ratio of Cf to C of all caps in DAC 3901) as input to next SAR CDAC ADC).

Additional implementation details regarding configurable output neuron (such as configurable neuron ADC) circuits can be found in U.S. patent application Ser. No. 16/449,201, filed on Jun. 21, 2019 by the same assignee, and titled "Configurable Input Blocks and Output Blocks and Physical Layout for Analog Neural Memory in a Deep Learning Artificial Neural Network," which is incorporated by reference herein.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A non-volatile memory system, comprising:
   an array of non-volatile memory cells arranged in rows and columns;
   a bit line switch on a first side of the array;
   a pulldown bitline switch on a second side of the array opposite the first side;
   a bit line coupled to the bit line switch and to a column of non-volatile memory cells in the array; and
   a pulldown bitline coupled to the pulldown bitline switch and to a pulldown cell adjacent to a cell in the column of non-volatile memory cells in the array;
   wherein during a read, verify, or erase operation of a selected non-volatile memory cell in the column and comprising a bit line terminal and a source line terminal, current flows: (i) through the bit line into the bit line terminal of the selected non-volatile memory cell, (ii) out of the source line terminal of the selected non-volatile memory cell into a source line, (iii) into a source line terminal of the pull down cell, and (iv) through a bit line terminal of the pull down cell into the pulldown bit line.

2. The non-volatile memory system of claim 1, wherein the pulldown cell has the same physical structure as the selected memory cell.

3. The non-volatile memory system of claim 1, wherein the array of non-volatile memory cells arranged in rows and columns is part of a neural network.

4. The non-volatile memory system of claim 3, wherein the neural network is an analog neural network.

5. The non-volatile memory system of claim 1, wherein the pulldown cell has a wider diffusion area than the selected non-volatile memory cell.

6. The non-volatile memory system of claim 1, wherein the pulldown cell has a bias condition different than a bias condition of the selected non-volatile memory cell.

7. The non-volatile memory system of claim 1, wherein the array comprises rows consisting entirely of pulldown cells.

8. The non-volatile memory system of claim 1, wherein the array comprises a plurality of sets of four rows, wherein each of the plurality of sets comprises two adjacent rows of pulldown cells.

9. The non-volatile memory system of claim 1, wherein the rows of the array comprise alternating rows of data cells and pulldown cells.

10. The non-volatile memory system of claim 1, wherein the non-volatile cells in the array of non-volatile memory cells are split-gate non-volatile memory cells.

11. The non-volatile memory system of claim 1, wherein the non-volatile cells in the array of non-volatile memory cells are stacked-gate non-volatile memory cells.

12. A non-volatile memory system, comprising:
    an array of non-volatile memory cells arranged in rows and columns;
    a plurality of bit line switches on a first side of the array;
    a plurality of pulldown bitline switches on a second side of the array opposite the first side;
    a plurality of bit lines coupled to respective columns of non-volatile memory cells in the array and to respective bit line switches; and
    a plurality of pulldown bitlines coupled to respective pulldown cells in the array and to respective pulldown bitline switches;
    wherein during a read, verify, or erase operation of a selected non-volatile memory cell in the array, current flows: (i) through one of the plurality of bit lines into the bit line terminal of the selected non-volatile memory cell, (ii) out of the source line terminal of the selected non-volatile memory cell into a source line, (iii) into source line terminals of the pull down cells, and (iv) through bit line terminals of the pull down cells into the plurality of pulldown bit lines.

13. The non-volatile memory system of claim 12, wherein the non-volatile memory cells in the array of non-volatile memory cells are split-gate non-volatile memory cells.

14. The non-volatile memory system of claim 12, wherein the non-volatile memory cells in the array of non-volatile memory cells are stacked-gate non-volatile memory cells.

15. The non-volatile memory system of claim 12, wherein the pulldown cells have the same physical structure as the non-volatile memory cells.

16. The non-volatile memory system of claim 12, wherein at least one column of the array consists entirely of pulldown cells.

17. The non-volatile memory system of claim 12, wherein at least one row of the array consists entirely of pulldown cells.

18. The non-volatile memory system of claim 12, wherein the memory system is part of a neural network.

19. The non-volatile memory system of claim 18, wherein the neural network is an analog neural network.

* * * * *